(12) United States Patent
Kardos et al.

(10) Patent No.: US 8,462,014 B1
(45) Date of Patent: Jun. 11, 2013

(54) METER DATA MANAGEMENT SYSTEMS, METHODS, AND SOFTWARE WITH OUTAGE MANAGEMENT CAPABILITIES

(75) Inventors: Christopher P. Kardos, Center Point, IA (US); Darren D. Varney, Maple Grove, MN (US)

(73) Assignee: Ecologic Analytics, LLC, Bloomington, MN (US)

( * ) Notice: Subject to any disclaimer, the term of this patent is extended or adjusted under 35 U.S.C. 154(b) by 190 days.

(21) Appl. No.: 12/854,168

(22) Filed: Aug. 10, 2010

Related U.S. Application Data

(60) Provisional application No. 61/273,994, filed on Aug. 10, 2009.

(51) Int. Cl.
   *G01R 21/00* (2006.01)
(52) U.S. Cl.
   USPC .......... 340/870.02; 702/60; 702/62; 700/286; 700/291
(58) Field of Classification Search
   CPC ...... G01R 21/133; G01R 22/00; G01R 22/068; G01R 22/10
   USPC ............. 340/870.01, 870.02, 870.03, 870.4; 702/57, 58, 59, 60, 61, 62; 324/113; 700/286, 700/291, 292, 293
   See application file for complete search history.

(56) References Cited

U.S. PATENT DOCUMENTS

| | | | |
|---|---|---|---|
| 2007/0211768 A1* | 9/2007 | Cornwall et al. | 370/509 |
| 2009/0135018 A1* | 5/2009 | Veillette et al. | 340/657 |

* cited by examiner

*Primary Examiner* — Ryan Johnson
(74) *Attorney, Agent, or Firm* — Schwegman Lundberg & Woessner, P.A.

(57) ABSTRACT

The present inventors recognized a need to leverage the data from Advanced Metering Systems (AMIs) in the management of electrical outages. To address this and/or other needs, the present inventors devised, among other things, systems, methods, and software that not only intelligently filter and communicate AMI outage data to Outage Management Systems (OMSs), but also facilitate communications between OMSs and multiple types of AMI systems. One exemplary system includes an outage management module that receives AMI outage data in the form of "last gasp" messages from meters and determines whether the OMS is already aware of a power outage associated with those meters. If the OMS is already aware of an outage associated with these meters, the outage management module excludes the outage reports from its communications with the OMS, thereby preserving its capacity to handle new outage information and overcoming a significant obstacle to using AMI data within OMSs.

30 Claims, 55 Drawing Sheets

METER DATA MANAGEMENT SYSTEMS, METHODS, AND SOFTWARE WITH OUTAGE MANAGEMENT CAPABILITIES

RELATED APPLICATION

The present application claims priority to U.S. Provisional Patent Application 61/273,994, which was filed on Aug. 10, 2009, and which is incorporated herein by reference in its entirety. Additionally, co-pending and co-owned U.S. patent application Ser. No. 12/496,224, which was filed on Jul. 1, 2009 and which is a continuation of U.S. patent application Ser. No. 11/059,089 filed on Feb. 7, 2005 (now U.S. Pat. No. 7,557,729) is also incorporated herein by reference in its entirety. Co-pending and co-owned U.S. patent application Ser. No. 12/706,041, which was filed Feb. 16, 2010 is also incorporated herein by reference in its entirety.

COPYRIGHT NOTICE AND PERMISSION

A portion of this patent document contains material subject to copyright protection. The copyright owner has no objection to the facsimile reproduction by anyone of the patent document or the patent disclosure, as it appears in the Patent and Trademark Office patent files or records, but otherwise reserves all copyrights whatsoever. The following notice applies to this document: Copyright © 2009-2010, Ecologic Analytics, LLC.

TECHNICAL FIELD

Various embodiments of the present invention concern advanced metering systems (AMSs), meter data management systems (MDMSs) and outage management systems (OMSs) for electric utility companies.

BACKGROUND

Electric utility companies regularly collect usage data from meters. Over the last few decades, many public utilities have modernized their data collection using automated meter reading (AMR) to reduce the time and expense of collecting this data manually. More recently, technology has evolved to more advanced metering systems, generally referred to as Advanced Meter Infrastructure (AMI) that allows reliable two-way communications with meters and utilities have responded to the dynamic pricing of electricity by shifting from once-a-month meter readings to daily, hourly or even sub-hourly meter readings.

To facilitate the management of the fantastic amounts of data generated from increased read frequency, many utilities are now using meter data management systems (MDMSs), which not only manage and organize the incoming AMI data into a database, but also validate it, fill in missing data, and generally ensure that utilities have sufficiently accurate data to bill their customers. One of the leading providers of MDMSs is Ecologic Analytics of Bloomington, Minn., the employer of the present inventors.

One problem recognized by the present inventors concerns AMI systems and outage management systems (OMSs). An OMS is a computer system used by utility operators to manage the restoration of electrical service in the event of a power outage. These systems typically receive telephone outage reports from customers through a call center and/or Interactive Voice Response (IVR) system, and plot them on a digital map or model of the electrical distribution network. The OMS also includes a rules engine that uses reported outage locations and the network model to determine the source and scope of the outage, and thus provide valuable information for restoring electric power to outage areas.

Although it has been known for some time that AMI systems held the potential to provide outage reports, in the form of "last gasp" messages from meters that had lost power, little if anything at all, has been achieved in actually taking advantage of this possibility. One problem is that AMI systems can generate orders of magnitude more call-equivalent "last gasp" and restore messages in any given time span time than customers can, and OMSs simply lack the capacity to handle this level of input.

Consider for example that AMI meters can report outages at any time of day or night, whereas customers may have long periods of time, such as while away at work or while sleeping, when they are unaware of power outages and thus unlikely to report them. Moreover, even when they are aware, many customers rely on their neighbors to report outages or they simply assume that the utility will already know. In contrast, all the AMI meters affected by an outage would attempt to automatically report the outage almost simultaneously regardless of time of day. Thus, larger outages affecting thousands and or even millions of customers would easily overwhelm a conventional OMS.

Another issue is that larger utilities often have a diverse set of AMI meters and Head End systems from different manufacturers, with those from one manufacturer communicating using proprietary protocols that are distinct from and incompatible with those of another. Conventional OMSs, which rely on phoned-in reports, not only lack a way of communicating with AMIs, but also have no mechanism for optimizing interactions with multiple types of AMI technologies.

Accordingly, the present inventors have recognized a need for bridging the gap between the rich data available in AMIs and the ability of OMSs to actually use it.

SUMMARY

To address this and/or other needs, the present inventors devised, among other things, meter data management systems, methods, and software that not only intelligently filter and communicate AMI outage data to OMSs, but also facilitate communications between OMSs and multiple types of AMI systems. One exemplary MDMS includes an outage management module that receives AMI outage data in the form of "last gasp" messages from meters and determines whether the OMS is already aware of a power outage associated with those meters. If the OMS is already aware of an outage associated with these meters, the outage management module excludes the outage reports from its communications with the OMS, thereby preserving the OMS's capacity to handle new outage information.

Additionally, the outage management module in the exemplary system helps verify restoration of power by intelligently communicating with meters in an AMR system. For example, the exemplary system automatically collects meter data from meters that have been re-energized and instead of contacting these meters in response to requests to verify restoration, the system can generate a verification report based on the data it already has, thereby not only rapidly responding to verification requests, but also reducing communication traffic between the MDMS and the AMR system.

BRIEF DESCRIPTION OF THE DRAWINGS

FIG. 17 illustrates an example of a CLX/OSN screen.

FIG. 19 illustrates an example of a filtering outage parameter screen.

FIG. 20 illustrates an example of an editing mode determination outage parameter screen.

FIG. 22 illustrates an example of an OCBD outage parameter screen.

FIG. 23 illustrates an example of an outage scoping and restoration screen.

FIG. 24 illustrates an example of an OVE_RE integration screen.

FIG. 25 illustrates an example of a power status inferencing screen.

FIG. 47 illustrates an example of a system-wide mode determination rules screen.

FIG. 48 illustrates an example of a system-wide mode determination rules screen.

FIG. 53 illustrates an example of a nested outage processing outage parameters screen.

Figure 1:
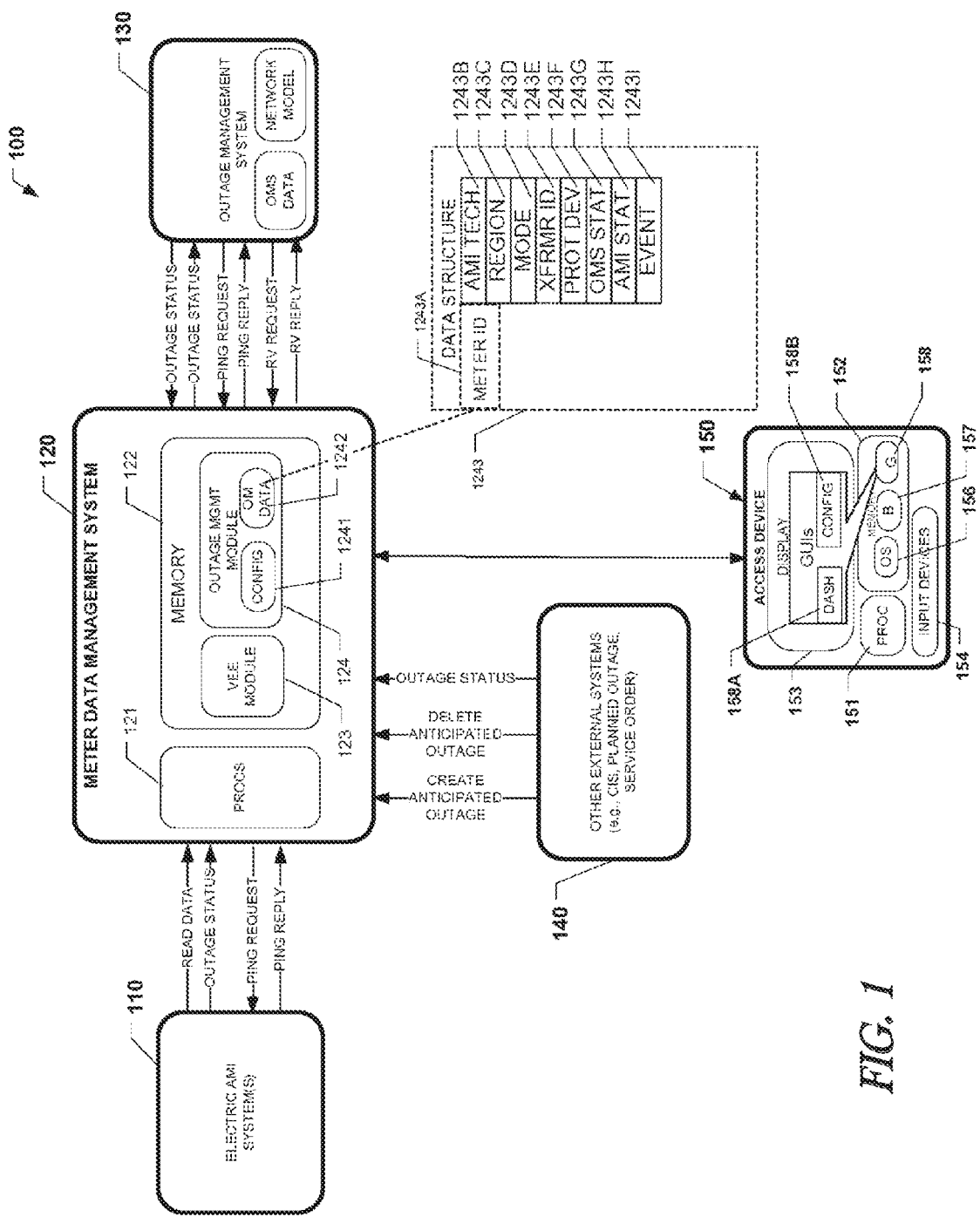
FIG. 1 is a block diagram of an exemplary utility management system corresponding to one or more embodiments of the present invention.

DETAILED DESCRIPTION OF THE
EXEMPLARY EMBODIMENT(S)

This document, which incorporates the drawings and the appended claims, describes one or more specific embodiments of an invention. These embodiments, offered not to limit but only to exemplify and teach the invention, are shown and described in sufficient detail to enable those skilled in the art to implement or practice the invention. Thus, where appropriate to avoid obscuring the invention, the description may omit certain information known to those of skill in the art.

Exemplary Definitions

As an aid to the reader, the following exemplary definitions are offered. However, the definitions are not intended to limit the scope of the claimed invention. Where there is a conflict between a meaning provided here and the meaning suggested or required by the contextual usage of the term in the description, preference should be given to the meaning suggested by the context.

| Term | Definition or Explanation |
| --- | --- |
| AMI | Advanced Metering Infrastructure |
| AMI Network Equipment | Field-deployed components of an AMI that handle communications between the communication modules of AMI-enabled meters or other end devices and the utility's conventional IT network. Generic names for AMI Network Equipment can include concentrators, repeaters, relays, etc. For purposes of this specification, AMI Network Equipment does not include the communication modules in or attached to the meters and other end devices. |
| Anticipated Outage | Anticipated Outages are used by OMM to screen/prevent Outage Status Notification Messages from being sent from OMM to OMS or other utility back office systems. An Anticipated Outage is a superset of the commonly used term Planned Outage. Anticipated Outages encompass not only Planned Outages but also any anticipated event that is likely to interrupt power to one or more service points or to create invalid indications of loss of power to a service point. Such things can include service disconnects for non-pay or other reasons, Service Orders to exchange meters, detection of a faulty meter that is generating spurious Last Gasp messages, etc. |
| Comm State Quality | A component of Comm Status. Comm State Quality can be either "Confirmed", "Inferred", or "Indeterminate" as defined elsewhere in this table. |
| Comm Status | The term used to indicate the combination of Comm State and Comm State Quality for an AMI Network Equipment device. |
| Comm Up Message | An Outage Status Notification which indicates that a communications up condition has been detected for an AMI Network Equipment device. |
| Confirmed | One of three possible values for Energization State Quality and/or Comm State Quality. Confirmed means that a positive indication of the Energization State or Comm State of an End Point, Distribution Transformer, or AMI Network Equipment device has been ascertained by the AMI, MDMS, OMS, or another external system. |
| De-energized | One of three possible values for Energization State. De-energized means that a positive indication of loss of voltage from the distribution network for an End Point, Distribution Transformer, or AMI Network Equipment device has been ascertained by the AMI, MDMS, OMS, or another external system. |
| Data Synchronization | With respect to OMM, Data Synchronization refers to the maintenance of key relationships among Service Points, Distribution Transformers, AMI Network Equipment, Outage Region Assignments, Source Side Protective Devices, and the like. OMM does not have external interfaces for Data Synchronization; rather the OMM Data Synchronization processes populate OMM-related tables by accessing data already provided to the core MDMS through external interfaces with source of record systems. |
| Distribution Transformer | Distribution Transformer means a transformer in the utility's distribution network which supplies power to one or more End Points and/or one or more AMI Network Equipment devices. |
| End Point | A generic term used to indicate a Service Point or the device (meter) associated with the Service Point. For purposes of this specification, End Point refers to metered electric Service Points. |
| Energization State | A component of Energization Status. The current status of an End Point or AMI Network Equipment device indicating whether voltage from the distribution network is present. Energization State can be either 'Energized, De-Energized, or "Indeterminate" as defined elsewhere in this table. |
| Energization State Quality | A component of Energization Status. Energization State Quality can be either "Confirmed", "Inferred", or "Indeterminate" as defined elsewhere in this table. |
| Energization Status | The term used to indicate the combination of Energization State and Energization State Quality for an End Point, Distribution Transformer, or AMI Network Equipment device. |
| Energized | One of three possible values for Energization State. Energized means that a positive indication of the presence of voltage from the distribution network for an End Point, Distribution Transformer, or AMI Network Equipment device has been ascertained by the AMI, MDMS, OMS, or another external system. |
| OMM | Outage Management Module - a server application component that is a modular extension of an MDMS, such as the Ecologic Analytics MDMS, that can serve alone or in conjunction with a utility Outage Management System (OMS) to provide intelligent processing and filtering of outage and restoration alarms and related information for the purpose of optimizing the utility's ability to respond to power outage events. OMM includes the capabilities that may be ascribed in the one or more of the incorporated patent applications as OVE/RE. |
| External First Level Scoping | First Level Scoping carried out by MDMS (or OMM in some embodiments) in response to an explicit request from OMS or another external application. See also the entry for First Level Scoping. |
| First Level Scoping | Determination of the Energization Status of a Distribution Transformer by performing Power Status Checks of all of the AMI-enabled End Points (meters) attached to the Distribution Transformer and then inferring the |

-continued

| Term | Definition or Explanation |
|---|---|
| | Energization Status of the Distribution Transformer based upon the Energization Statuses of the End Points. First Level Scoping can be initiated by logic within OMM, in which case it is referred to as Internal First Level Scoping. First Level Scoping can also be carried out by MDMS in response to an explicit request by OMS or another external application. In that case, it would be referred to as External First Level Scoping. For purposes of this specification, references to First Level Scoping in the absence of an External or Internal qualifier shall mean Internal First Level Scoping. |
| GIS | Geographic Information System |
| Head-End System | The application portion of a Metering System (as defined elsewhere in this table) that communicates on one side with AMI Network Equipment and AMI-enabled End Points and on the other side with enterprise systems such as an MDMS. For purposes of this specification, Head-End Systems provide OMM with Outage Status Notifications and responses to Power Status Checks (pings). |
| Indeterminate | Can be used as any of the following: an Energization State, an Energization State Quality, a Comm State, or a Comm State Quality. When used as a state, Indeterminate means that the Energization State of an End Point, Distribution Transformer, or AMI Network Equipment device or the Comm State of an AMI Network Equipment device cannot be reliably ascertained. Any time a state is set to Indeterminate, the corresponding quality is also to be set to Indeterminate and vice versa. |
| Inferred | One of three possible values for an Energization State Quality or a Comm State Quality. Inferred means that the Energization State or the Comm State of an End Point, Transformer, or AMI Network Device is being inferred based on the Confirmed states of End Points, Distribution Transformers, and/or AMI Network Equipment devices that are related through network connectivity. |
| Internal First Level Scoping | First Level Scoping carried out by MDMS response to logic within OMM. Internal First Level Scoping is can be enabled, disabled, and controlled using OMM configuration parameters. See also the entry for First Level Scoping. |
| Last Gasp Message | A common term used to describe the message sent out by an End Point or AMI Network Equipment device when a loss of voltage from the distribution network is detected. Last Gasp Messages signal the transition to a De-Energized Energization State. |
| Metering System | The IEC (International Electrotechnical Commission) term for a meter data collection system, typically composed of metering devices, a communications network, and a Head-End system that communicates with the metering devices and serves as the point of connection to utility enterprise systems. Many OMM configuration parameters, in the exemplary embodiment, may vary as a function of Metering System, providing the utility with fine-grained control of OMM behavior consistent with the bandwidth and operational characteristics of each Metering System technology. |
| Momentary Outage | An outage that is restored within a short (configurable) amount of time, typically a few seconds to a minute or two. Momentary outages are typically associated with recloser operations or with "blinks" due to conditions such as trees coming into momentary contact with power lines. Many utilities wish to be aware of momentary outages but choose not to send them to their OMS. |
| Navigator | The user interface for the Ecologic MDMS |
| Nested Outage | A smaller outage that may remain when a larger outage involving the same portion of the distribution network is restored. Nested outages can occur in both Momentary Outage and Sustained Outage scenarios. |
| OMS | Outage Management System |
| Network Equipment | See AMI Network Equipment. |
| Outage Mode | For purposes of Outage Management within OMM, the utility may define any number of Outage Modes. There are two flavors of Outage Modes within OMM: Time-based Outage Modes and Storm-Based Outage Modes. OMM can be set via configuration parameters to automatically determine the current Outage Mode for each outage Region based upon time of day (time-based modes) or the number of De-Energized End Points in the Outage Region (storm-based modes). Typical time-based Outage Modes are Day Mode and Night Mode. Typical storm-based outage modes are Small Storm Mode and Large Storm Mode. The Outage Mode for each region can also be set manually via the Navigator. Outage Modes are used within OMM to drive processing logic. In addition, many OMM configuration parameters may vary as a function of Outage Mode, providing the utility with fine-grained control of OMM behavior. |
| Outage Region | For purposes of outage management, a utility's service territory can be divided into any number of Outage Regions. End Points and AMI Network Equipment devices inherit their Outage Region assignment from the Outage Region assigned to the Distribution Transformer that provides power to the End point or AMI Network Equipment Device. The Outage Region associated with a Distribution Transformer is a relationship |

-continued

| Term | Definition or Explanation |
|---|---|
| | managed through Data Synchronization. Outage Regions are used within OMM to drive processing and messaging logic and the display of outage information in the Navigator. In addition, many OMM configuration parameters may vary as a function of Outage Region, providing the utility with fine-grained control of OMM behavior. |
| Outage Status Notification Message | A message type defined in the OVE-RE-Interface-Spec.doc used by a Head-End System, OMM, OMS, or another external system to communicate to another system a change in Outage Status or Comm Status for an End Point, Distribution Transformer, or AMI Network Equipment device. |
| Ping | Ping is a commonly accepted term. For purposes of this specification, Pings are synonymous with Power Status Check Messages, defined elsewhere in this table. |
| Planned Outage | Planned Outages involve the loss of power to one or more service points as the result of planned maintenance on or reconfiguration of the distribution network. For purposed of this specification, Planned Outages are considered a subset of Anticipated Outages. |
| Planned Outage System | An external system in the utility enterprise that is used for the planning and tracking of Planned Outages. |
| Power Down Message | See Last Gasp Message. |
| Power Status Check Message | A message type used to perform on-demand meter readings of the Energization Status of End Points via AMI Head-End Systems. |
| Power Up Message | See Restoration Message. |
| Restoration Message | A common term used to describe the message sent out by an End Point or AMI Network Equipment device when a restoration of voltage from the distribution network is detected. Restoration Messages signal the transition to an Energized Energization State. |
| Restoration Scout | Restoration Scout is an available process within OMM that is used to periodically attempt pings of De-Energized End Points to determine whether the Service Points have returned to the Energized State. This is also referred to as performing proactive Power Status Checks. The Restoration Scout can be disabled or enabled and controlled via configuration parameters. Typically, the Restoration Scout is used in connection with Metering Systems that do not successfully detect and pass to MDMS close to 100% of restoration events; however, the Restoration Scout can be utilized in connection with any Metering System. OMM configuration parameters that are a function of Outage Mode and Metering System are provided to optimize the behavior of the Restoration Scout under various Outage Modes and in recognition of the varying bandwidth available with a particular Metering System technology. |
| Restoration Verification Message | A request/reply message type defined in the OVE-RE-Interface-Spec.doc used by OMS or another external system to request OMM to verify that individual End Points involved in an outage have been restored to the Energized State. OMM will respond to the request by first checking whether Restoration Messages for the individual End Points have already been received from Head-End System(s). If not, OMM will Ping the End Points for which Restoration Messages have not been received and then return an explicit reply to the calling system with the Energization Status of each End Point in the original request. OMM will also update its table for tracking the Energization States believed to exist by OMS to the Energized State for each End Point in the request. |
| Second Level Scoping | Determination of the extent of an outage by performing transformer-level Power Status Checks on one or more Distribution Transformers. Second Level Scoping is typically initiated and directed by an OMS or other system or application (external to OMM) having knowledge of the electrical connectivity of the distribution network. Although external systems request Second Level Scoping by specifying one or more Distribution Transformers, ultimately OMM returns the Energization Status of one or more of the End Points associated with the Distribution Transformer. The number of End Points returned is dependent upon the parameters supplied by the external system making the Second Level Scoping request. |
| Service Order | Generically, a Service Order is a work order created in the utility enterprise. For purposes of this specification, a Service Order is a work order that in some way affects a Metering System and that involves an Anticipated Outage. Service Order Systems (and other enterprise systems) are responsible for defining Anticipated Outage windows to OMM if there is a desire to have OMM block Outage Status Notification Messages associated with affected End Points from being sent to OMS during a specified time period. |
| Service Order System | For purposes of this specification, a Service Order System is any utility enterprise system that creates work or service orders that can involve the creation or deletion of Anticipated Outages. |
| Service Point | See End Point. |
| Source Side Protective Device | A recloser, fuse, or other device in the distribution network that can operate under a fault condition to interrupt the power/voltage to |

| Term | Definition or Explanation |
|---|---|
| | downstream End Points and/or Distribution Transformers. Each End Point, Distribution Transformer, and AMI Network Equipment device can have a designated Source Side Protective Device. These relationships are maintained through Data Synchronization. Logic exists within OMM to limit the inferring of De-Energized End Points and Distribution Transformers to devices sharing a common Source Side Protective Device. |
| Sustained Outage | An outage that persists longer than the configurable time for a Momentary Outage. |

Exemplary Utility Meter Data Processing System

FIG. 1 shows a block diagram of a utility meter data processing system 100. System 100 includes a set of one or more electric AMI systems 110, a meter data management system (MDMS) 120, an outage management system (OMS) 130, external systems 140, and an access device 150.

Exemplary AMI Systems

AMI systems 110 include include one or more meters or AMR (automated meter reading) headend data servers for one or more types of meters and/or AMR systems. Exemplary systems include systems made or sold by DCSI, Hexagram, Cellnet, Silver Spring Networks (SSN), and Landis+Gyr. AMI systems 110 are coupled or couplable via a two-way wireless or wireline communications network, for example Ethernet, to provide meter read data as well as meter energization status (outage status messages) and communication device status messages to MDMS 120. (Note that in some embodiment, one-way communications are used, but these embodiments may be unable to support power status checking or other desirable interrogations of meters or other devices.)

Exemplary Meter Data Management System

MDMS 120, which provides meter data management and outage management functionality, includes a processor module 121, a memory module 122, a validation, editing, and estimation (VEE) module 123, and an outage management module 124. (In the provisional application referenced in the background, the outage management module was referred to as OVE/RE.)

Processor module 121 includes one or more local or distributed processors, controllers, or virtual machines. In the exemplary embodiment, processor module 121 assumes any convenient or desirable form. In some embodiments, one or more of the processors are incorporated into servers, such as SQL database servers.

Memory module 122, which takes the exemplary form of one or more electronic, magnetic, or optical data-storage devices, stores VEE module 123 and outage management module 124.

In the exemplary embodiment, VEE module 123 (which incorporates functions sometimes referred to in the provisional application and other applications referenced herein as WAVE™ and/or iWAVE™ module), includes one or more sets of machine-readable and/or executable instructions for receiving and processing daily and/or interval meter read data from AMI systems 110 and potentially other metering systems. The exemplary VEE processing is performed according to rules and procedures, such as those described in U.S. Pat. No. 7,557,729 and co-pending and co-owned U.S. patent application Ser. No. 12/706,041, both of which are incorporated herein by reference. Results of this processing—validated, edited, and/or estimated daily and/or interval meter read data—is stored within VEE module 123. (Note that some embodiments use meter read data as a proxy for the power up or restore messages at a given point in time.)

Figure 3:
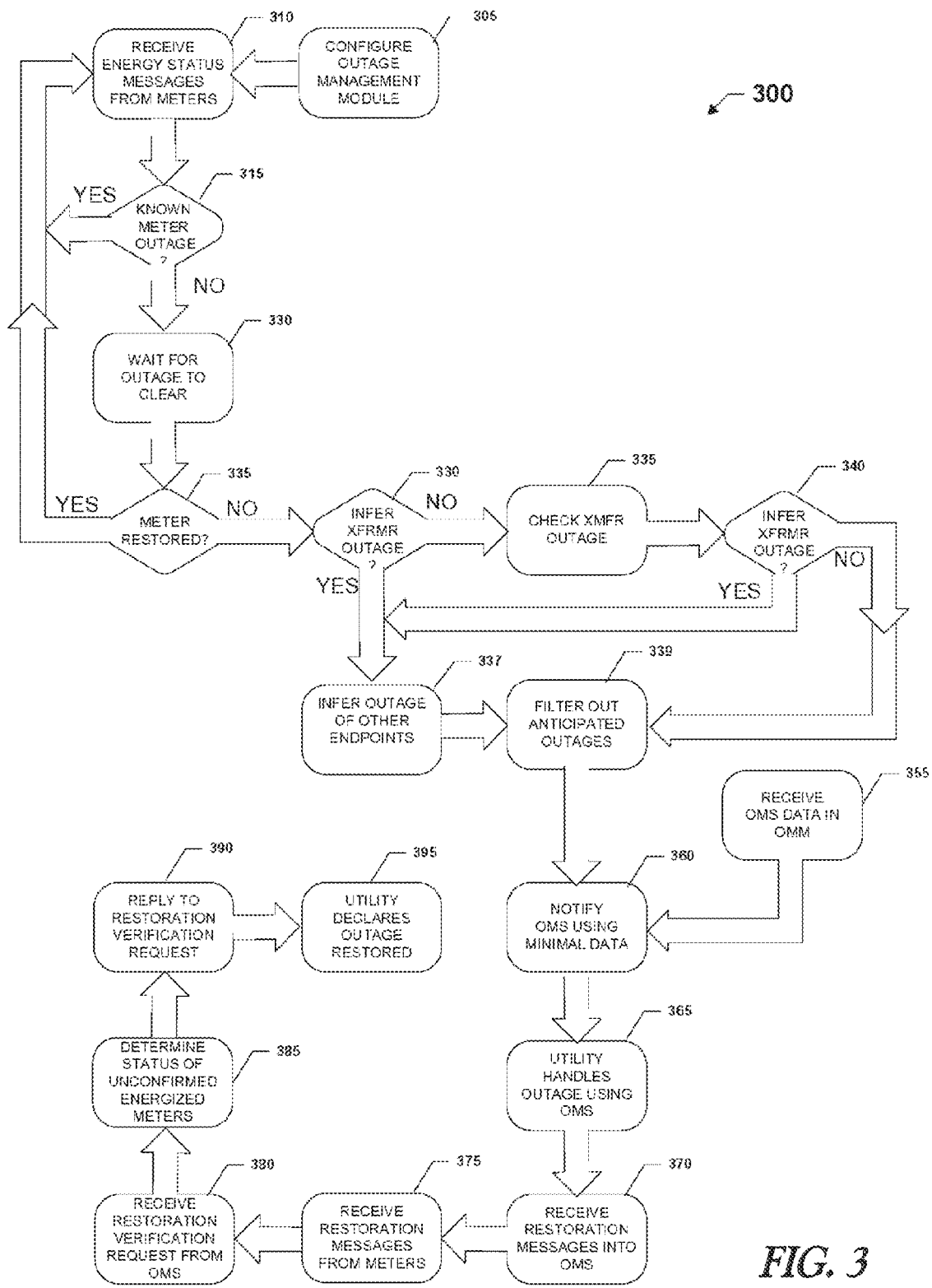
FIG. 3 is a flow chart of an exemplary method of operating the system of FIG. 1, corresponding to one or more embodiments of the present invention.

Outage management module (OMM) 124, which is described in detail using the flow chart of FIG. 3, includes one or more sets of machine-readable and/or executable instructions for receiving and processing end point (meter) energization status messages (outage status messages) from AMI systems 110 (or other enterprise systems), outage status messages and related requests from OMS 130, and anticipated outage related messages from external systems 140.

In general operation of this embodiment, OMM 124 uses JMS queues (not shown) to receive direct and indirect updates from designated or approved AMI head-end systems within AMI systems 110. Direct updates include outage status notifications and responses to ping (power status) requests. Indirect updates include meter read data, which can be used as proxy for the energized status of the meter at the observation time of the meter reading. In some embodiments, OMM 124 can optionally accept outage status notifications from other external systems like a CIS or IVR system. When available, using the information from the AMI head-end system(s) and other external systems, OMM 124 tracks what it deems to be the current energization status of each end point.

Also, OMM 124 accepts outage status notification messages from OMS 130 for end points as well as distribution transformers. OMM 124 uses these outage status notifications to track what OMS 130 currently believes the energization status to be for each end point. Whenever OMS 130 sends OMM 124 the energization status of a distribution transformer, OMM infers the same energization status to the end point(s) associated with that distribution transformer. In addition, OMM 124 can perform periodic proactive power status checks (referred to as restoration scout function) to identify end points that have transitioned to the energized state without that transition having been reported to OMM 124 by the aforementioned direct and indirect update mechanisms. Typically, the restoration scout function is enabled for metering systems that are not able to deliver restoration messages to OMM 124 for a sufficiently high percentage of re-energized end points; however the restoration scout function may be used with any metering system technology.

OMM 124 generally uses all of the energization state and energization state transition data at its disposal to best identify and scope outages and to verify outage restorations according to the particular business rules of each utility. OMM 124 is a highly configurable system that can operate with or without a separate OMS. It can be proactive or reactive in scoping activities and in detecting and verifying restorations.

More particularly, OMM 124 includes a configuration module 1241 and outage management data structures 1242.

Configuration module 1241 stores OMM configuration parameters and machine readable and/or executable instructions for providing a configuration GUI to an access device, such as access device 150. The OMM configuration parameters support and define the specific functional and business flow requirements of each utility. A listing of the OMM configuration parameters, along with default or recommended settings to achieve behaviors associated with an exemplary OMM installation is included as Appendix A. Notably, one or more of the configuration parameters are representative or indicative of rules and/or thresholds within OMS 130. For example, one or more of the configuration parameters are based on threshold number of end point outages that the OMS uses to infer outage of the associated distribution transformer. OMM uses this type of configuration data to minimize the amount of end point status information that it communicates to the OMS to indicate a transformer outage. (Conventional, OMS is typically not designed to receive transformer outage information from customers.)

Many of the configuration parameters used to drive the OMM processing can be specified as a function of outage region, outage mode and metering system. Outage modes are set individually by outage region and are normally determined automatically as a function of time of day (time-based outage mode) and the percentage of de-energized service points in a given Outage Region (storm-based or threshold-based outage mode). Outage modes can also be switched manually by an authorized user using a graphical user interface, such as Ecologic Analytics™ Navigator™ interface. In addition to configuration parameters, there are Assumptions and Conventions associated with the behavior of the OMM. A listing of these is included in Appendix B.

OM data structures 1242 include data structures, such as tables and relational databases, containing the data used by OMM to function. Data structure 1243, which is generally representative of the data structures in the exemplary embodiment includes a meter or end point identification (ID) 1243A which is logically associated with one or more data fields, such as data fields 1243B-1243H. Data field 1243B provides a technology indicator to indicate the AMI technology type of the end point. For example, the technology indicator can indicate a system from one of the following manufacturers DCSI, Hexagram, Cellnet, Silver Spring Networks (SSN), and Landis+Gyr.

Data field 1243C provides a geographic region indicator for a geographic region to which the corresponding end point is assigned. Data field 1243D provides an indication of the outage mode that is currently in effect for the region. Data field 1243E provides a distribution transformer (XFRMR) identifier which identifies a distribution transformer that feeds power to the corresponding end point. Data field 1243F provides an identifier for a source-side protective device, such as fuse or breaker that is coupled to the end point.

Data field 1243G provides energization status indicator indicative of the energization status currently held by OMS 130 for the corresponding end point, for example energized or de-energized. Data field 1243H provides energization status indicator indicative of the energization status currently held by OMM 124 for the corresponding end point, for example energized, confirmed, energized inferred, de-energized confirmed, de-energized inferred, or indeterminate. Data fields 1243G and 1243H include time stamp information. Data field 1242H provides event information for the corresponding end point, indicating a historical record of each state change of the end point, and when it occurred.

Exemplary Outage Management System

OMS 130 can take a variety of computerized forms, which rely on one or more processors and memory. In the exemplary embodiment, OMS 130 includes OMS data 131, a rules engine 132, and a network model 133.

Exemplary External Systems

External systems 140 include one or more utility management related systems which may provide or require information related to outage management. In the exemplary embodiments, these systems include customer information systems, planned outage systems, and service order processing systems, one or more of which can provide information to OMM 124 regarding anticipated outage events. With data regarding anticipated outage events for one or more end points, OMM 124 can avoid communicating outage reports regarding these points to OMS 130.

Exemplary Access Device

Access device 150 provides a mechanism for defining the configuration parameters of OMM 124 via a graphical user interface. In the exemplary embodiment, access device 150 takes the form of a personal computer, workstation, personal digital assistant, mobile telephone, or any other device capable of providing an effective user interface with a server or database. Specifically, access device 150 includes one or more processors (or processing circuits) 151, a memory 152, a display 153, and input devices (e.g., keyboard and mouse) 154.

Processor module 151 includes one or more processors, processing circuits, or controllers. In the exemplary embodiment, processor module 151 takes any convenient or desirable form. Coupled to processor module 151 is memory 152.

Memory 152 stores code (machine-readable or executable instructions) for an operating system 156, a browser 157, and a graphical user interface (GUI) 158. In the exemplary embodiment, operating system 156 takes the form of a version of the Microsoft Windows operating system, and browser 157 takes the form of a version of Microsoft Internet Explorer. Operating system 156 and browser 157 not only receive inputs from keyboard 134 and selector 135, but also support rendering of GUI 158 on display 153. Upon rendering, GUI 158, which is defined at least in part using applets or other programmatic objects or structures from MDMS 120, presents data in association with one or more interactive control features (or user-interface elements). In the exemplary embodiment, GUI 158 includes an OMM dashboard interface 158A and an OMM configuration interface 158B.

Figure 2:
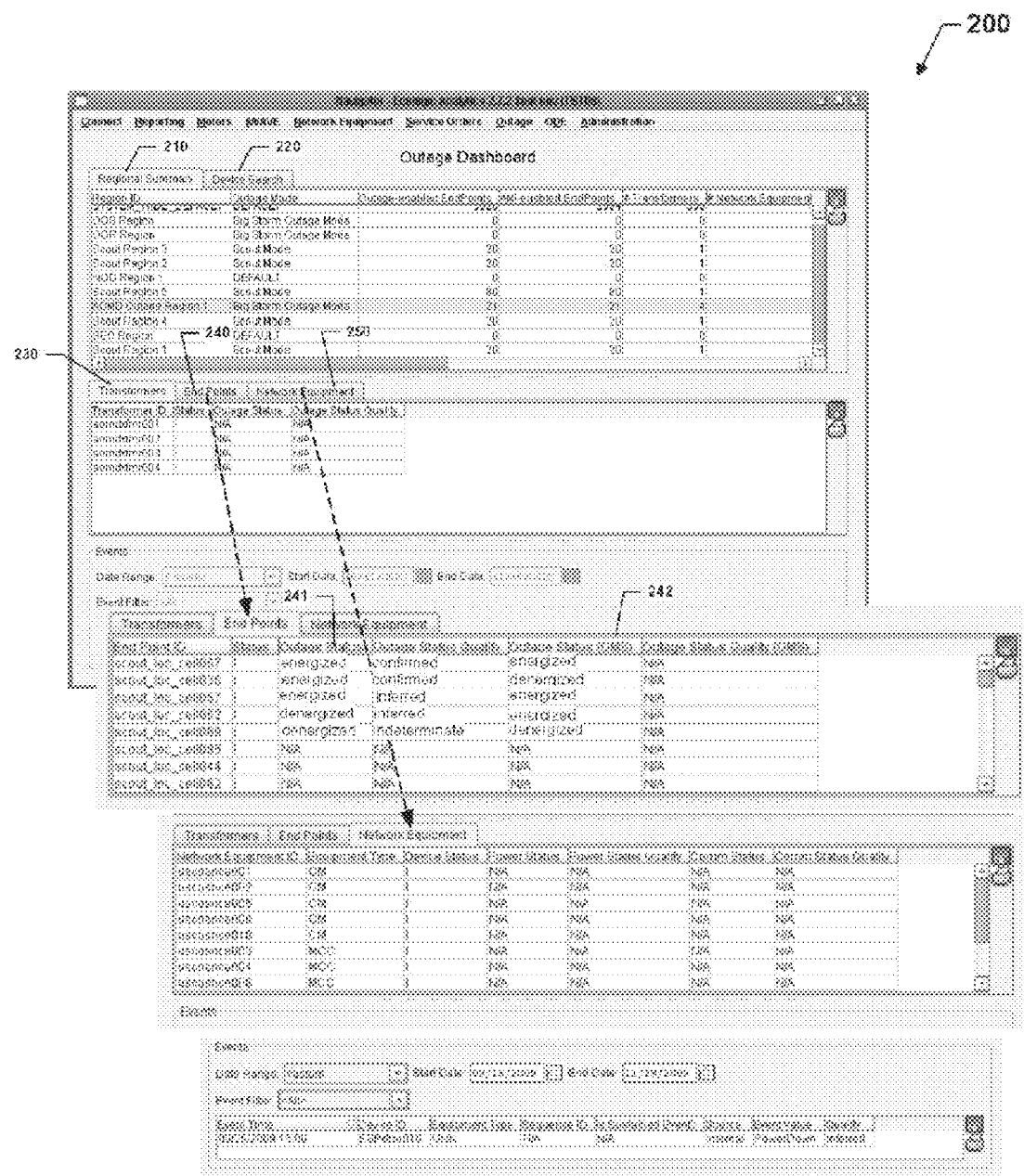
FIG. 2 is a facsimile of an exemplary graphical user interface for interacting with and accessing data within system 100 and which corresponds to one or more embodiments of the present invention.

FIG. 2 shows a detailed exemplary embodiment of OMM dashboard interface 158A, denoted as interface 200. Interface 200 shows summary outage information for Outage Regions as well as detailed outage information for transformers, end points, and network equipment. The top third of the screen includes a regional summary tab 210 and device search tab 220. The middle third of the screen includes transformer tab 230, end points tab 240, and network equipment tab 250 based on the selected region if the regional summary tab is selected or on selected search criteria if the Device Search tab is selected at the top of the screen. The bottom third of the screen ("Events") includes filter criteria and a results section that shows event details for the device selected in the middle third of the screen.

The upper third includes regional counts for Outage enabled end points, AMI-enabled end points, Transformers, Network equipment which are visible in the figure and counts for de-energized transformers, De-energized end points (OMM or AMI), De-energized end points (as reported by the OMS), and De-energized network equipment, and Network equipment for which a communication down notification has been received. Selecting a particular Outage Region, results in update of the middle third of the screen, showing details on transformers, end points, and network equipment Exemplary Method(s) of Operation FIG. 3 shows a flow chart 300 of one or more exemplary methods of operating a system, such as system 100. Flow chart 300 includes blocks 305-395, which are arranged and described in a serial execution sequence in the exemplary embodiment. However, other embodiments execute two or more blocks in parallel using multiple processors or processor-like devices or a single processor organized as two or more virtual machines or sub processors. Other embodiments also alter the process sequence or provide different functional partitions to achieve analogous results. For example, some embodiments may alter the client-server allocation of functions, such that functions shown and described on the server side are implemented in whole or in part on the client side, and vice versa. Moreover, still other embodiments implement the blocks as two or more interconnected hardware modules with related control and data signals communicated between and through the modules. Thus, the exemplary process flow applies to software, hardware, and firmware implementations.

Figure 4:
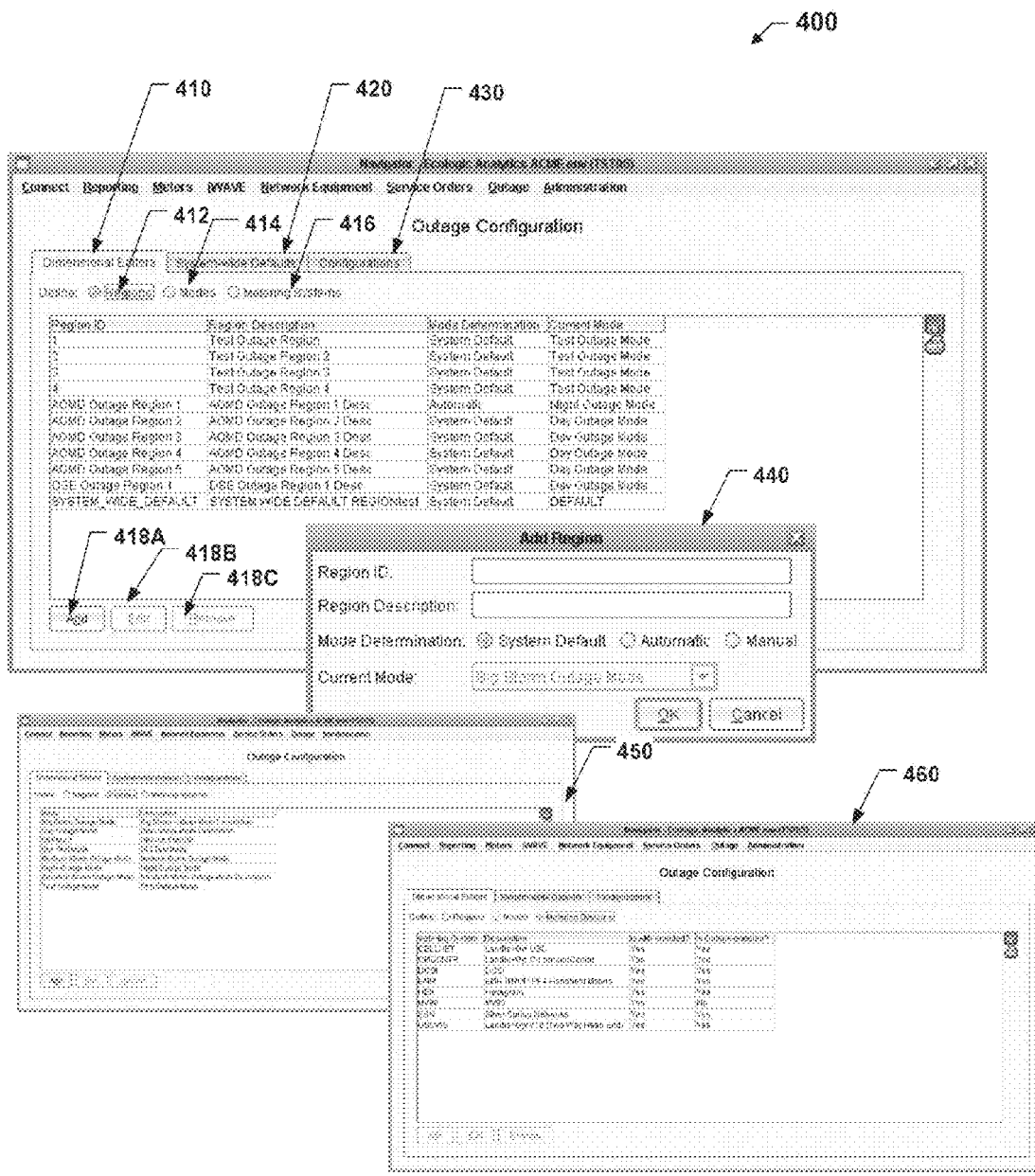
FIG. 4 is a facsimile of an exemplary graphical user interface for configuring an outage management module within system 100 and which corresponds to one or more embodiments of the present invention.
Figure 5:
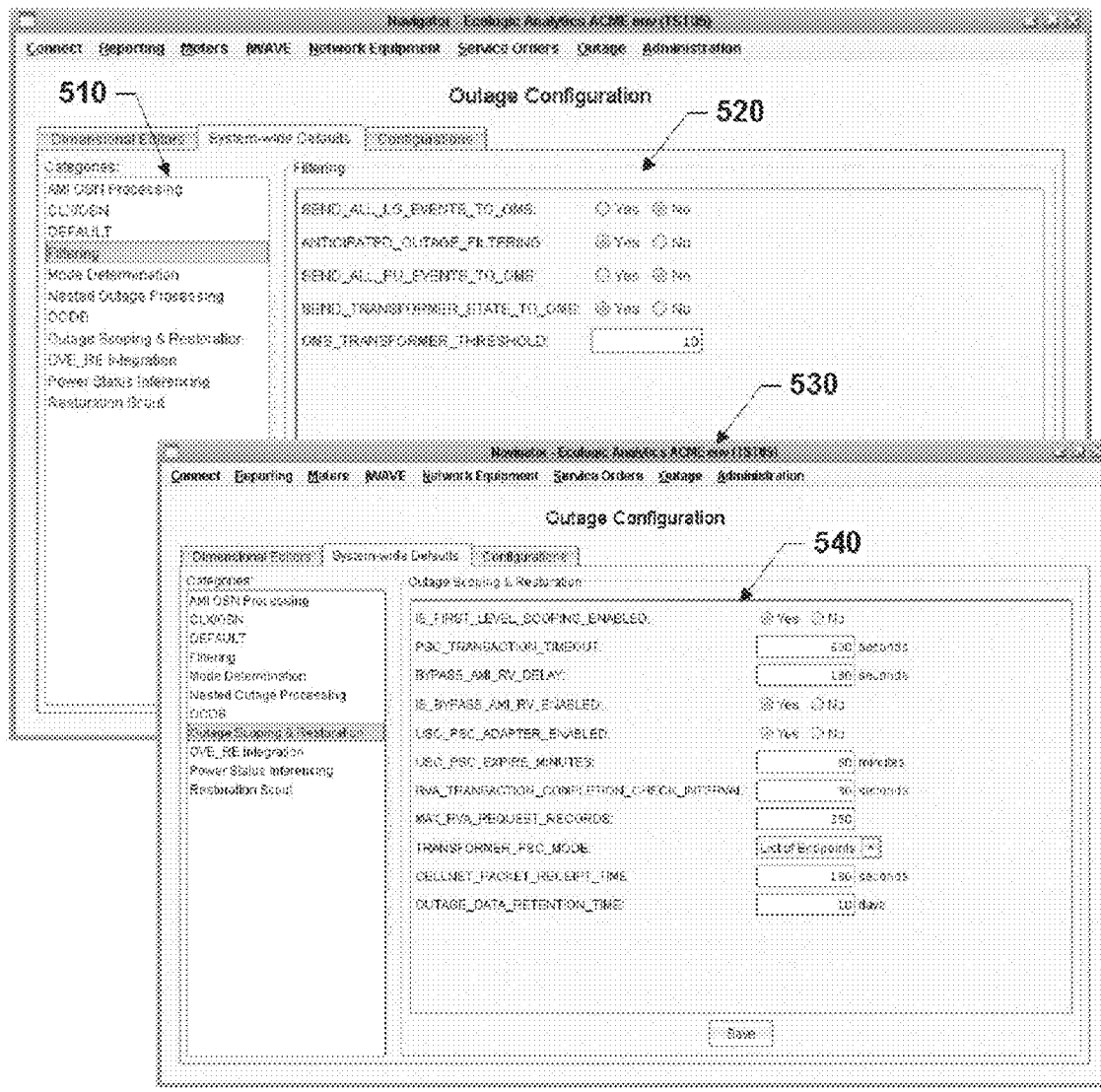
FIG. 5 is a facsimile of an exemplary graphical user interface for further configuring an outage management module within system 100 and which corresponds to one or more embodiments of the present invention.
Figure 6:
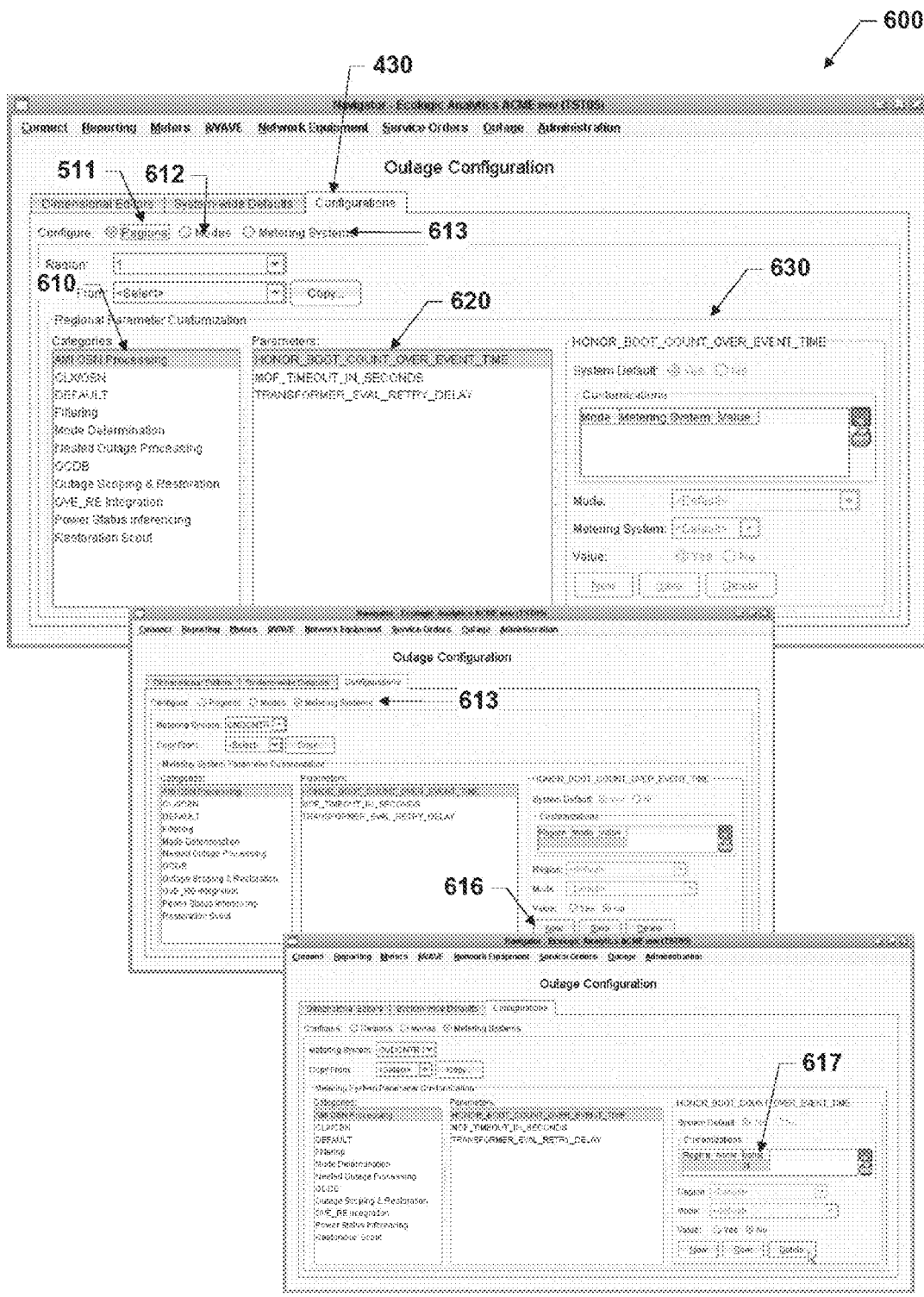
FIG. 6 is a facsimile of an exemplary graphical user interface for further configuring an outage management module within system 100 and which corresponds to one or more embodiments of the present invention.

At block 305, the exemplary method begins with defining configuration parameters for the outage management module of system 100. In the exemplary embodiment, this entails defining one or more configuration parameters as outlined in Appendix A using configuration GUI 158B. FIGS. 4-6 show an exemplary implementation of GUI 158B.

FIG. 4 shows an exemplary configuration editor interface 400 which is used in the exemplary embodiment. In general, interface 400 facilitates definition of outage regions, outage modes, outage metering systems, system-wide values for all OMM configuration parameters, and configuration parameter values per combination of region, mode, and metering system, depending on which dimensions are applicable per parameter. Applicability of dimensions per parameter is table-defined. In the exemplary embodiment, a backend API within OMM looks up parameter values based on the input of a parameter name, a region-mode-metering-system triple (for applicable dimensions per parameter).

More particularly, interface 400 includes three main interface tabs: a dimensional editor tab 410, a system-wide default tab 420, and a configurations tab 440. Dimensional editors tab 410 allows users to view and define Outage Regions, Outage Modes, and AMI vendor metering systems via selection of respective control features, for example radio buttons, 412, 414, and 416. (The parameter settings for outage regions, outage modes, and AMI vendor metering systems are viewed and defined on configurations tab 440.)

When region radio button 412 is selected on the dimensional editors tab 410, as depicted in FIG. 4, interface 400 allows users to add or edit Outage Regions in OMM. In addition, the interface lets users specify the current Outage Mode for an Outage Region if OMM is running in manual mode determination (as determined by the OMM IS_AUTOMATED_MODE_DETERMINATION_ENABLED parameter). Adding an outage region entails clicking on an add button 418A to display an add region window 440, where a user can enter a Region ID, Region Description, and specify the desired mode determination. If system default is selected, the parameter IS_AUTOMATED_MODE_DETERMINATION_ENABLED on the system-wide defaults tab under the Mode Determination category will be used. If automatic is selected, the IS_AUTOMATED_MODE_DETERMINATION_ENABLED to "Y" as a custom configuration on the Configurations tab under the Mode Determination category for the Outage Region being added. If manual is selected, then a current mode drop-down box is enabled, allowing manual selection of the current Outage Mode for the Outage Region you are adding, as explained below. Similar windows for editing and removing windows can be invoked using edit and remove buttons.

When modes radio button 414 is selected interface screen 450 is displayed.

This screen allows users add or edit Outage Modes used by OMM. And, when metering systems radio button 416 is selected, interface screen (or region) 460 is displayed, allowing users to define all of the external metering systems with AMI systems 110 and outage-enable any of these metering system. (When a meter is outage-enable, a row is created in the METERING_SYSTEMS table.) Interface screen 460 also allows one to outage-disable a metering system (thereby removing the row in the METERING_SYSTEM table) as long as there are no dependent service points in an OUTAGE_SERVICE_POINT table used by the OMM. In the exemplary embodiment, the AMI-enabled status is informational only and cannot be changed.

Selection of system-wide defaults tab 420 results in display of interface screen 500, as shown in FIG. 5. Interface screen 500 allows users to view and change system-wide defaults for all OMM parameters. OMM is initially configured with default values for all parameters for these system-wide settings. (There is one exception: the "mode determination rules" parameter which specifies whether an outage mode is storm-based or time-based, along with either a storm threshold or a start time; these system-wide defaults can be configured only by the client utility, as explained below.) In the exemplary embodiment, some parameters can be set only at the system-level; these are noted with an "X" in the "System Level" column in the parameter table included within Appendix A. All system-level default values can be changed by the client utility. In addition, many parameters can also be customized by the client utility at the outage region, outage mode, and/or AMI vendor metering system levels, as indicated in Appendix A. Interface screen 500 includes a parameter category display and selection region 410, which shows that OMM parameters are grouped into eleven selectable categories:

AMI OSN Processing
CLX/OSN
DEFAULT
Filtering
Mode Determination
Nested Outage Processing
OCDB
Outage Scoping & Restoration
OMM Integration
Power Status Inferencing
Restoration Scout The filtering category is shown selected in the Figure, which also causes parameters related to control of the filtering functionality to be displayed in a filtering parameter region 420. When the outage scoping and restoration category is selected, as indicated in interface screen 430, the settings for various scoping and restoration parameters are displayed in region 440.

Selection of configuration tab 430 (in FIG. 4) results in display of interface screen 600, as shown in FIG. 6. As noted earlier, all OMM parameters have system-level default values. Interface screen 600 allows users to view and customize these parameter values at various levels (outage region, outage mode, and/or metering system), depending on the dimensions applicable to each parameter as defined in Appendix A. Parameters can also be configured so that they apply to a particular combination of outage region, outage mode, and/or metering system, again according to the applicable dimensions of each parameter. The configuration screens automatically handle the level or levels at which a parameter can be set, and it is possible to copy existing parameter sets.

In particular, interface screen 600 includes a parameter category display and selection region 610, which shows that OMM parameters are grouped into the same eleven selectable categories used in screen 500 for system-wide defaults:

AMI OSN Processing
CLX/OSN
DEFAULT
Filtering
Mode Determination
Nested Outage Processing
OCDB
Outage Scoping & Restoration
OMM Integration
Power Status Inferencing
Restoration Scout The parameters for each of these categories are displayed on separate screens.

In addition, there are mode determination rules that specify whether an outage mode is storm-based or time-based, along with either a storm threshold or a start time. These are properties of each outage region that a client utility sets up, and are set via the Mode Determination Rules for the Mode Determination category. Changing a parameter value on any of these screens entails typing in the desired value or selecting the appropriate radio button and then selecting the save option. Further information regarding the exemplary configuration interface is included in Appendix C.

FIG. 3 shows that after the OMM is configured at block 305, execution continues at block 310.

In block 310, MDMS 130 receives energization status messages, such as last gasp and restore messages, and/or daily and interval read data from AMI systems 110. Exemplary execution continues at block 315.

Block 315 entails determining whether the outage data is known or unknown by the OMM based on the AMI status data it holds. In the exemplary embodiment, when the MDMS receives a last gasp message from an end point (meter), it sends an outage status notification message to OMM with an energization status of "de-energized, confirmed". When OMM receives this message, it initially determines, for example, by checking a service or endpoint status table, whether that end Point was already in a "de-energized, confirmed" or "de-energized, inferred" state. If it was, OMM log the time of this latest notification, but takes no further action to process the message or pass it to the OMS, instead branching back to block 310 to process other received data. However, if the outage of this meter is unknown, execution proceeds to block 330.

In block 330, OMM waits a configurable amount of time for a restoration message for the same End Point. The duration of the wait period is determined by the configuration parameters defined at block 305. In some embodiments, the wait period is a function of the geographic region associated with the end point and the outage mode in effect for that region. Outage mode can be function of the time of day or size of the outage. The wait time allows OMM to disregard momentary outages and prevent them from affecting distribution transformer energization status inferencing and/or from being sent to the OMS. After the wait period, execution continues at block 335.

Block 335 entails checking if a restoration message for the end point has been received. If the restoration message has been received, indicating that the outage condition no longer exists and the end point is operational, execution branches back to block 310 to process other messages. However, if no restoration message for the end point has been received, execution proceeds to block 337.

Block 337 determines whether the end point outage represented by the outage message is associated with a larger outage, such as a distribution transformer outage. In the exemplary embodiment, this transformer outage determination is performed using two different methods. The first method entails determining whether a threshold minimum number of end points or threshold percentage of end points (or both) associated with the transformer. (The threshold minimum and threshold percentage are configuration parameters defined in block 305.) If the threshold minimum number or percentage is satisfied, the outage management module will designate the distribution transformer associated with the end point as exhibiting an outage, or more specifically as "de-energized, inferred." The second method is based upon identification of simultaneous outage events on multiple distribution transformers having a common nearest source side protective device. If a configurable number of last gasp messages are received in a configurable time frame across multiple distribution transformers having a common nearest source side protective device, OMM will also cause the energization state of these multiple distribution transformers to be set to de-energized, inferred.

If either of the two methods indicates that its condition for inferring the outage to the distribution Transformer level is satisfied, OMM will infer the de-energized state of the given transformer end point to other end points on the affected transformer(s) as indicated at block 339. Inferring the outage to the other end points entails updating the status of the end points in a state table (OM data 1343) to indicate de-energized confirmed along with a date stamp for the change. If inferring outage of the transformer is not possible, execution branches to block 345.

In block 345, the system, if configured at block 305 to do so, initiates first level scoping, which involves affirmatively determining whether the other end points associated with the distribution transformer for the de-energized end point are energized or not. To this end, the exemplary embodiment performs a power status check of each of the end points, specifically requesting the metering system(s) to ping all of the AMI-enabled end points on the respective distribution transformer.

In the exemplary embodiment, the power status checking, known as First Level Scoping can be controlled via a configuration parameter that is a function of Outage Region, Outage Mode and Metering System. This allows the utility to optimize the use of AMI network bandwidth under a wide range of operational scenarios ranging from normal operations to large-scale storms.

After receiving the results of the pings, execution continues at block 340.

In block 340, OMM again attempts to determine whether the there is a transformer-level outage using the first inference method used at block 337. Specifically, the OMM determines whether a threshold minimum number of end points or threshold percentage of end points associated with the transformer associated with the end point are also experiencing an outage. If the threshold minimum number or percentage is satisfied, execution branches to block 345.

In block 345, the OMM infers that the all the end points associated with the distribution transformer for the end point message under consideration are exhibiting an outage. In the exemplary embodiment, this inferring entails labeling or updating OMM status in OM data 1343 for the relevant end points as "de-energized, inferred." Execution continues at block 350.

Block 350 entails determining whether any of the inferred or determined end point outages is associated with an anticipated outage condition. This entails queuing the messages and then checking them against a listing of OMS Anticipated Outage Events. OMM may expect end points to have anticipated outage events based on information received from external systems such as a Customer Information System (for locks and shut offs for non-pay), a Planned Outage System or a Service Order System. There are interfaces to the OMM system to create and delete these Anticipated Outage Events. (Note: If desired, the filtering of Anticipated Outages can be disabled via a configuration parameter.)

At block 355, OMM 134 receives outage report data from OMS and updates the OMS status fields for the effected end points in OM data 1343. Execution continues at block 360.

Block 360 entails notifying OMS of the outage using a minimum number of energization status messages. In the exemplary embodiment, this entails blocking any outage status messages that were deemed to be associated with an Anticipated Outage or that have are already indicated by their OMS status fields within OM data 1343 to be de-energized. This blocking is intended to lessen the burden on OMS by eliminating redundant or otherwise unwanted messages. However, if an end point is already part of a known OMS outage, but the outage event time for the new end point outage status notification message is later (by more than a configurable parameter) than the start time of the known OMS outage, then the new outage event time will be retained by OMM for later use in restoration validation processing.

In block 365, the utility handles the outage using OMS 130. In the exemplary embodiment, this entails the utility declaring, managing, and restoring the outage using the OMS and other conventional systems. As repairs are made and power is restored, repair crews and customers may phone in transformer and end point restorations.

In block 370, OMM 134 receives restoration (power up) messages from AMI systems 110. As these messages are received, OMM will update the end point energization status with energized confirmed state indicators and record the time of the energization status change in the respective event logs for the rend points. Execution continues at block 375.

In block 375, OMM 134 receives restoration messages from OMS 130.

In the exemplary embodiment, OMS send OMM unsolicited outage status notification messages whenever OMS deems that the energization state of an end point has changed. In response, OMM updates the OMS status tables indicating OMS's view of the energization state of the relevant end points. In response to a restoration notification message of this type, if OMM has previously received an Outage Status Notification from AMI indicating that the End Point is De-Energized and the outage event time associated with that notification is later than the outage start time known to OMS (by more than a configurable parameter), then OMM will send a new Outage Status Notification Message to OMS to inform OMS that the End Point may be de-energized. Execution continues at block 380.

In block 380, OMM 134 receives a restoration verification request from OMS 130. Exemplary execution advances to block 385.

At block 385, OMM 134 responds to the request by initiating a power status check of all the end points in the verification request that do not have an energized confirmed status in the OM data 1343. In other words, if any of the end points in the request are indicated as being de-energized, energized inferred, or indeterminate, the OMM communicates with the corresponding AMI systems within AMI systems 110, requesting initiation of a power status check of those end points. However, for those end points indicated by the OM data as being energized confirmed, the OMM will not request initiation of the power status check, thereby conserving bandwidth on the communications channels with AMI systems 110 and between the headend servers within AMI systems 110 and their associated end points.

In block 390, OMM 134 replies to the verification request with the results of any power status checks and/or the confirmed energized data that was collected prior to the OMM's receipt of the verification request. If the Energization Status of one or more of the End Points could not be determined for any reason, the reply will also contain an error message for each such End Point indicating the specific error that occurred. The OMS can then use the returned information to determine the existence of new or nested outages. In some embodiments, the OMM also includes special logic to help identify the possible existence of Nested Outages In some embodiments, the OMM also includes special logic to help identify the possible existence of Nested Outages following a Momentary Outage scenario. Restoration Messages that OMM receives from a Metering System for which there is no known outage in OMS will be recorded, grouped by common Source Side Protective Device, and analyzed. If the number of these messages received within a configurable time period for any group exceeds another configurable parameter, then the corresponding list of restoration events will be sent to OMS using a special message type that indicates a potential Nested Outage.

In block 395, the utility declares the outage condition over, assuming that the reply to the verification request has indicated complete restoration. In the event of less than complete verification of the restoration, the OMS may request scoping to be performed.

In the exemplary embodiment, there are two additional ways that information concerning restoration events can be made known to OMM: 1) via the receipt of meter readings that serve as an indication that the End Point was energized at the observation time of the meter reading, and 3) via the Restoration Scout. The variety of methods by which OMM can be made aware of restoration events collectively are designed to minimize the probability that restoration events go undetected for significant periods of time. This in turn helps to improve the utility's outage statistics.

OMM also has a configuration parameter to control integration between OMM and VEE processing. If this function is enabled, the outage state and outage event history tracked by OMM is made available to the MDMS VEE function, allowing VEE to estimate zero consumption for known outage periods.

Data Validation

Whenever OMM receives an unsolicited message from a Metering System, OMS, or another external system for an End Point or Distribution Transformer that is not known to OMM, the error will be logged and no further processing of the message will occur.

Whenever OMM receives from AMI, OMS, or another external system, a message containing information associating an End Point to a Distribution Transformer, OMM will attempt to validate the End Point to Distribution Transformer association before further processing the message. If the validation fails, the error will be logged and, in the case of a request/reply message, an error code indicting the failure will be returned to the calling system.

APPENDIX A

Exemplary Configuration Parameters

Listed below, in alphabetical order, are descriptions of the OMM parameters that affect operation of the exemplary OMM. These parameters as noted above can be readily configured using configuration GUI, as described herein, for example in Appendix C.

All OMM parameters are configured initially with system-level default values, except for MODE_WINDOW_START_TIME and STORM_MODE_THRESHOLD, which must be set by the client utility for each outage mode used by that client utility (as described below in a section entitled Setting System-wide Mode Determination Rules) once the client utility has configured the outage modes it will use.

Notes regarding the table: Parameters that can be set only at a system level have an "X" in the "System Level Only" column. (Some embodiments may not be so limited.) Parameters that can be customized by "outage region", "outage mode", and/or "metering system" have a check in those columns. If a parameter can be customized at multiple levels, then it is possible to set values for any or all combinations of those levels. For example, one can set the RESTORATION_SCOUT_ENDPOINT_PERCENTAGE parameter to 25% for a Big Storm Outage Mode in Region 1 for DCSI, to 20% for a Big Storm Outage Mode in Region 1 for SSN, to 20% for a Big Storm Outage Mode in Region 2 for DCSI, and to 15% for a Big Storm Outage Mode in Region 2 for SSN.

In addition to the parameters listed below, it is also possible to set "outage-enabled" to "Yes" or "No" for each metering system, whether AMI-enabled or not. (When a metering system is Outage-enabled, a row is inserted in the METERING_SYSTEMS table; when a metering system is Outage-disabled, the row is deleted. However, a metering system cannot be Outage-disabled if that metering system has dependent service points in the OUTAGE_SERVICE_POINT table.) Furthermore, as noted in the IS_VEE_INTEGRATION_ENABLED parameter description, the WAVE Outage Flag parameter controls whether WAVE uses the "OUT" estimation rule (zero estimation on a full-day outage day).

OMM Parameter Descriptions Table

| PARAMETER_NAME | PARAMETER_DESCRIPTION | System Level Only | Outage Region | Outage Mode | Metering System | Recommended Values | Default Value |
|---|---|---|---|---|---|---|---|
| ANTICIPATED_OUTAGE_FILTERING | Block/don't block outage and restoration messages from being sent to OMS is an Anticipated Outage exists for the endpoint. An anticipated outage can be a planned outage, a disconnect for non-payment, a faulty meter, a scheduled meter exchange, a service order, etc. | X | — | — | — | Y or N | Y |
| BYPASS_AMI_RV_DELAY | Time period in seconds to wait for power-ups to be received from AMI if initial check of the endpoints in an RV request indicates that power-ups have not been received for any of the endpoints. Ignored if IS_BYPASS_AMI_RV_ENABLED is set to "N". intent is to handle cases where the OMS operator intentionally closes an outage that is not restored. | — | — | — | X | 0 to 600 | 180 |
| CELLNET_PACKET_RECEIPT_TIME | Time in seconds allotted to allow last gasps and other packets sent by meters to be received by Cellnet Cellmasters. Applies only to Cellnet 1-Way metering system. Should be set as long as or longer than the normal frequency at which meters send information to Cellmasters. | X | — | — | — | 120 to 600 | 180 |
| CLX_OSN_ENABLED | Enable/disable the CLX Adapter for processing outage status notifications from the CLX CIS. If this parameter is set to "N/A", then the "No" button for this parameter is disabled because the client utility does not use this feature; in addition, the Outage Status Notification Adapter from CLX DDD will not check periodically for enablement. If this parameter is changed from "N/A" to anything else, a restart of the application server is required before the parameter change will take effect. | X | — | — | — | Y or N or N/A | N |
| CLX_OSN_EXPIRE_MINUTES | Time in minutes after which it should be assumed that the process lock is stale and another instance should be | X | — | — | — | 15 to 300 | 60 |

OMM Parameter Descriptions Table

| PARAMETER_NAME | PARAMETER_DESCRIPTION | System Level Only | Outage Region | Outage Mode | Metering System | Recommended Values | Default Value |
|---|---|---|---|---|---|---|---|
| | allowed to release the lock and proceed with periodic processing. ignored if CLX_OSN_ENABLED is set to "N". | | | | | | |
| CLX_OSN_INTERVAL | Interval in seconds at which the CLX/OSN adapter process will query the CLX CIS and create new outage status notifications. | X | — | — | — | 60 to 600 | 300 |
| ENDPOINT_THRESHOLD_ ABSOLUTE | Number of endpoint outages at a Distribution Transformer needed to infer a transformer level outage. Ignored if "INFER_OUTAGE_AT_ DISTRIBUTION_TRANSFORMER is set to "N". Recommendation is to set this to the same value as OMS_TRANSFORMER_ THRESHOLD. | — | X | X | X | 0 to 5 | 2 |
| ENDPOINT_THRESHOLD_ RELATIVE | Percentage of endpoint outages at a Distribution Transformer needed to infer a transformer level Outage. Ignored if "INFER_OUTAGE_AT_ DISTRIBUTION_TRANSFORMER is set to "N". | — | X | X | X | 0 to 100 | 25 |
| HONOR_BOOT_COUNT_ OVER_EVENT_TIME | Override sequence of outage state timestamps from AMI is Sequence_ID (Boot Count) has incremented. Sequence_ID can be a boot count or any other sequence number. | — | — | — | X | Y or N | N |
| INFER_OUTAGE_AT_ DISTRIBUTION_ TRANSFORMER | Enable/disable state and event-based transformer inferencing. If set to "Y" and ENDPOINT_ THRESHOLD_ABSOLUTE set to "0", then the outage will be inferred to the transformer level based solely on meeting or exceeding the percentage specified in ENDPOINT_ THRESHOLD_RELATIVE. If set to "Y" and ENDPOINT_ THRESHOLD_RELATIVE. If set to "Y" and ENDPOINT_ THRESHOLD_RELATIVE is set to "0". Then the outage will be inferred to the transformer level based solely on equaling or exceeding the number specified in "ENDPOINT_ THRESHOLD_ABSOLUTE. If set to "Y" and ENDPOINT_ THRESHOLD_ABSOLUTE and ENDPOINT_ THRESHOLD_RELATIVE are both non-zero, and then both the percentage and the number must be equaled or exceeded in order to infer the outage to the transformer level. | — | X | X | X | Y or N | Y |
| IS_AUTOMATED_MODE_ DETERMINATION_ ENABLED | Enable/disable automatic determination of outage modes. If set to "N" for an outage region, the outage mode for that region will be set manually in Navigator. | — | X | — | — | Y or N | Y |
| IS_BYPASS_AMI_RV_ ENABLED | Bypass power status check via the AMI vendor's metering system for Restoration Verification requests where power-ups have not been received from AMI for any of the endpoints in the RV request after a configurable time period. The intent is to handle cases where the OMS operator intentionally closes an outage in OMS even though it is not restored (perhaps because there are other larger outages that must be addressed first) It is possible that the client utility might want to set this parameter to "Y" in response to actions by the OMS operator. | — | X | — | — | Y or N | Y |

OMM Parameter Descriptions Table

| PARAMETER_NAME | PARAMETER_DESCRIPTION | System Level Only | Outage Region | Outage Mode | Metering System | Recommended Values | Default Value |
|---|---|---|---|---|---|---|---|
| IS_FIRST_LEVEL_SCOPING_ENABLED | Enable/disable first-level scoping. Refers to first level scoping initiated by MDMS, not first level scoping initiated by an external system such as OMS. | — | X | X | X | Y or N | Y |
| IS_NESTED_OUTAGE_PROCESSING_ENABLED | Send "simultaneous" confirmed restoration messages across multiple transformers having a common nearest source side protective device that are not associated with a known OMS outage to OMS to assist in nested outage determination. The intent is to identify sustained nested outage(s) following a momentary outage. | — | X | — | — | Y or N | Y |
| IS_OMS_INTEGRATION_ENABLED | Enable disable OMS integration. At a system-level, this parameter must be "Y" if any outage region is set to "Y". This parameter does NOT enable/disable any OMS JMS queues. At an outage region level, this enables/disables OMS integration for a particular region. | — | X | — | — | Y or N | Y |
| IS_OVE_RE_ENABLED | Enable/disable OMM functionality This parameter is always set to "Y" and cannot be disabled. | X | — | — | — | Y or N | Y |
| IS_RESTORATION_SCOUT_ENABLED | Enable/disable the Restoration Scout process. If enabled, this process will periodically perform power status checks to determine if endpoints believed to be de-energized have had power restored. It is typically used with metering systems that have a low success rate in delivering power-up notifications to MDMS. However, it can be used for any metering system. | X | — | — | — | Y or N | Y |
| IS_VEE_OUTAGE_INTEGRATION_ENABLED | Enable integration between VEE and OMM. Specifically, this controls whether the Populate Outage History Process (outage_history.ksh) runs or not. The WAVE Outage Flag parameter controls whether WAVE uses the "OUT" estimation rule (zero estimation on a full-day outage day). | X | — | — | — | Y or N | Y |
| LOG_LEVEL | Level of logging to be performed by OMM. SEVERE logs only messages describing events that are of considerable importance and will prevent normal program execution. WARNING logs SEVERE messages plus messages describing events that indicate a significant problem with the application but are not preventing the process from continuing. INFO logs SEVERE and WARNING messages plus messages describing events that will be of interest to end users or system managers or that indicate potential problems. DEBUG logs SEVERE, WARNING, and INFO messages plus messages providing highly detailed tracing information; this setting may have a significant negative impact on performance. | X | — | — | — | SEVERE or WARNING or INFO or DEBUG | WARNING |
| MVA_RVA_REQUEST_RECORDS | Maximum number of request rows in a Cellnet RVA Request File. Applies only to Cellnet 1-Way metering system. Keep low to ensure low latency in processing pending requests. | X | — | — | — | 100 to 1000 | 250 |
| MODE_DETERMINATION_EXPIRE_MINUTES | Time in minutes after which it should be assumed that the process lock is stale and another instance should be allowed to release the lock and proceed with periodic processing. | X | — | — | — | 15 to 300 | 60 |

-continued

OMM Parameter Descriptions Table

| PARAMETER_NAME | PARAMETER_DESCRIPTION | System Level Only | Outage Region | Outage Mode | Metering System | Recommended Values | Default Value |
|---|---|---|---|---|---|---|---|
| MODE_DETERMINATION_INTERVAL | Interval in seconds at which the Outage Mode for each Outage Region will be evaluated when automated mode determination is enabled. | X | — | — | — | 60 to 600 | 300 |
| MODE_WINDOW_START_TIME | Start time of time window for a time-based Outage Mode. Time based outage modes are overridden if storm threshold is reached or exceeded. The end time for a time-based outage mode is right before the start time of the next outage mode. For example, of one outage mode starts at 06:00:00, the previous mode ends at 05:59:59. | — | X | X | — | Any time of day in HH:MM:SS | E.g.: 00:00:00 or 07:00:00 |
| MOF_TIMEOUT_IN_SECONDS | Delay in seconds to wait for momentary outages to resolve before starting outage inferencing and/or scoping. Momentary outages that are restored within this time interval will not be inferred to transformer-level outages and will not be passed to OMS unless "SEND_ALL_LG_EVENTS_TO_OMS is set to "Y". | X | — | — | — | 0 to 300 | 90 |
| NESTED_OUTAGE_RESTORATION_THRESHOLD | Number of simultaneous confirmed restoration messages across multiple transformers having a common nearest source side protective device required to trigger the behavior associated with IS_NESTED_OUTAGE_PROCESSING_ENABLED. The intent is to identify sustained nested outage(s) following a momentary outage. | — | X | — | — | 0 to 100 | 20 |
| OCDB_OSN_ENABLED | Enable/disable the OCDB/OSN Adapter for a Cellnet 1-way Metering System. If this parameter is set to "N/A", then the "No" button for this parameter is disabled because the client utility does not use this feature; in addition, the Outage Status Notification Adapter from the Cellnet OCDB will not check periodically for enablement. If this parameter is changed from "N/A" to anything else, a restart of the application server is required before the parameter change will take effect. | X | — | — | — | Y or N or N/A | N |
| OCDB_OSN_EXPIRE_MINUTES | Time in minutes after which it should be assumed that the process lock is stale and another instance should be allowed to release the lock and proceed with periodic processing. | X | — | — | — | 15 to 300 | 60 |
| OCDB_OSN_INTERVAL | Interval in seconds at which the OCDB/OSN adapter process will query the Cellnet OCDB and create new outage status notifications. | X | — | — | — | 60 to 600 | 300 |
| OMS_TRANSFORMER_THRESHOLD | Number of endpoints to send to OMS when a transformer-level outage has been determined to exist. Recommendation is to set this to the same value as ENDPOINT_THRESHOLD_ABSOLUTE. If intent is to send all endpoints, set to "99". | — | X | — | — | 2 to 99 | 2 |
| OUTAGE_DATA_RETENTION_TIME | Time (in days) after an anticipated outage has completed its duration that the records should be removed from the ANTICIPATED_OUTAGE and ANTICIPATED_OUTAGE_SP tables. | X | — | — | — | 3 to 180 | 10 |
| PSC_TRANSACTION_TIMEOUT | Default transaction timeout in seconds for all OMM request/reply transactions involving power status. Used for all request/reply transactions involving power status checks when an external system such as OMS does not provide | — | — | X | X | (Metering System and Outage Mode specific) | 120 |

OMM Parameter Descriptions Table

| PARAMETER_NAME | PARAMETER_DESCRIPTION | System Level Only | Outage Region | Outage Mode | Metering System | Recommended Values | Default Value |
|---|---|---|---|---|---|---|---|
| RESTORATION_SCOUT_ ENDPOINT_PERCENTAGE | an explicit TransactionTimeout parameter in the request message. Percentage of de-energized endpoints in the Outage Region/Metering System combination for which power status checks will be performed in each execution of the Restoration Scout for the unique Outage Region/ Metering System combination. Ignored if IS_RESTORATION_ SCOUT_ENABLED is set to "N". This parameter is intended to limit or throttle the metering system network load created by proactive restoration checks. It is recommended that this be set high for time-based outage modes and progressively lower for storm-based outage modes with increasing de-energized endpoint thresholds (STORM_MODE_ THRESHOLD). The actual values should also account for the bandwidth and response time capabilities of each metering system. | — | X | X | X | .0001 to 100. | 80 |
| RESTORATION_SCOUT_ EVALUATION_INTERVAL | Interval in seconds at which the Restoration Scout process will wake up to invoke proactive power status checks for unique combinations of Outage Region and Metering System that are due for processing, given its RESTORATION_ SCOUT_EXECUTION_INTERVAL. | X | — | — | — | 180 to 600 | 300 |
| RESTORATION_SCOUT_ EXECUTION_INTERVAL | Interval in seconds at which the Restoration Scout will perform proactive power status checks for each unique Outage Region/Metering System combination. | — | X | X | X | 180 to 86,400 | 900 |
| RESTORATION_SCOUT_ EXPIRE_MINUTES | Time in minutes after which it should be assumed that the process lock is stale and another instance should be allowed to release the lock and proceed with periodic processing. | X | — | — | — | 15 to 300 | 60 |
| RVA_TRANSACTION_ COMPLETION_CHECK_ INTERVAL | Time period in seconds that USC PSC Adapter will wait between successive checks for completed RVA transactions. Applies only to Cellnet 1-Way metering system. Keep low to ensure low latency in processing pending requests. | X | — | — | — | 10 to 600 | 30 |
| SEND_ALL_LG_ EVENTS_TO_OMS | Send all last-gasps for endpoints as unsolicited messages to OMS. If set to "Y", no filtering for anticipated or known outages is done. Ignored if IS_OMS_INTEGRATION_ENABLED is set to "N". | — | X | X | X | Y or N | N |
| SEND_ALL_PU_ EVENTS_TO_OMS | Send all power-ups for endpoints as unsolicited messages to OMS. If set to "Y", no filtering for anticipated or known outages is done. Ignored if IS_OMS_INTEGRATION_ENABLED IS SET TO "N". | — | X | X | X | Y or N | N |
| SIMULTANEOUS_ ENDPOINT_ EVENT_THRESHOLD | Number of simultaneous confirmed endpoint outage messages across multiple transformers having a common nearest source side protective device required to infer transformer level outages. Ignored if "INFER_OUTAGE_AT_ DISTRIBUTION_TRANSFORMER is set to "N". | — | X | X | X | 2 to 100 | 8 |
| SIMULTANEOUS_ ENDPOINT_ EVENT_TIME_WINDOW | Time period in seconds during which multiple confirmed outages or multiple confirmed restorations reported to MDMS by AMI are considered to be "simultaneous". This parameter is | — | — | X | X | 0 to 30 | 6 |

OMM Parameter Descriptions Table

| PARAMETER_NAME | PARAMETER_DESCRIPTION | System Level Only | Outage Region | Outage Mode | Metering System | Recommended Values | Default Value |
|---|---|---|---|---|---|---|---|
| | intended to account for drift in the time clocks of various distributed devices and should be set as low as possible to avoid false positive indications of simultaneous events. | | | | | | |
| STORM_MODE_THRESHOLD | Percentage of endpoint outages in a storm-based Outage Region that must be de-energized to enter an Outage Mode based upon storm size. | — | X | X | — | 1 to 99 | 10 |
| TRANSFORMER_EVAL_RETRY_DELAY | Delay in seconds to wait for related outage indications to arrive before starting outage inferencing and/or scoping. Allows time for additional non-momentary outage notifications to arrive, minimizing the likelihood of first-level scoping being required. | — | — | — | X | 0 to 1200 | 120 |
| TRANSFORMER_PSC_MODE | Designates the transformer power status check mode for transformer-level power status check transactions. If set to "Transformer ID, OMM will send Transformer ID to the metering system. If set to "List of Endpoints", OMM will select the endpoints and send them to the metering system. | — | — | — | X | Transformer ID or List of Endpoints | List of Endpoints |
| USC_PSC_ADAPTER_ENABLED | Enable/disable the USC Power Status Check (PSC) Adapter/ Restoration Verification Application (RVA) Adapter. If this parameter is set to "N/A", then the "No" button for this parameter is disabled because the client utility does not use this feature; in addition, the Cellnet USC Power Status Check (PSC) Adapter/Restoration Verification Application (RVA) Adapter will not check periodically for enablement. If this parameter is changed from "N/A" to anything else, a restart of the application server is required before the parameter change will take effect. | X | — | — | — | Y or N or N/A | N |
| USC_PSC_EXPIRE_MINUTES | Time in minutes after which it should be assumed that the process lock is stale and another instance should be allowed to release the lock and proceed with periodic processing. | X | — | — | — | 15 to 300 | 60 |

APPENDIX B

Exemplary Operational Assumptions

In addition to configuration parameters, the following assumptions and conventions define the behavior of the outage management module in the exemplary embodiment:
1. A Distribution Transformer may have End Points with both AMI and non-AMI meters.
2. There may be meters from multiple AMI vendors on a given Distribution Transformer.
3. AMI technologies are such that a fraction of outage alarms and restoration messages may be delayed in getting to MDMS or never received by MDMS. Typically this fraction is significantly larger for outage alarms than for restoration notifications.
4. "Core Data" (data defining the End Points, Distribution transformers, and AMI Network Equipment devices, the mapping of the End Points and AMI Network Equipment devices to Distribution Transformers, the Outage Region in which an End Point's or AMI Network Equipment device's Distribution Transformer exists, the nearest Source Side Protective Device for an End Point or AMI Network Equipment device, the Metering System associated with an End Point or AMI Network Equipment device, and other similar semi-static data and relationships will be initially populated and subsequently maintained through Data Synchronization with the source of record system(s) for the distribution system model and meter assets (e.g., GIS, OMS, CIS, Asset Management, etc.).
5. The utility is responsible for the accuracy of End Point and AMI Network Equipment device to Distribution Transformer associations and for the associations of Distribution Transformers to Outage Regions. These associations are critical to outage scoping, restoration verification and other functions performed by the MDMS OMM.
6. To the extent practical, interfaces processing outage related messages to and from external systems and the MDMS will include provisions to process messages in chronological order, oldest first; however there is no requirement to do so and there is no need to coordinate the chronological processing across multiple interface processes.

7. Priority will be placed on processing incoming outage and restoration messages in as close to real-time as possible to maximize the efficacy of the outage validation and restoration processing.
8. MDMS will infer outages at End Points or Distribution Transformers based on confirmed outage states of other devices and network connectivity relationships (i.e., End Point to Distribution Transformer associations).
9. All outage state information will be persisted and carried over to subsequent MDMS initializations.
10. In the event the MDMS or any utility system is out of service for a period of time, the contents of message queues will be retained and the messages will be processed when the system(s) return to service.

APPENDIX C

Exemplary Configuration GUI for OMM

Configuring OMM Parameters on the Outage Configuration Screens

Figure 7:
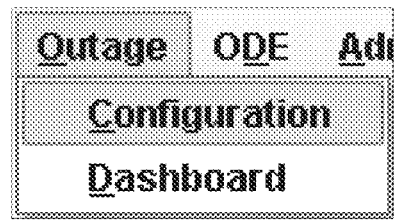
FIG. 7 illustrates an example of a configuration option menu.

The Configuration option on the Outage menu illustrated in FIG. 7 in Navigator is used to set up OMM parameters. Described in the topics below are the Dimensional Editors, System-wide Defaults, and Configurations tabs on the Outage Configuration screen:

The Dimensional Editors tab lets you view and define Outage Regions, Outage Modes, and AMI vendor's metering systems.

The System-wide Defaults tab lets you view and change system-wide defaults for all OMM parameters, except for the mode-level "Mode Determination Rules", which can only be set and viewed on the Configurations tab, as explained in the topics below.

The Configurations tab lets you view and customize parameter values at various levels (Outage Region, Outage Mode, and/or Metering System), depending on the levels (dimensions) at which each parameter can be set.

Following the topics that describe these screen tabs is a topic that describes each of the OMM Parameters.

Dimensional Editors Tab on Outage Configuration Screen

The Dimensional Editors tab on the Outage Configuration screen lets you view and define Outage Regions, Outage Modes, and AMI vendor's metering systems. (The parameter settings for Outage Regions, Outage Modes, and AMI vendor's metering systems can be viewed and defined on the Configurations tab on the Outage Configuration screen.)

Defining Regions

Figure 8:
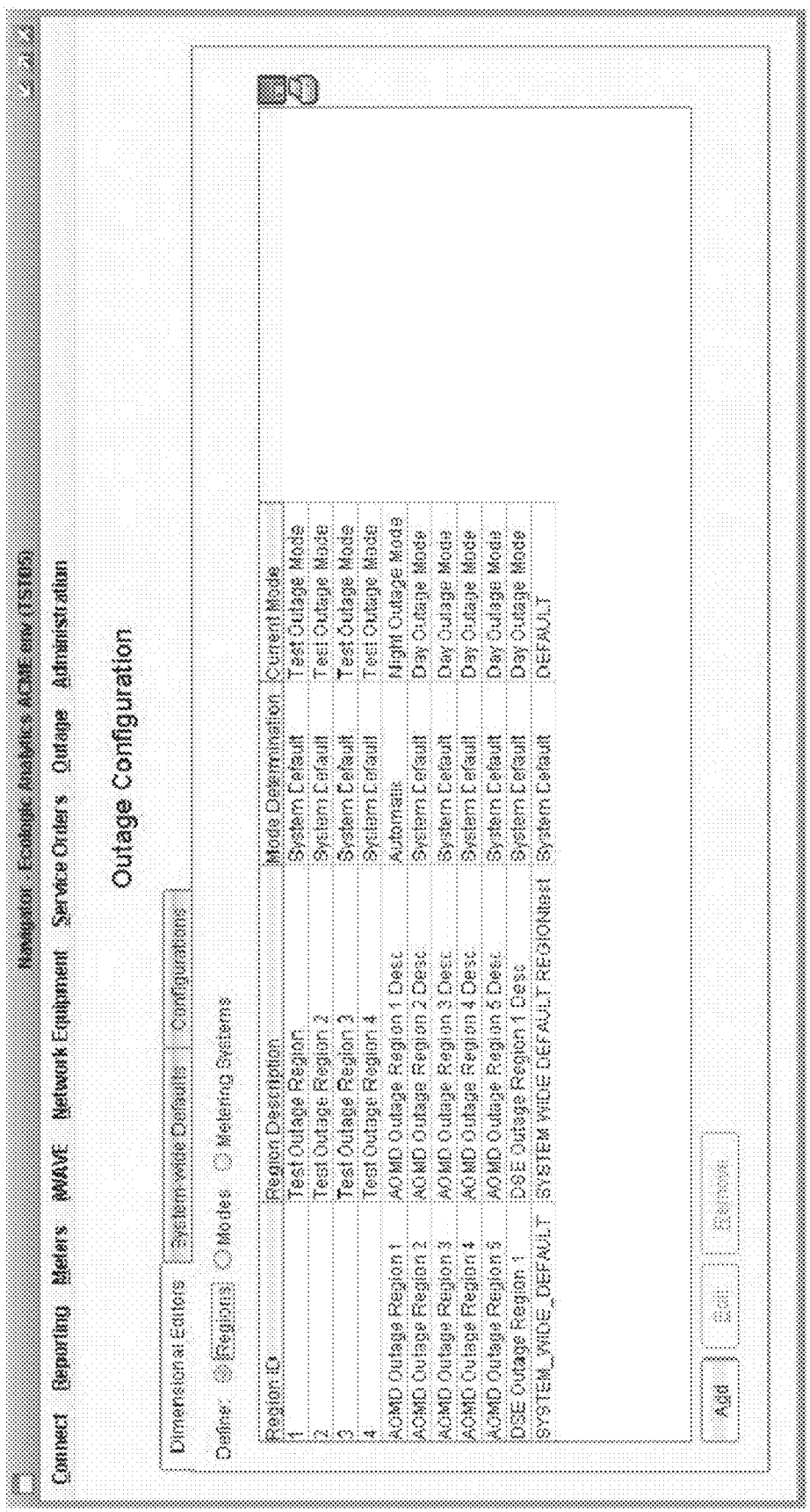
FIG. 8 illustrates an example of a regions screen.

When the Regions radio button is selected on the Dimensional Editors tab on the Outage Configuration screen, the screen shown in FIG. 8 is displayed.

This screen lets you add or edit Outage Regions used in OMM. In addition, it lets you specify the current Outage Mode for an Outage Region if you are running in manual mode determination (as determined by the OMM IS_AUTOMATED_MODE_DETERMINATION_ENABLED parameter).

OMM is configured initially with just one Outage Region, called "SYSTEM_WIDE_DEFAULT". This is the only Outage Region that is currently valid in MDMS 2.6.1, as explained below.

In order to use Outage Regions in OMM, the Electric Distribution System Network Equipment Synchronization process (Interface 50a) or another DSE interface needs to be updated both by Ecologic Analytics and by the client utility to provide the Outage Region for all locations. This value will get populated in the OUTAGE_REGION_ID column in the LOCATION table. Until the OUTAGE_REGION_ID column is populated via a DSE interface, the Outage Synchronization Process (outage_sync.ksh) will set the Outage Region in the OMM tables to "SYSTEM_WIDE_DEFAULT". When the Electric Distribution System Network Equipment Synchronization process (Interface 50a) or other DSE interface is updated to provide Outage Region, then the client utility will use this screen to add Outage Regions.

Figure 9:
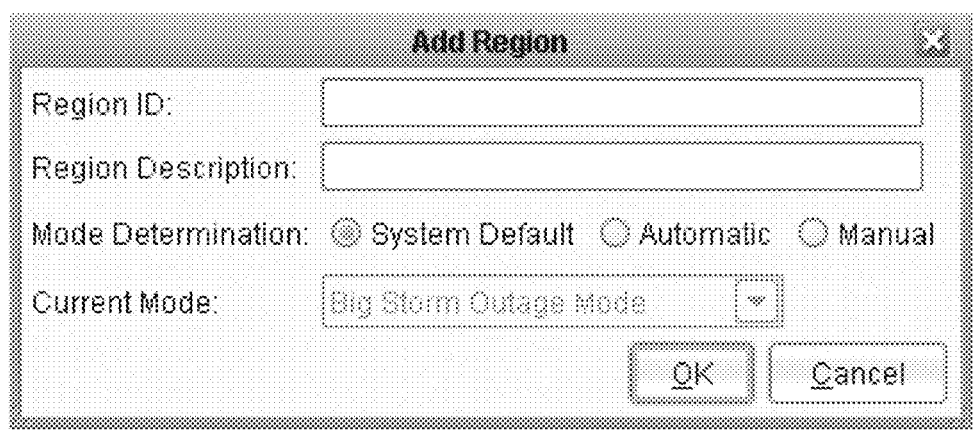
FIG. 9 illustrates an example of an outage region screen.

To add an Outage Region, click on Add to display the Add Region window as illustrated in FIG. 9.

The grayed-out Current Mode that is initially displayed is merely the alphabetically first of your existing Outage Modes.

Type in a Region ID and a Region Description.

Then specify the desired Mode Determination.

If you select System Default, the setting for the IS_AUTOMATED_MODE_DETERMINATION_ENABLED on the System-wide Defaults tab under the Mode Determination category will be used.

If you select Automatic, this will set the IS_AUTOMATED_MODE_DETERMINATION_ENABLED to "Y" as a custom configuration on the Configurations tab under the Mode Determination category for the Outage Region you are adding.

If you select Manual, then the Current Mode drop-down box is enabled and you can manually select the current Outage Mode for the Outage Region you are adding, as explained below.

Then click OK.

Manually Changing the Current Outage Mode

Figure 10:
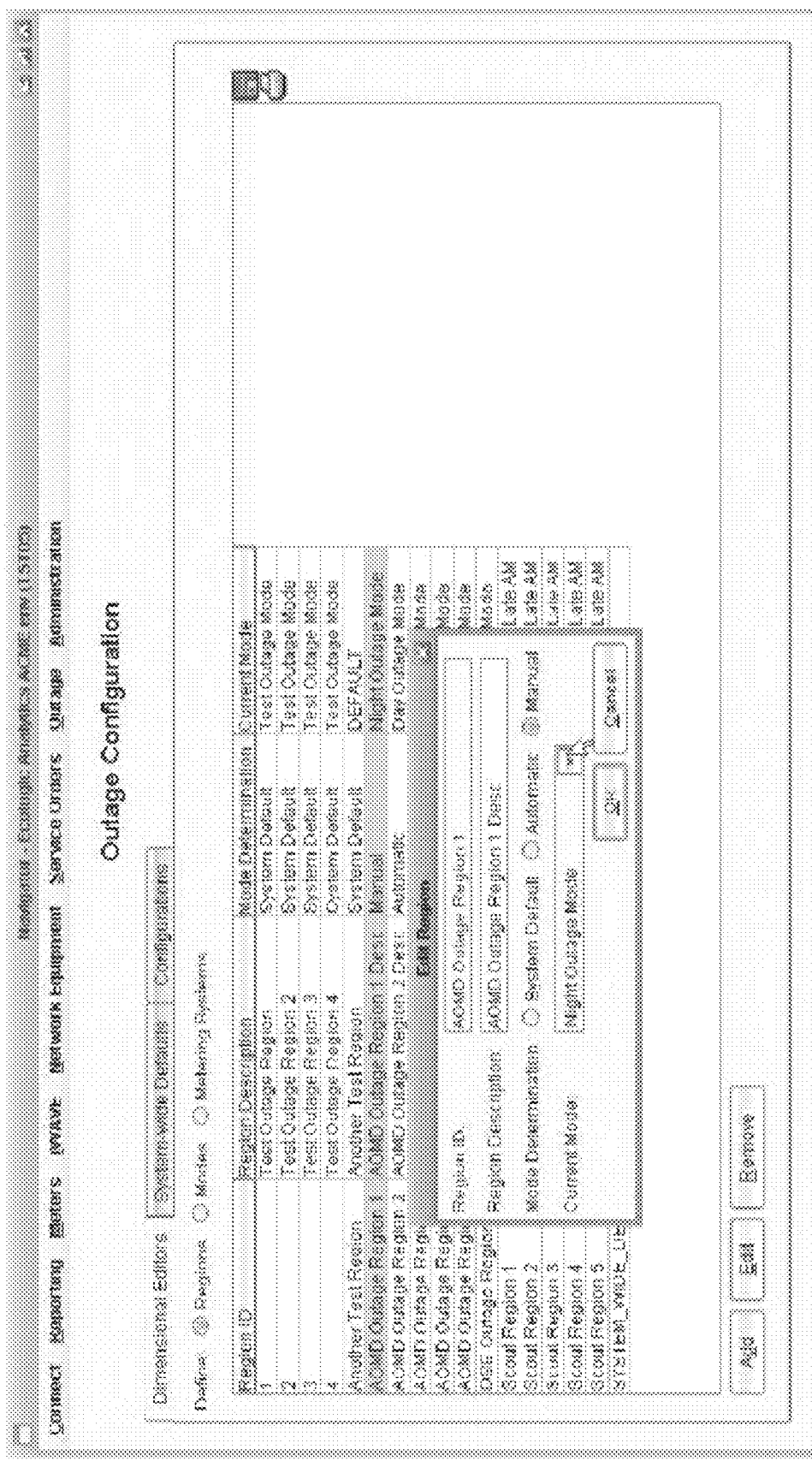
FIG. 10 illustrates an example of an outage mode change screen.

To manually change an Outage Mode, highlight the desired region (its Mode Determination should be Manual) and click on Edit to display the Edit Region window as illustrated in FIG. 10.

Figure 11:
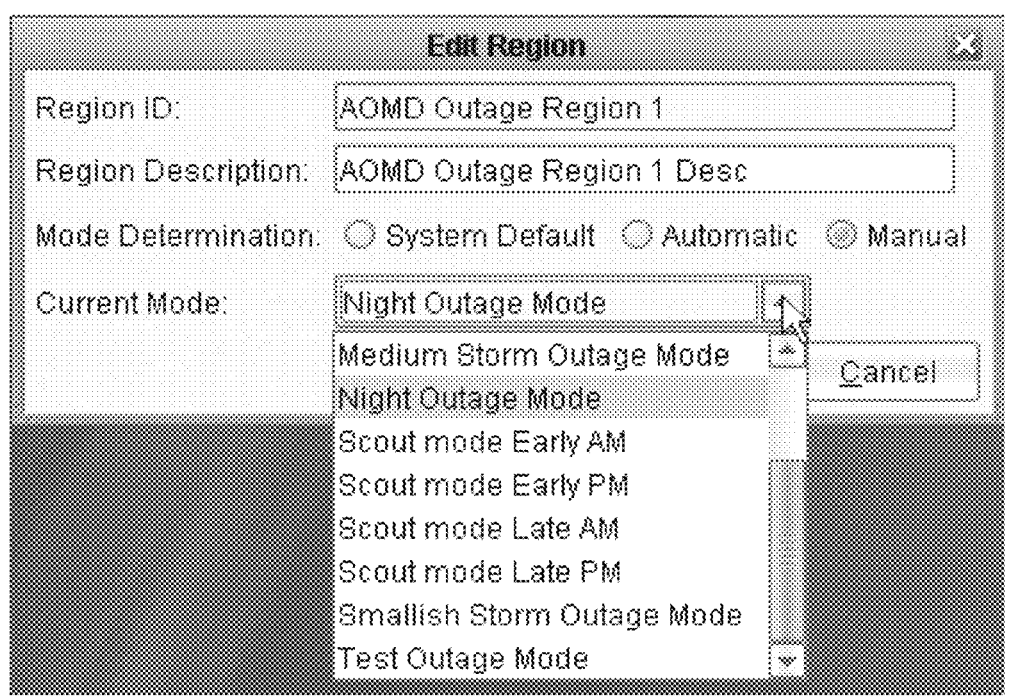
FIG. 11 illustrates an example of an edit region window.

On the Edit Region window, select the desired Outage Mode from the Current Mode drop-down list. (The modes that appear on this drop-down list, with the exception of the "DEFAULT" mode, are defined by the client utility, as explained in the next topic.) See FIG. 11.

Then click OK to set the current Outage Mode for the selected region.

Defining Modes

Figure 12:
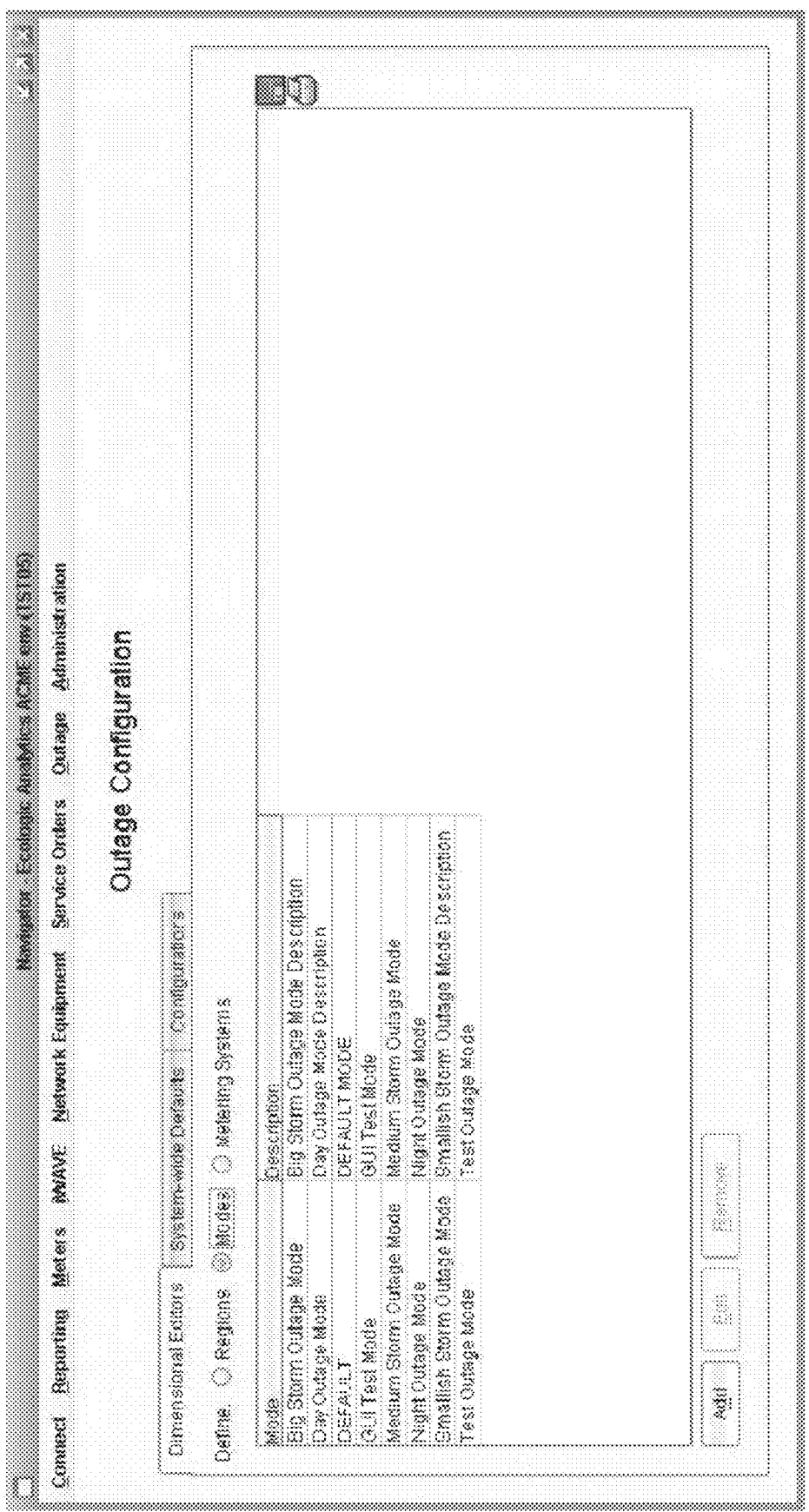
FIG. 12 illustrates an example of a defining modes screen.

When the Modes radio button is selected on the Dimensional Editors tab on the Outage Configuration screen, the screen shown in FIG. 12 is displayed.

This screen lets you add or edit Outage Modes used in OMM.

OMM is configured initially with just one Outage Mode, called "DEFAULT". Once the client utility adds its desired Outage Modes, the DEFAULT Outage Mode should be deleted.

Figure 13:
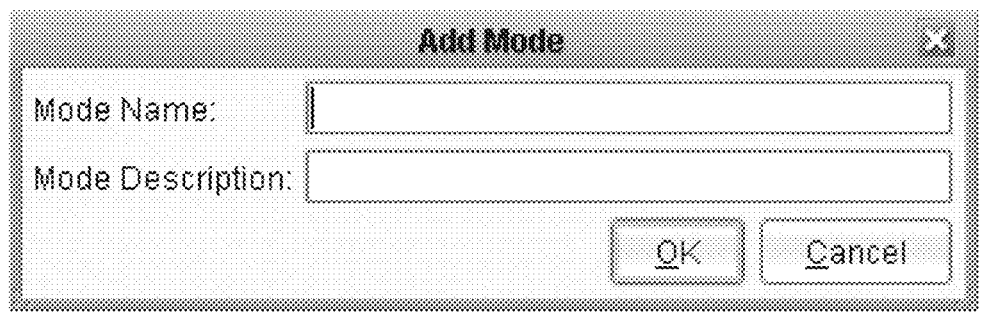
FIG. 13 illustrates an example of an outage mode screen.

To add an Outage Mode, click on Add to display the Add Mode window as illustrated in FIG. 13.

Type in a Mode Name and a Mode Description. It's a good idea to include wording that indicates whether the mode is time-based or storm-based. (For a description of how these two types of outage modes are used, see the Automated Outage Mode Determination (AOMD) Process topic under OMM Components later in this guide.) Then click on OK.

Once you've created modes, you need to define mode determination rules (which specify whether a mode is time-based or storm-based, along with either a start time or storm threshold). These can be specified either at the mode level applicable across all regions, or at the region level. See the Specifying Mode Determination Rules topic under Specifying Mode Determination Rules under Configurations Tab on Outage Configuration Screen below for specifics on how to these values.

To edit or remove an existing mode, highlight the mode and click on Edit or Remove.

Defining Metering Systems

Figure 14:
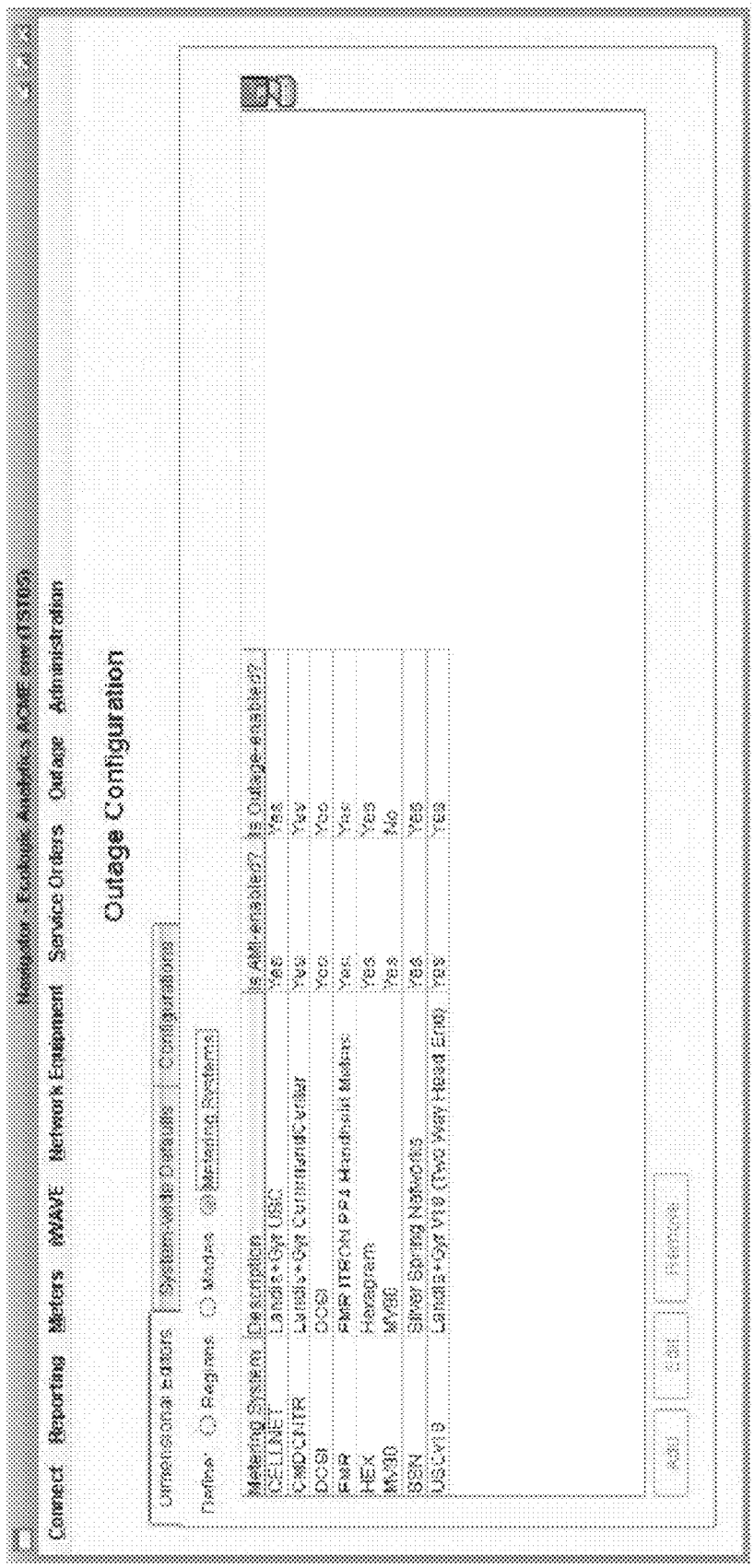
FIG. 14 illustrates an example of a defining metering systems screen.

When the Metering Systems radio button is selected on the Dimensional Editors tab on the Outage Configuration screen, the screen shown in FIG. 14 is displayed.

This screen displays all of the external metering systems defined in the MR_PROVIDER table and lets you Outage-enable any metering system. (When you Outage-enable a meter, a row is created in the METERING_SYSTEMS table.) You can also Outage-disable a metering system (thereby removing the row in the METERING_SYSTEM table) as long as there are no dependent service points in the OUTAGE_SERVICE_POINT table. The AMI-enabled status is informational only and cannot be changed.

Figure 15:
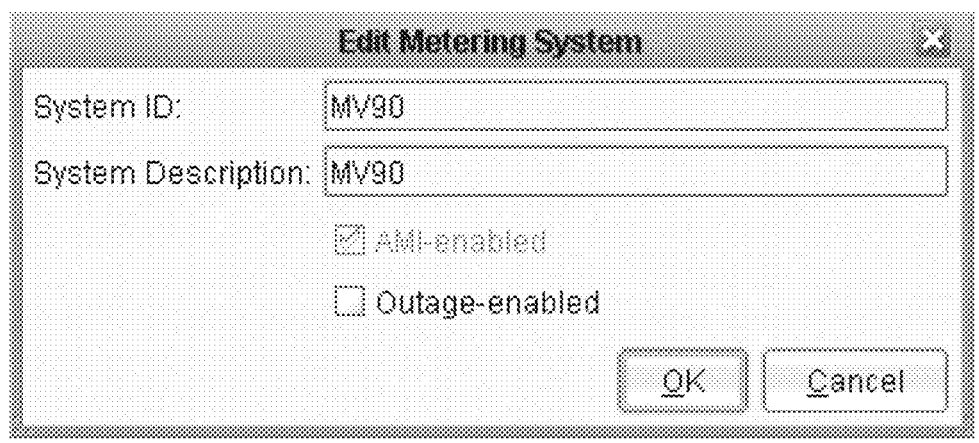
FIG. 15 illustrates an example of a defining metering systems screen.

To change the Outage-enabled status for a metering system, highlight the metering system and click on Edit to display the Edit Metering System window as illustrated in FIG. 15.

The Outage-enabled checkbox is grayed out if the metering system is already Outage-enabled and has records in the OMM system. Check or uncheck the box as appropriate and click OK.

System-wide Defaults Tab on Outage Configuration Screen

The System-wide Defaults tab on the Outage Configuration screen lets you view and change system-wide defaults for all OMM parameters. OMM is initially configured with default values for all parameters for these system-wide settings. (There is one exception: the "Mode Determination Rules" that specify whether an outage mode is storm-based or time-based, along with either a storm threshold or a start time; these system-wide defaults can be configured only by the client utility, as explained below.)

Some parameters can be set only at the system-level; these are noted with an "X" in the "System Level" column in the Descriptions of OMM Parameters topic later in this guide.

All system-level default values can be changed by the client utility. In addition, many parameters can also be customized by the client utility at the outage region, outage mode, and/or AMI vendor's metering system levels, as described in the Descriptions of OMM Parameters topic later in this guide as well as under the individual OMM component descriptions in the OMM Components topic later in this guide.

The parameters are grouped into eleven categories:
AMI OSN Processing
CLX/OSN
DEFAULT
Filtering
Mode Determination
Nested Outage Processing
OCDB
Outage Scoping & Restoration
OVE_RE Integration
Power Status Inferencing
Restoration Scout The parameters for each of these categories are displayed on a separate screen, as shown in the topics below.

To change a system-wide default parameter value on any of these screens, type in the desired value or select the appropriate radio button and click Save.

Editing AMI OSN Processing Outage Parameters—System-Wide Defaults

Figure 16:
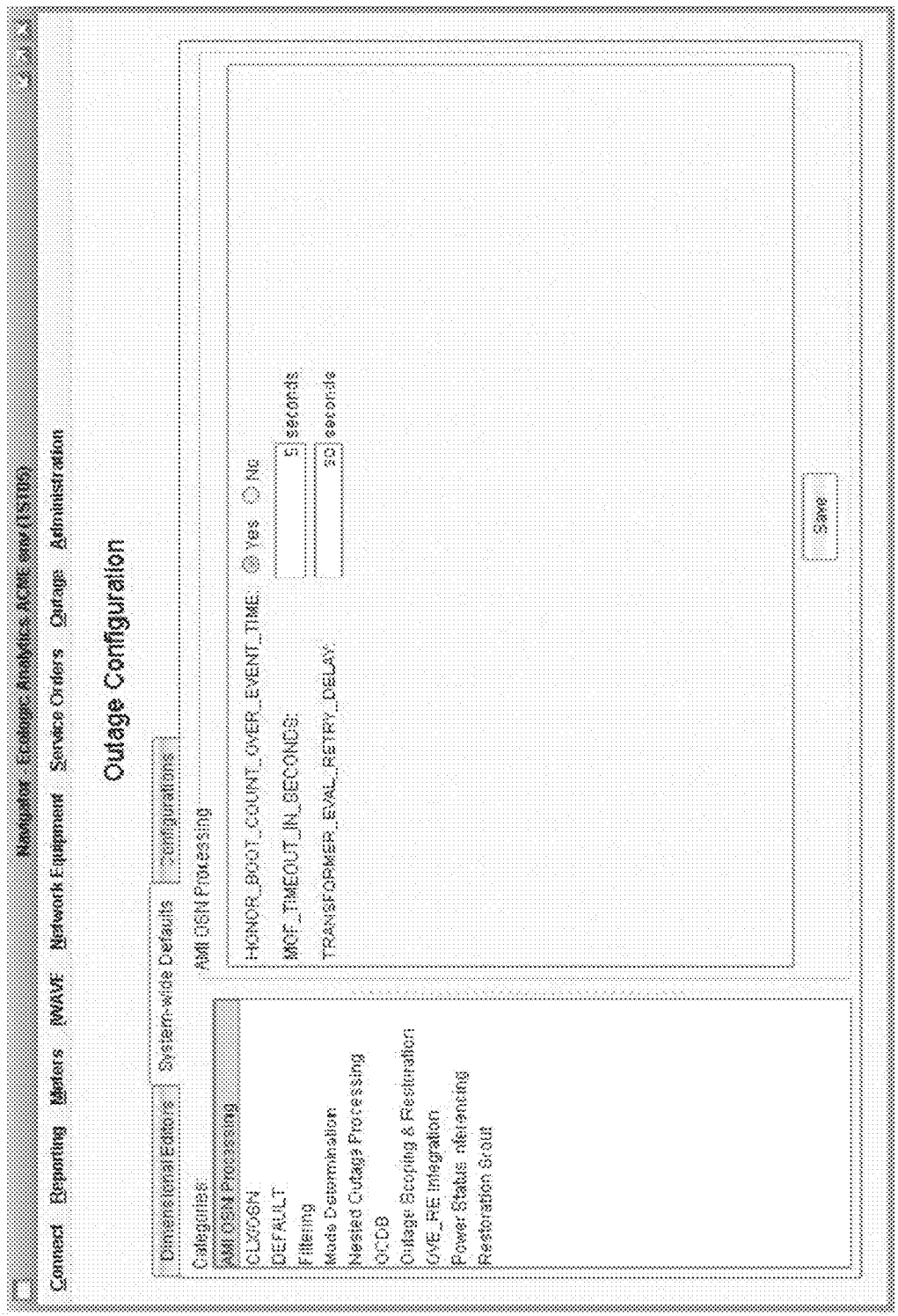
FIG. 16 illustrates an example of an AMI OSN processing screen.

When the AMI OSN Processing category is selected, the settings for several technical OMM parameters are displayed as illustrated in FIG. 16.

Editing CLX/OSN Outage Parameters—System-Wide Defaults

Figure 17:
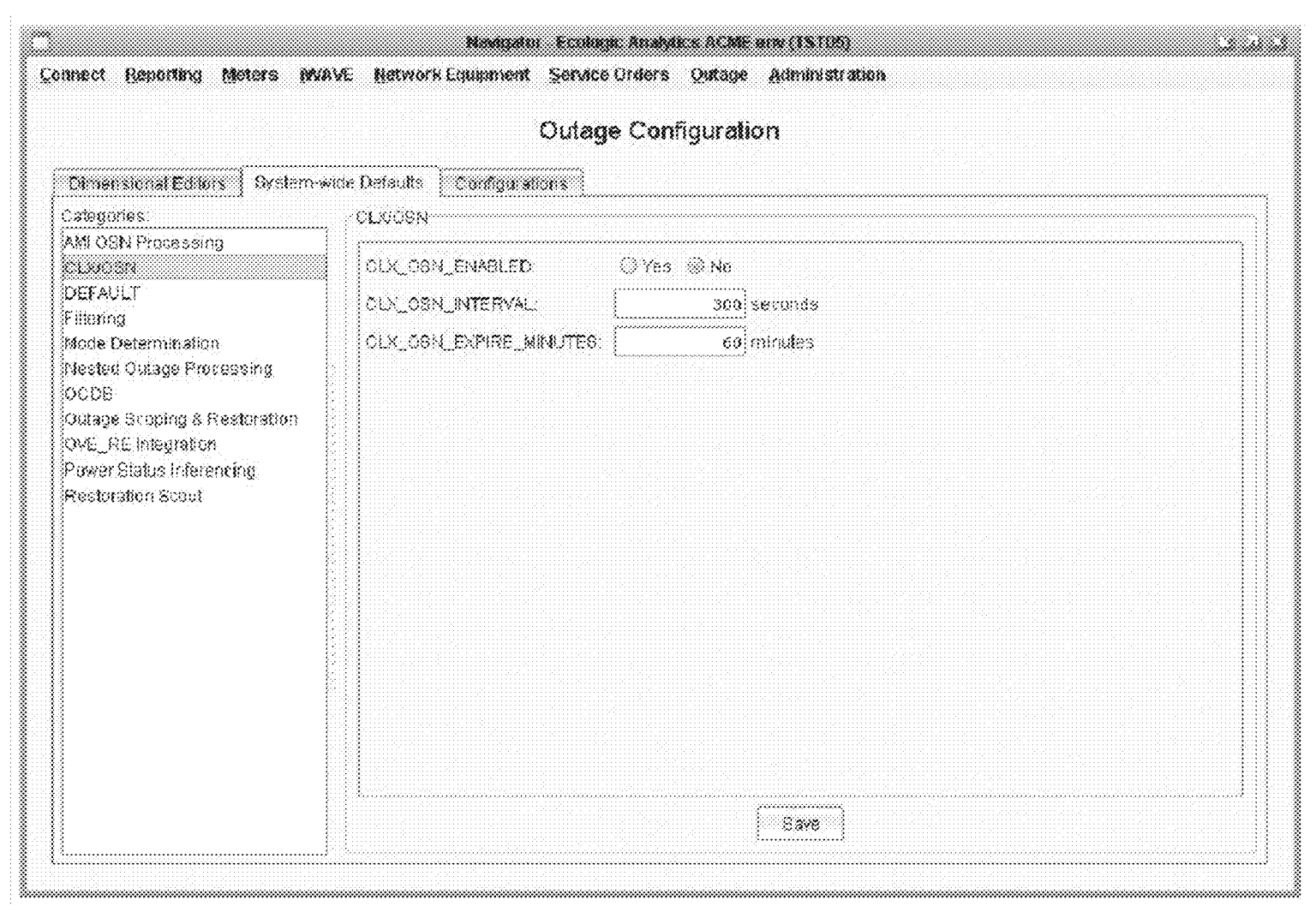

When the CLX/OSN category is selected, the settings for parameters used by the Outage Status Notification Adapter from CLX DDD are displayed as illustrated in FIG. 17.

Editing DEFAULT Outage Parameters—System-Wide Defaults

Figure 18:
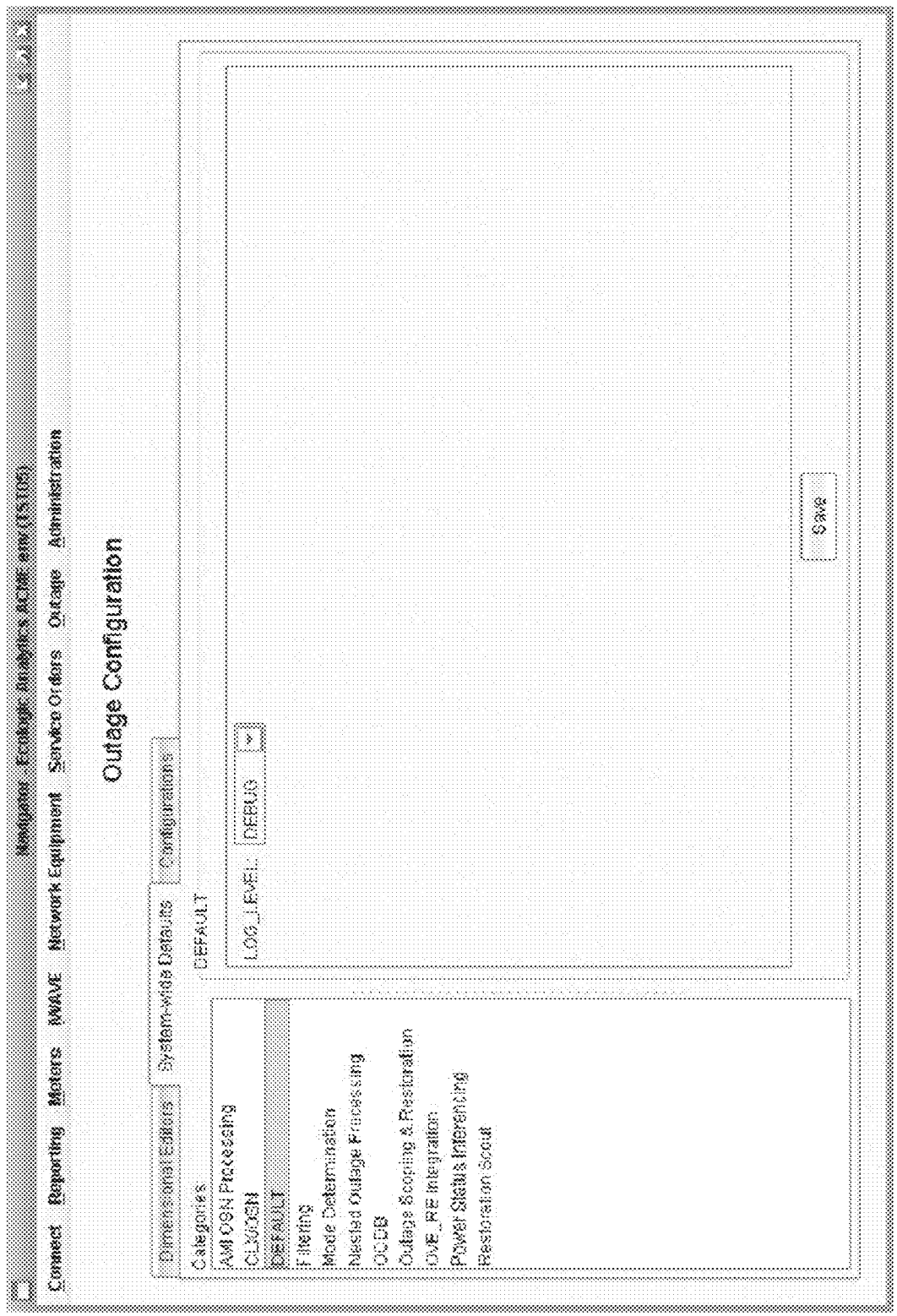
FIG. 18 illustrates an example of a default outage parameter screen.

When the DEFAULT category is selected, the setting for the LOG_LEVEL parameter is displayed as illustrated in FIG. 18.

Editing Filtering Outage Parameters—System-Wide Defaults

Figure 19:
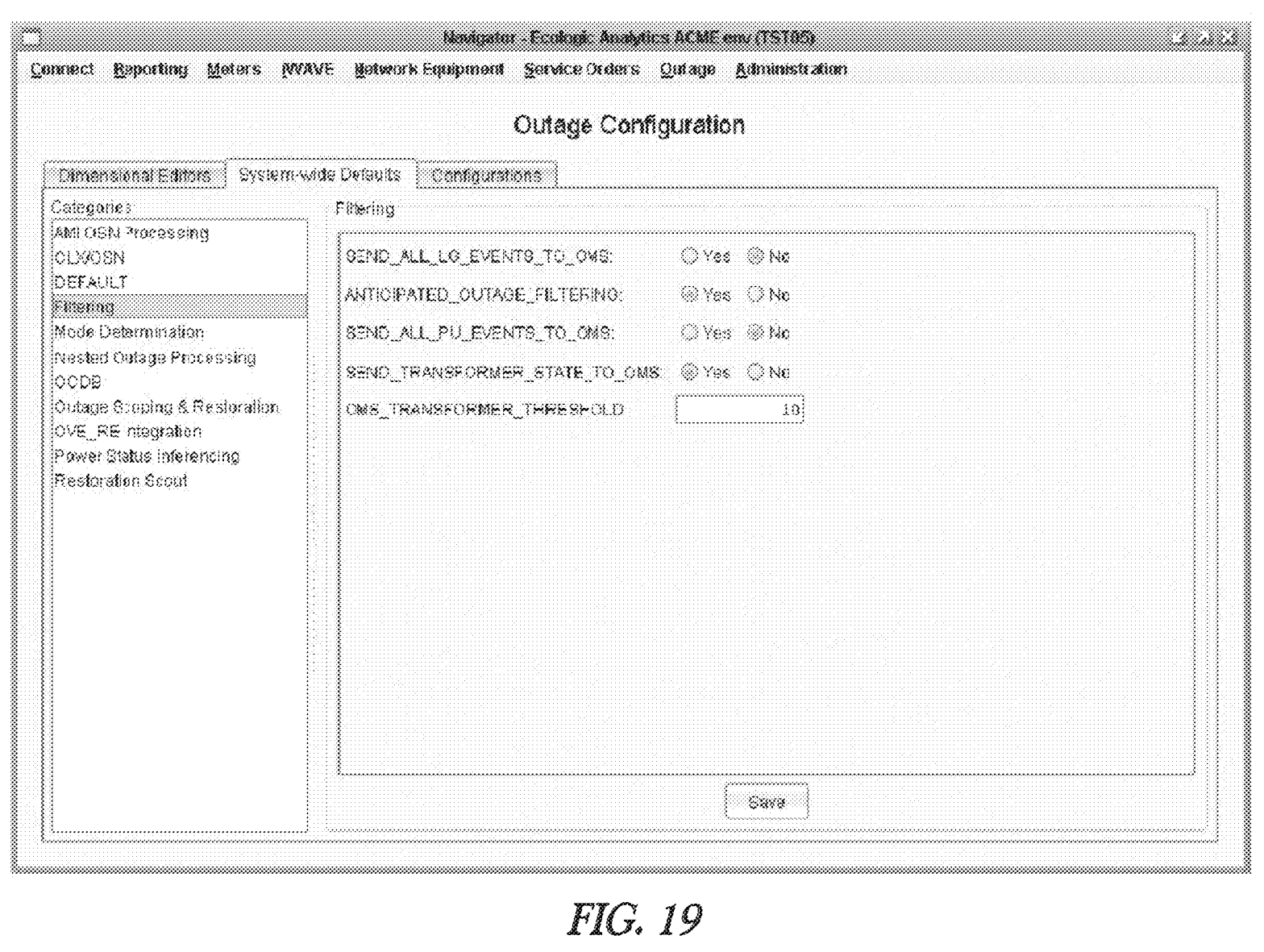

When the Filtering category is selected, the settings for parameters that control how events are filtered during OMM processing as illustrated in FIG. 19.

Editing Mode Determination Outage Parameters—System-Wide Defaults

Figure 20:
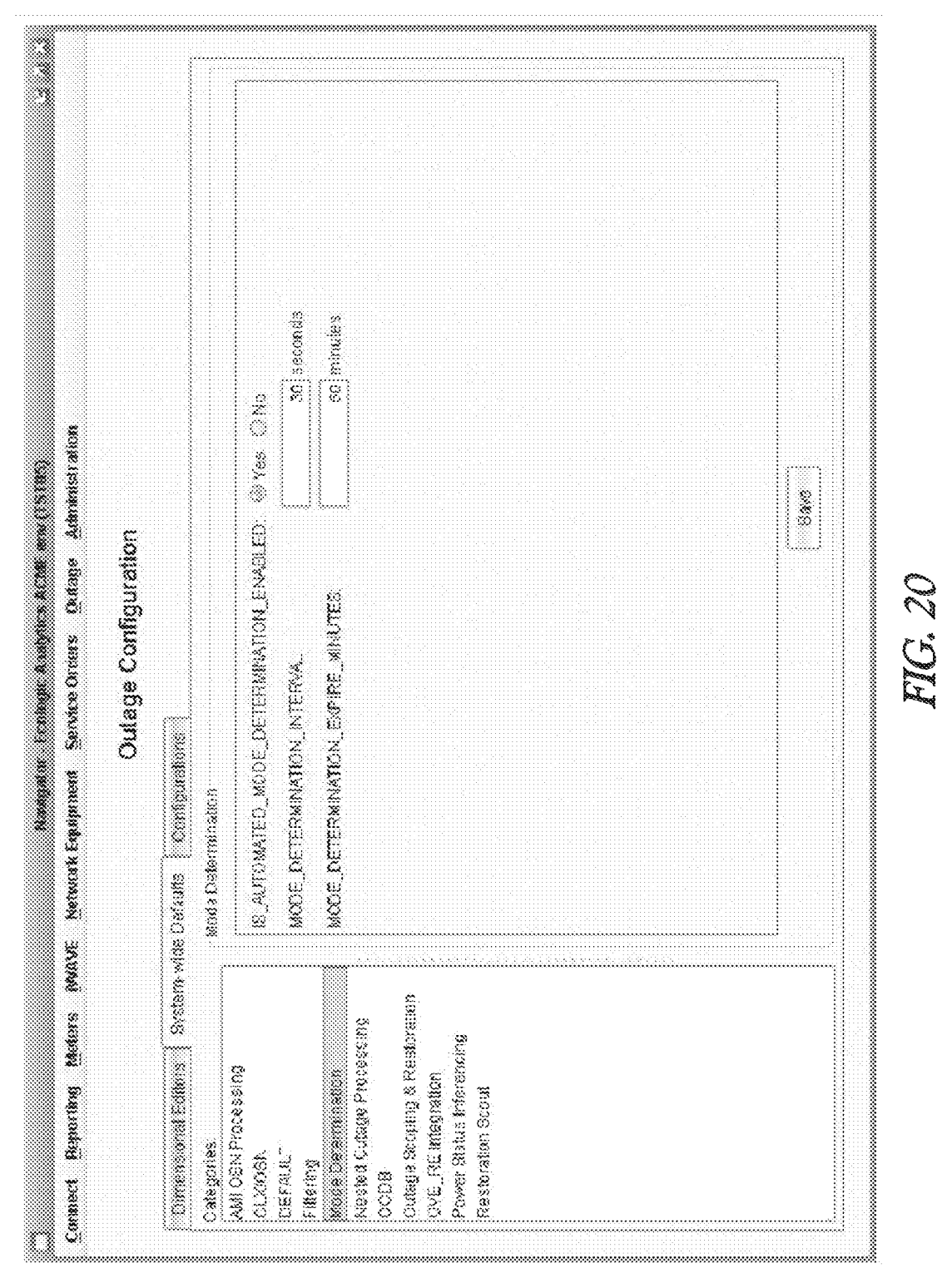

When the Mode Determination category is selected, the settings for parameters used by the Automated Outage Mode Determination (AOMD) process are displayed as shown in FIG. 20, including whether automated mode determination is enabled or not:

This system-level screen does not include the Mode Determination Rules option that appears on the version of this screen on the Configurations tab, as explained in the topic below.

Specifying Mode Determination Rules—System-wide Defaults

There are other mode determination rules that specify whether an outage mode is storm-based or time-based, along with either a storm threshold or a start time. These are properties of a particular outage region and can only be configured on a system level by going to the Configurations tab, selecting the Mode Determination category, selecting Mode Determination Rules, customizing the mode for that region, and then using the Promote Rules To Defaults option to promote those rules to a system-wide default mode.

See the Specifying Mode Determination Rules topic under Specifying Mode Determination Rules under Configurations Tab on Outage Configuration Screen below for specifics on how to specify system-level values for these mode determination rules.

Editing Nested Outage Processing Outage Parameters—System-wide Defaults

Figure 21:
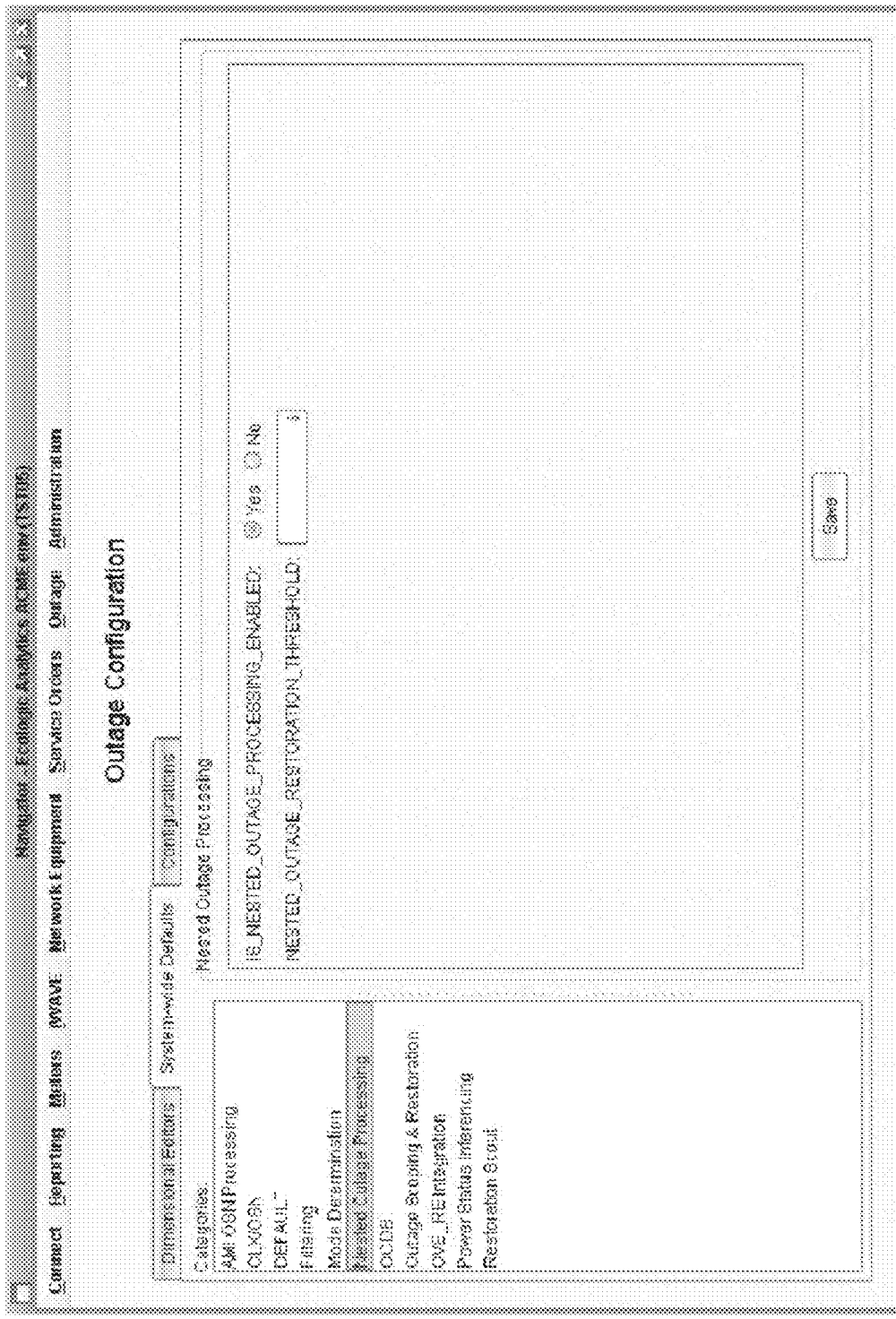
FIG. 21 illustrates an example of a nested outage parameter screen.

When the Nested Outage Processing category is selected, the settings for parameters used by the Nested Outage Detection (NOD) Process are displayed as shown in FIG. 21.

Editing OCDB Outage Parameters—System-wide Defaults

Figure 22:
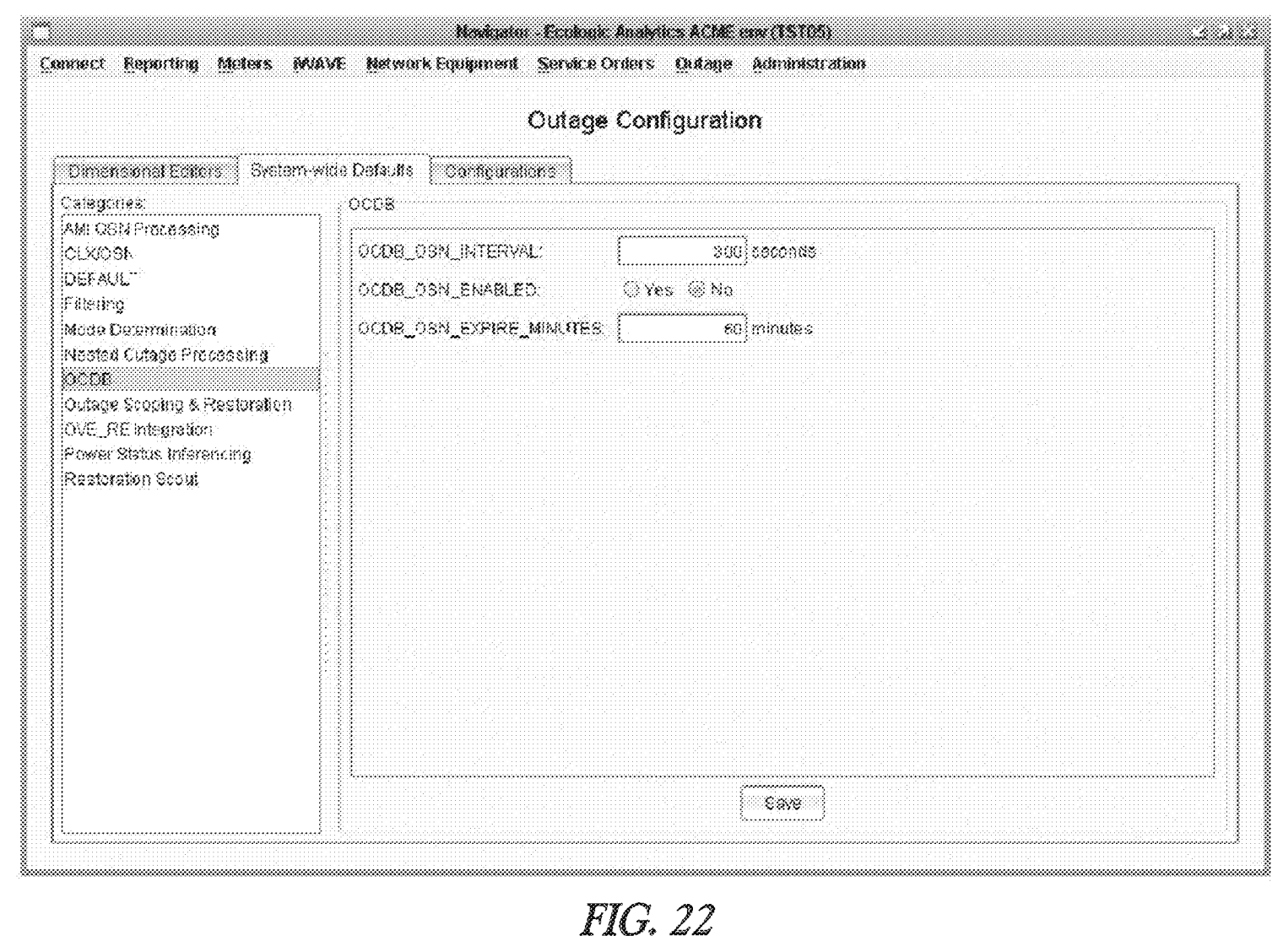

When the OCDB category is selected, the settings for parameters used by the Outage Status Notification Adapter from the Cellnet OCDB are displayed as shown in FIG. 22.

Editing Outage Scoping & Restoration Outage Parameters—System-wide Defaults

Figure 23:
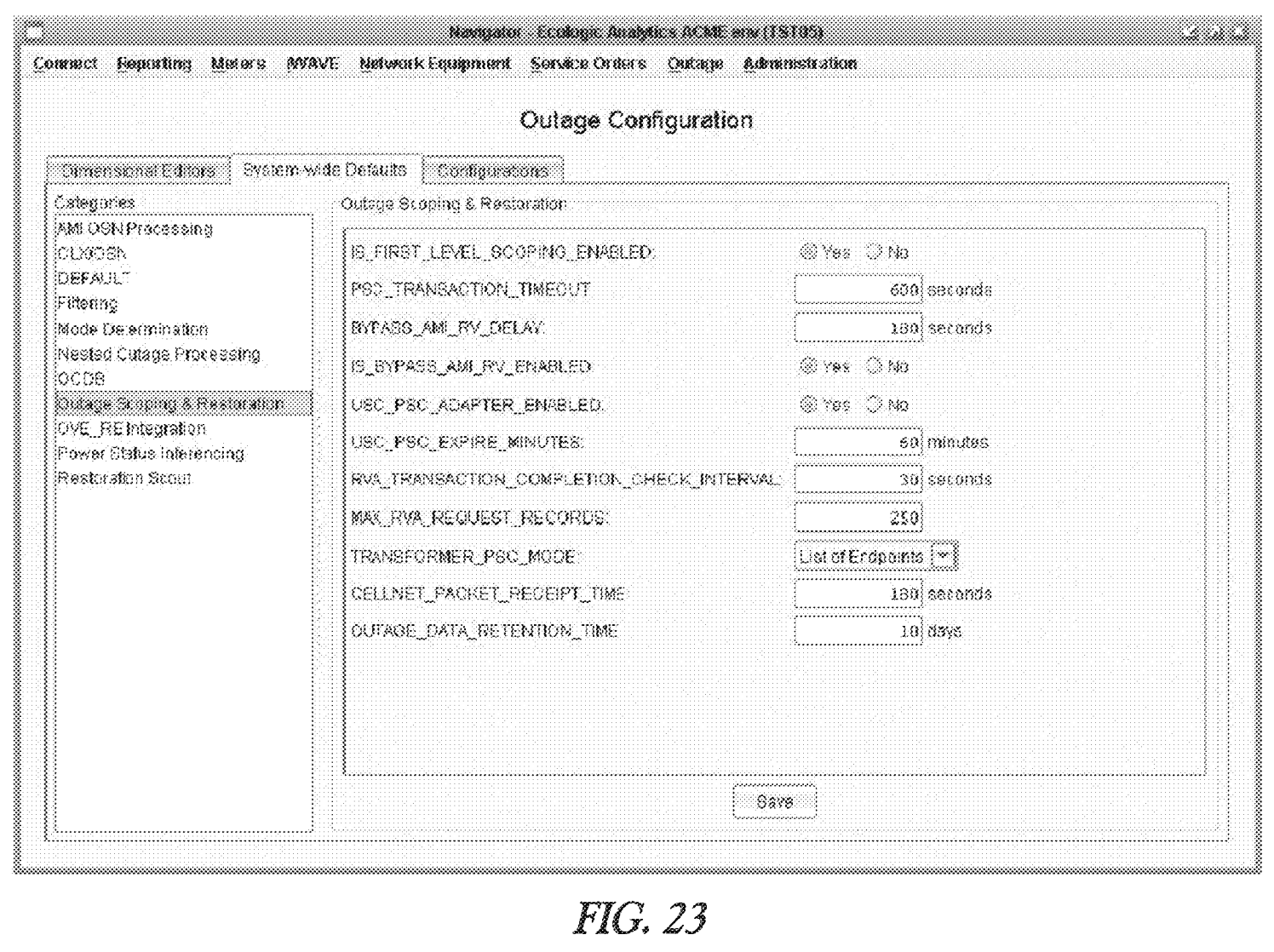

When the Outage Scoping and Restoration category is selected, the settings for various scoping and restoration parameters used by the External Scoping Requests Processor, the First Level Scoping (FLS) Processor, the Anticipated Outage Create/Delete Processor (AOCDP), the Cellnet USC Power Status Check (PSC) Adapter/Restoration Verification Application (RVA) Adapter, the Restoration Verification Processor (RVP), and the Sustained Endpoint Outage Processor (SEOP) are displayed as shown in FIG. 23.

Editing OVE_RE Integration Outage Parameters—System-Wide Defaults

Figure 24:
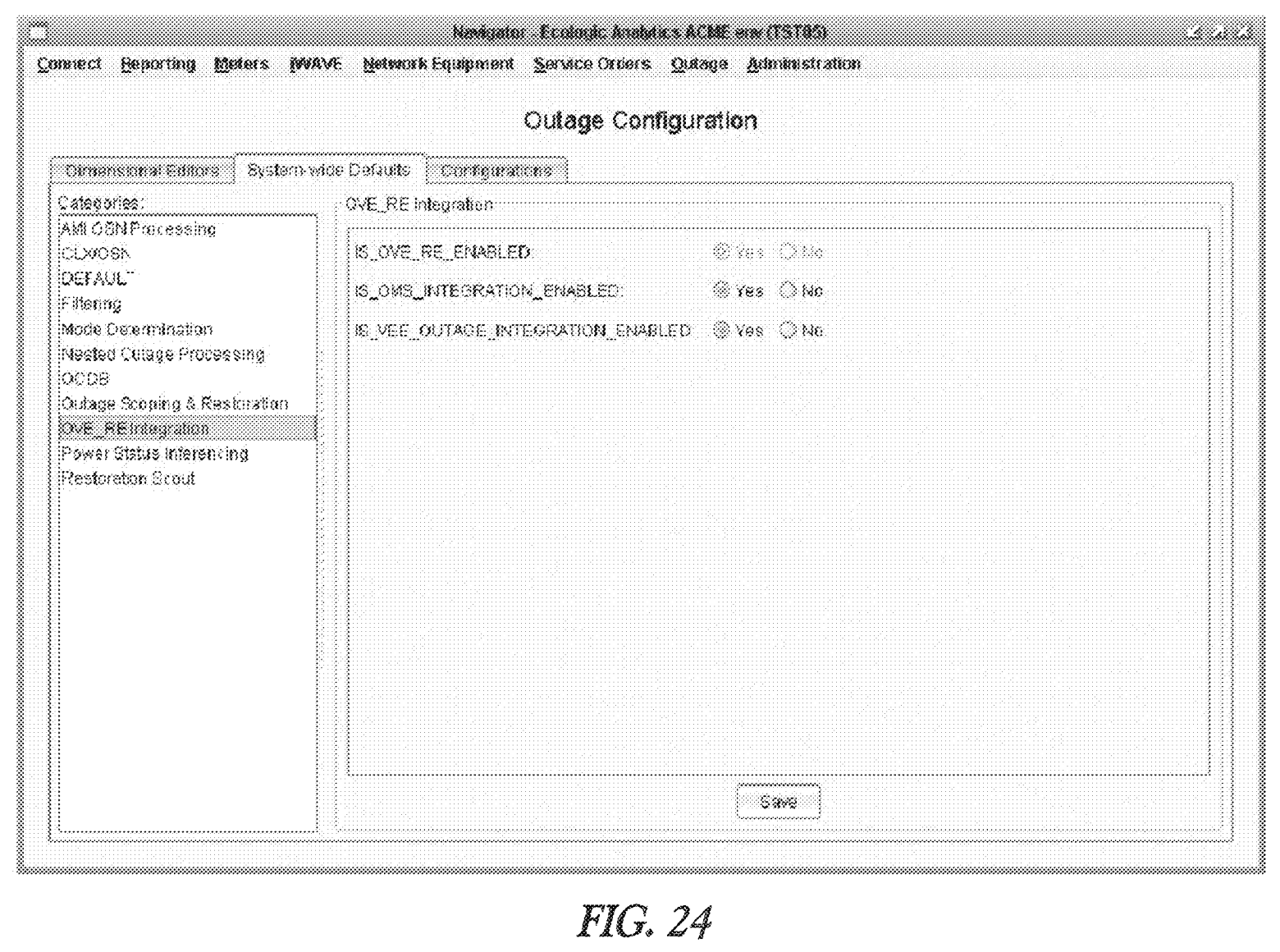

When the OVE_RE Integration category is selected, the settings for general enablement parameters are displayed as shown in FIG. 24. IS_OVE_RE_ENABLED is used by all OMM processes. IS_OMS_INTEGRATION_ENABLED is used by the Automated Outage Mode Determination (AOMD) Process, the Nested Outage Determination (NOD) Process, the OMS OSN Sender Process, the OMS OSN Receipt Process, the Restoration Notification Processor from Metering Systems, the Restoration Verification Processor (RVP), the Sustained Endpoint Outage Processor (SEOP), and the Populate Outage History Process. IS_VEE_ OUTAGE_INTEGRATION_ENABLED is used by the Populate Outage History Process.

The IS_OVE_RE_ENABLED parameter is set to "Yes" and cannot be turned off.

Editing Power Status Inferencing Outage Parameters—System-Wide Defaults

Figure 25:
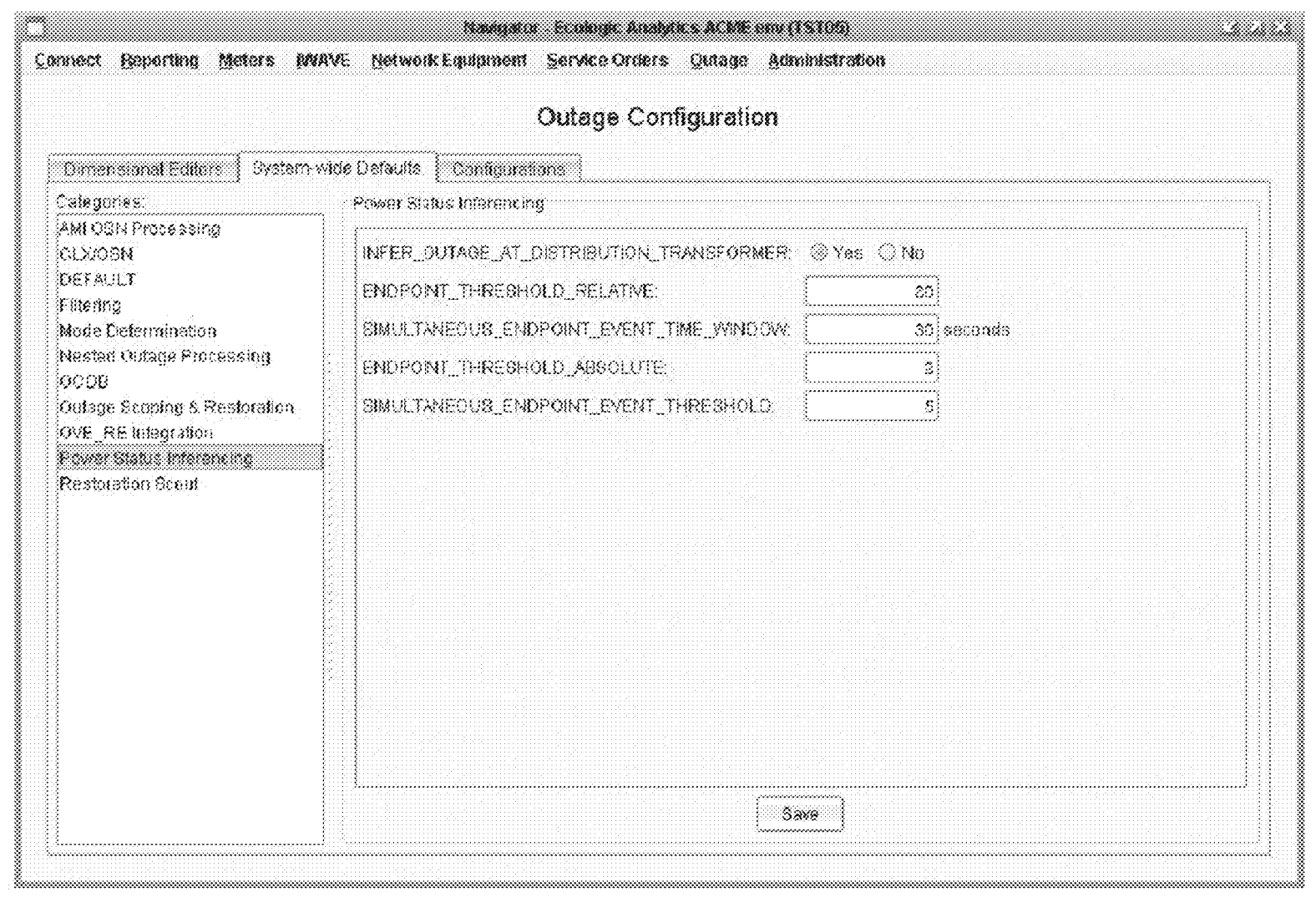

When the Power Status Inferencing category is selected, the settings for parameters used by the Restoration Notification Processor from Metering Systems and the Sustained Endpoint Outage Processor (SEOP) are displayed as shown in FIG. 25.

Editing Restoration Scout Outage Parameters—System-wide Defaults

Figure 26:
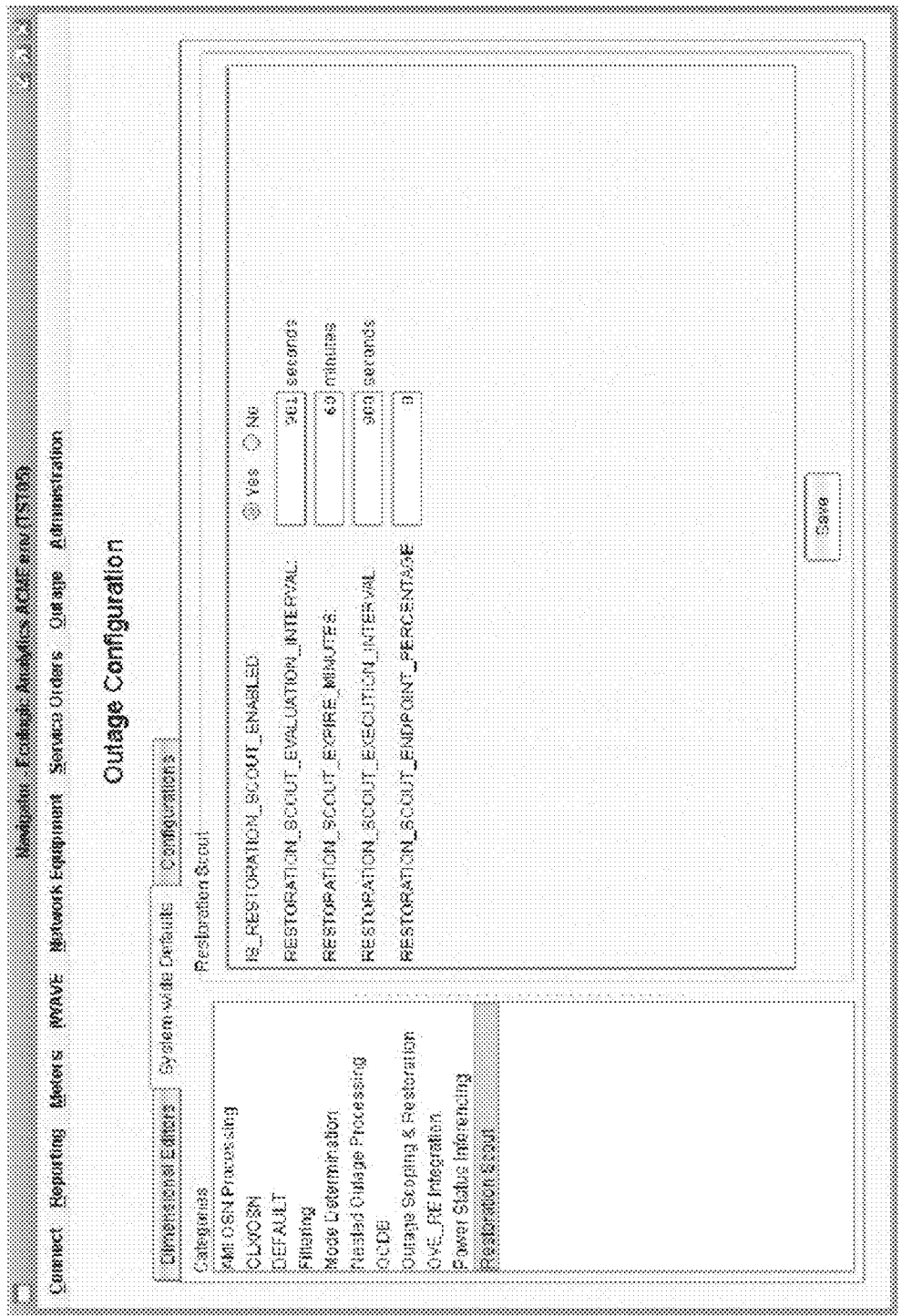
FIG. 26 illustrates an example of a restoration scout screen.

When the Restoration Scout category is selected, the settings for parameters used by the Restoration Scout are displayed as shown in FIG. 26.

Configurations Tab on Outage Configuration Screen

As noted earlier, all OMM parameters have system-level default values. The Configurations tab on the Outage Configuration screen lets you view and customize these parameter values at various levels (Outage Region, Outage Mode, and/or Metering System), depending on the levels (dimensions) at which each parameter can be set (see the Descriptions of OMM Parameters topic later in this guide).

Parameters can also be configured so that they apply to a particular combination of Outage Region, Outage Mode, and/or Metering System, depending on the levels (dimensions) at which each parameter can be set. The configuration screens automatically handle the level or levels at which a parameter can be set, and it is possible to copy existing parameter sets, as explained in the Automatic Handling of Parameter Levels topic below.

The parameters are grouped into the same eleven categories used for system-wide defaults:

AMI OSN Processing
CLX/OSN
DEFAULT
Filtering
Mode Determination
Nested Outage Processing
OCDB
Outage Scoping & Restoration
OVE_RE Integration
Power Status Inferencing
Restoration Scout The parameters for each of these categories are displayed on a separate screen, as shown in the topics below.

In addition, there are mode determination rules that specify whether an outage mode is storm-based or time-based, along with either a storm threshold or a start time. These are properties of each outage region that a client utility sets up, and are set via the Mode Determination Rules option on the Outage Configuration screen for the Mode Determination category. This configuration is included in the topics that follow.

To change a parameter value on any of these screens, type in the desired value or select the appropriate radio button and click Save.

Automatic Handling of Parameter Levels

The topics below contain examples of how the level or levels at which each parameter can be set are handled automatically, as well as how to copy parameter sets:

Metering System Level-Only Parameter Example
Region Level-Only Parameter Example
Multiple-Level Parameter Example
Copying Parameter Sets Metering System Level-Only Parameter Example For example, the HONOR_BOOT_COUNT_OVER_EVENT_TIME parameter is one of a handful of parameters that can be set only at the metering system level.

Figure 27:
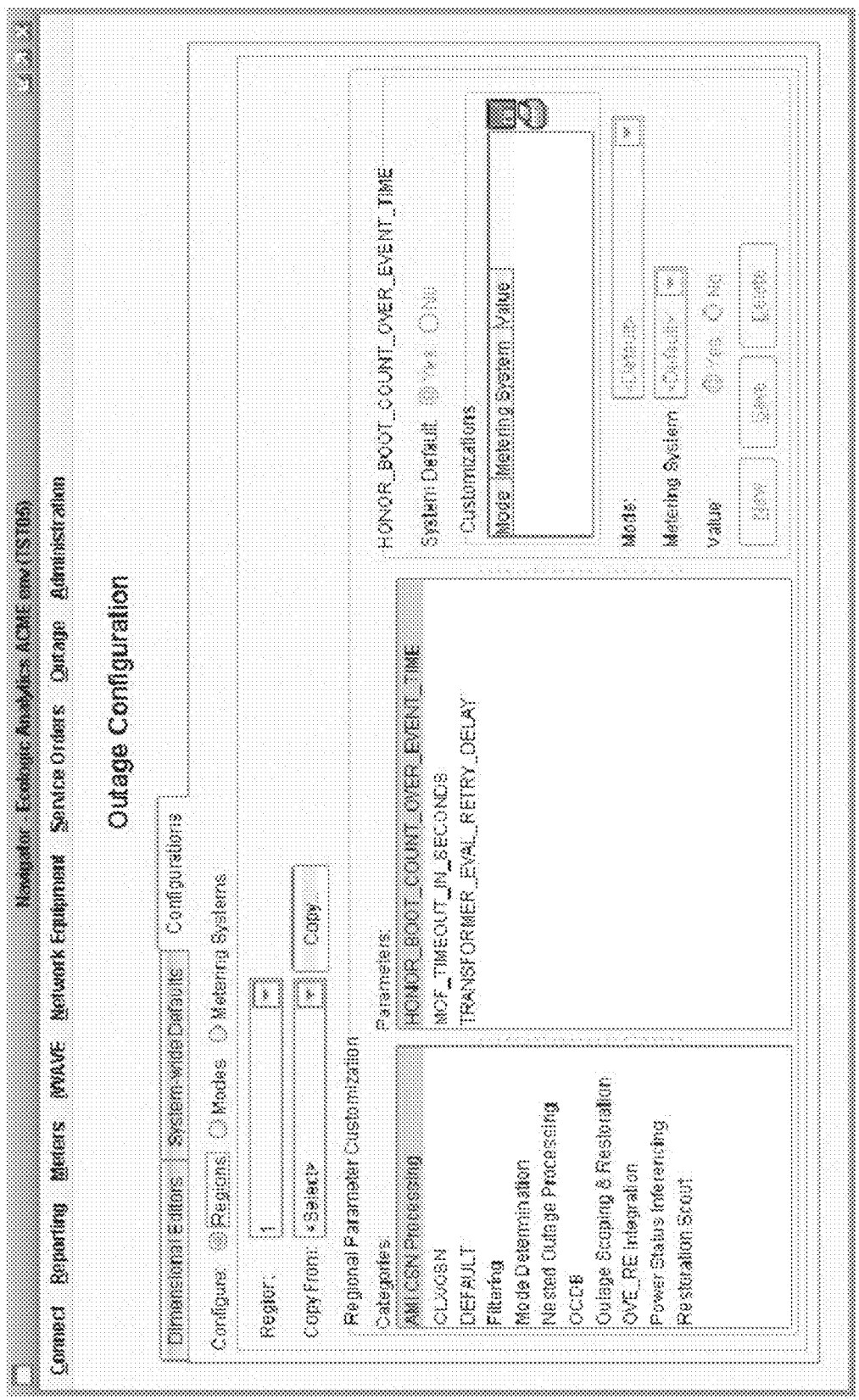
FIG. 27 illustrates an example of a metering system level-only parameter screen.

Because this parameter can be set only at the metering system level, all of the customization options on the right side of the screen are grayed out when Configure: Regions is selected, as shown in FIG. 27; only the system-level default value is shown, and it is grayed out because it cannot be changed here.

Figure 28:
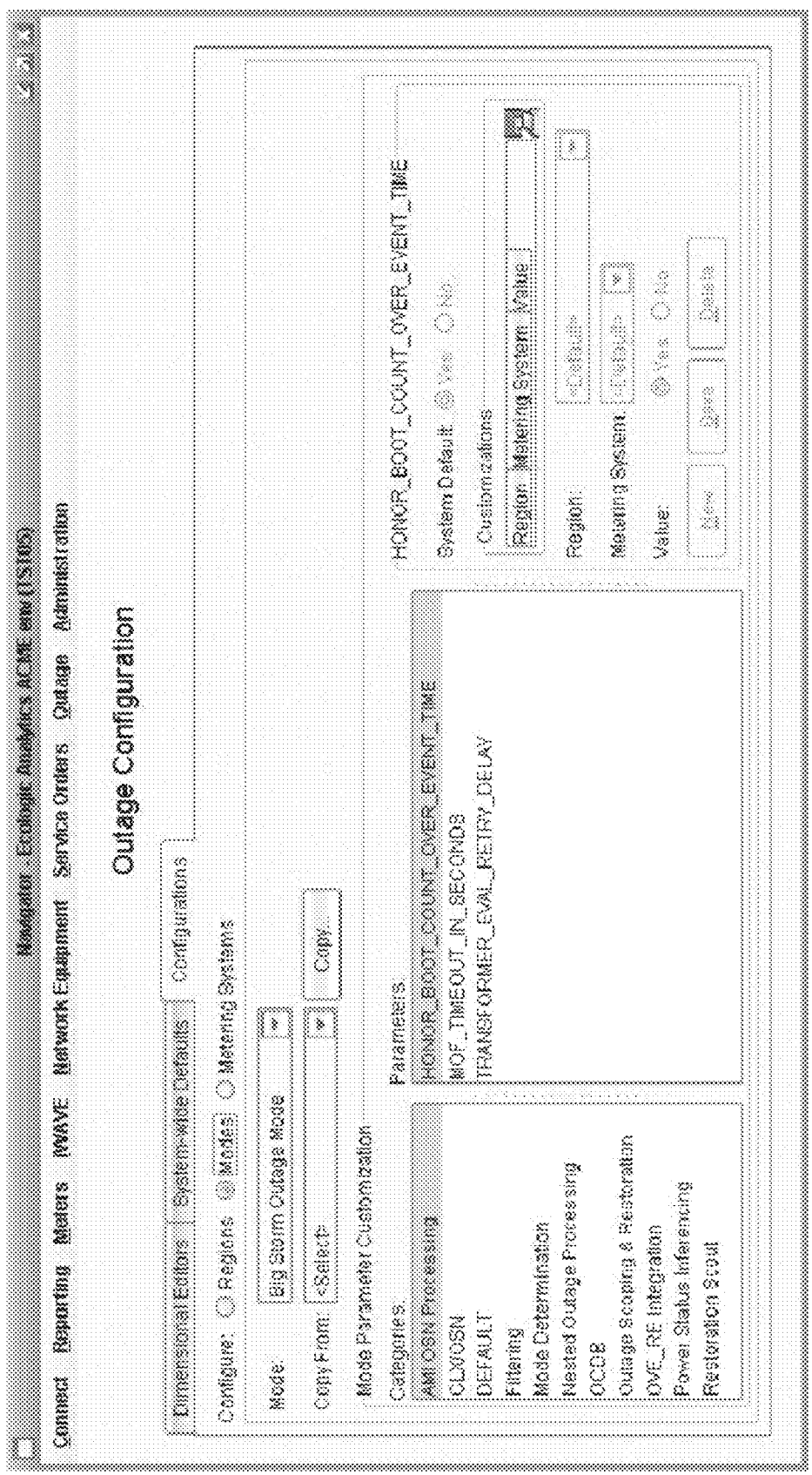
FIG. 28 illustrates an example of a metering system level-only parameter screen.

Because this parameter can be set only at the metering system level, all of the customization options on the right side of the screen are also grayed out when Configure: Modes is selected, as shown in FIG. 28.

Figure 29:
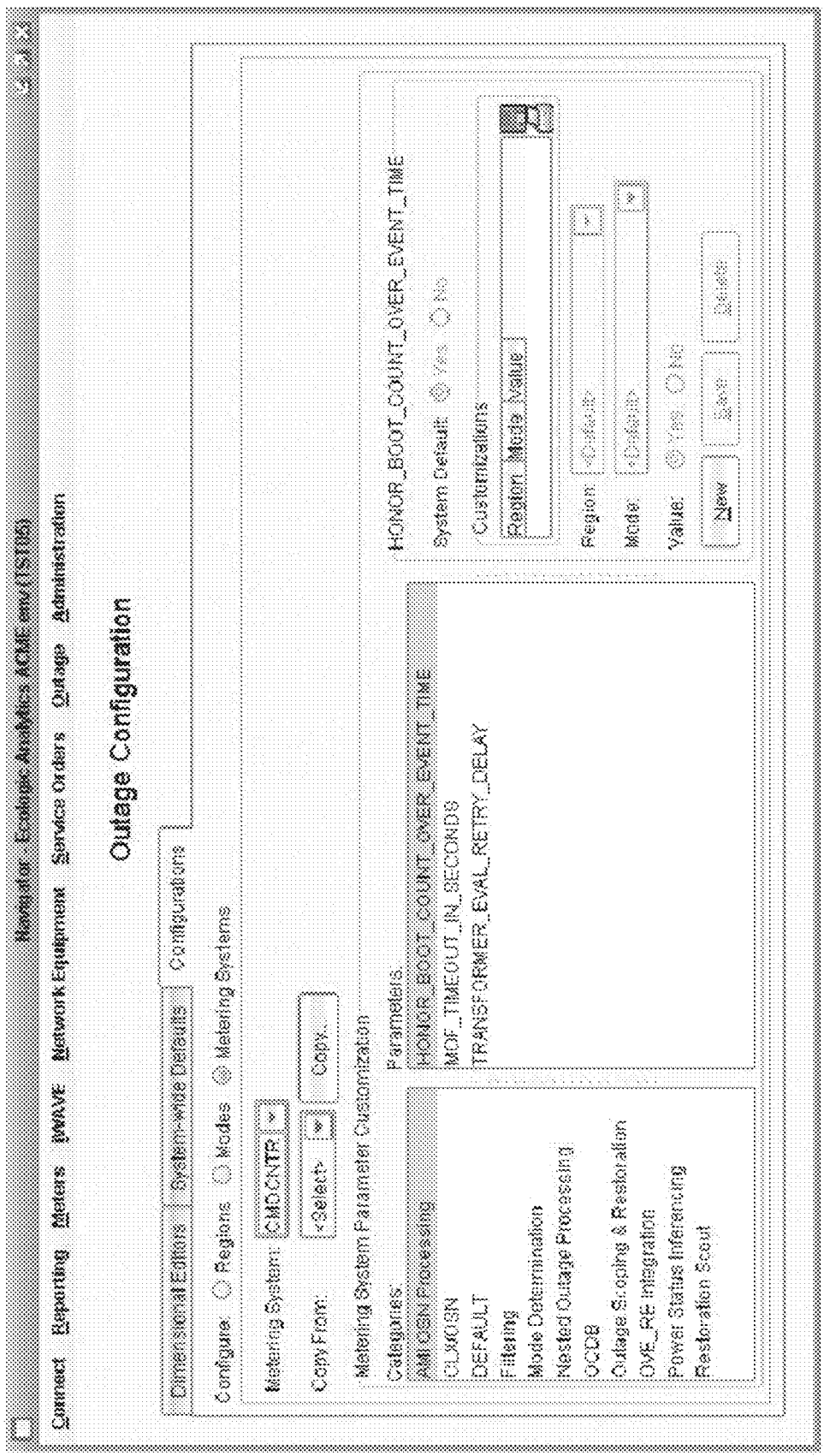
FIG. 29 illustrates an example of a metering system level-only parameter screen.

Because this parameter is configurable at the metering system level, the New option is not grayed out when Configure: Metering Systems is selected. See FIG. 29.

Figure 30:
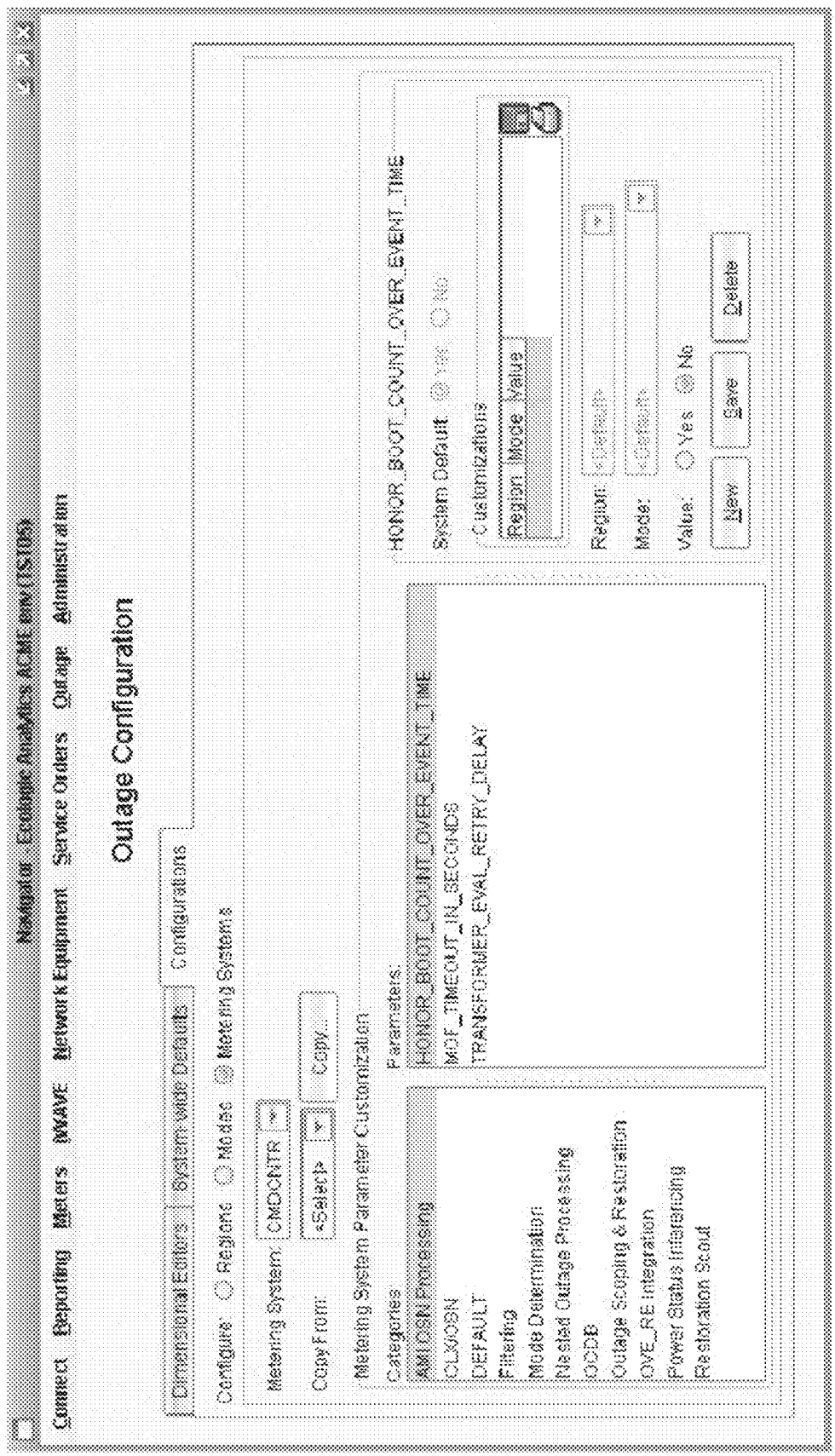
FIG. 30 illustrates an example of a metering system level-only parameter screen.

If you click on New, the first row under "Customizations" is highlighted, and the radio buttons for Value are now enabled, as shown in FIG. 30.

Figure 31:
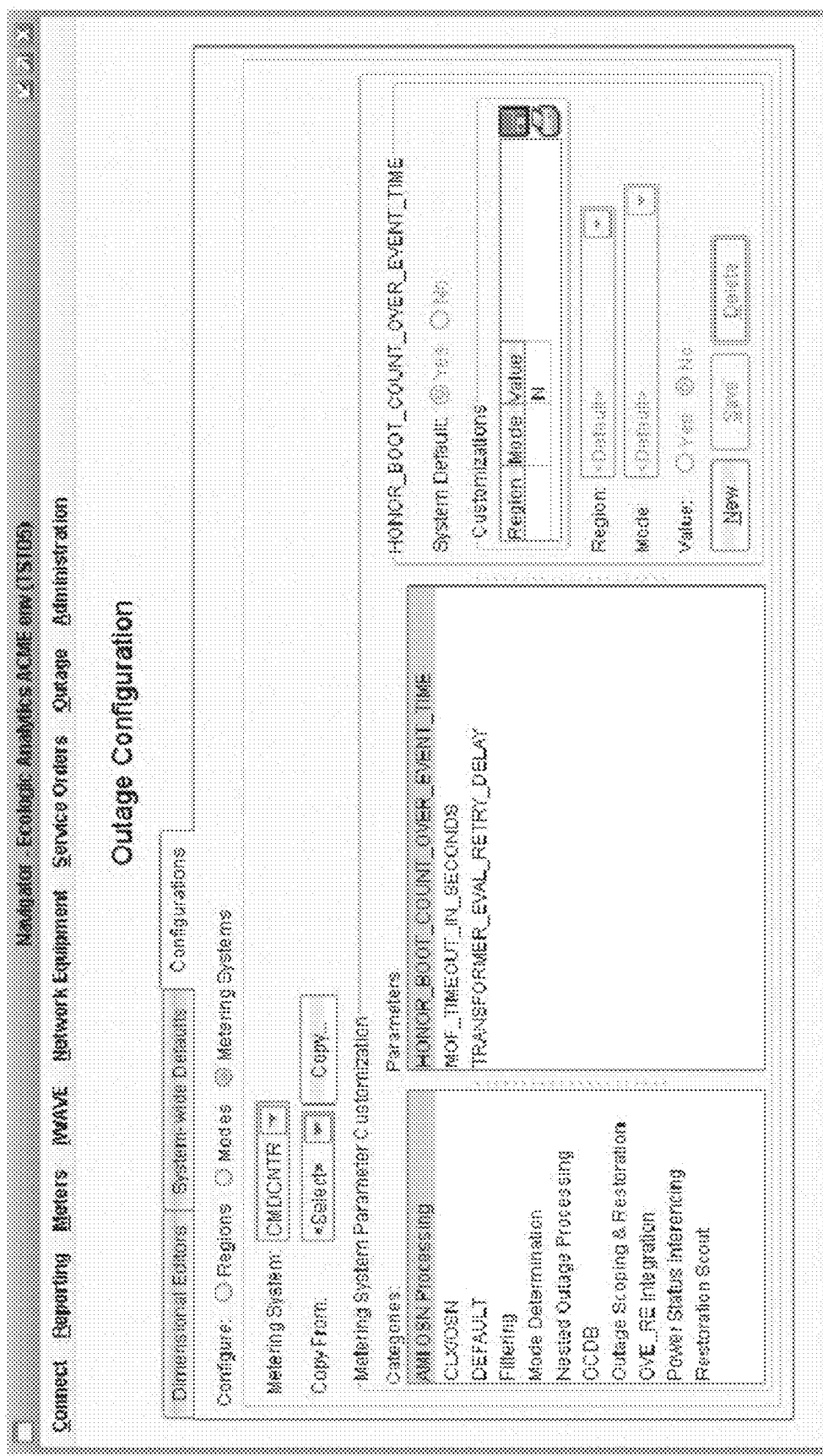
FIG. 31 illustrates an example of a metering system level-only parameter screen.

To set this parameter, select the desired value (as noted above, this parameter can only be set at the metering system level, so the Region and Mode drop-downs are disabled) and click Save to save the desired setting. Once you save a setting, it is displayed under "Customizations", as shown in FIG. 31.

Figure 32:
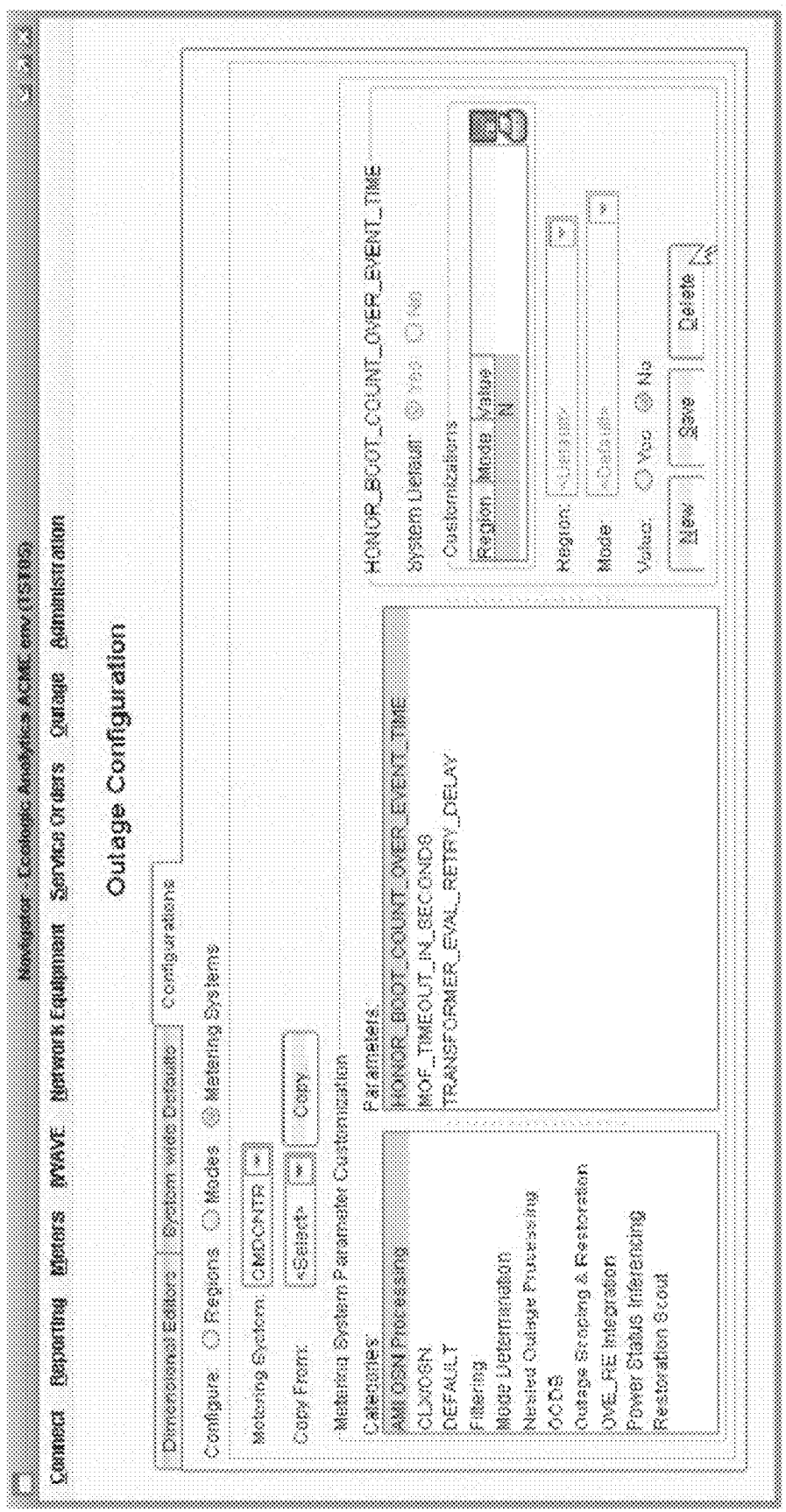
FIG. 32 illustrates an example of a metering system level-only parameter screen.

To delete a setting, select the row for the setting you wish to delete under "Customizations" and click on Delete, as shown in FIG. 32.

Region Level-Only Parameter Example

Figure 33:
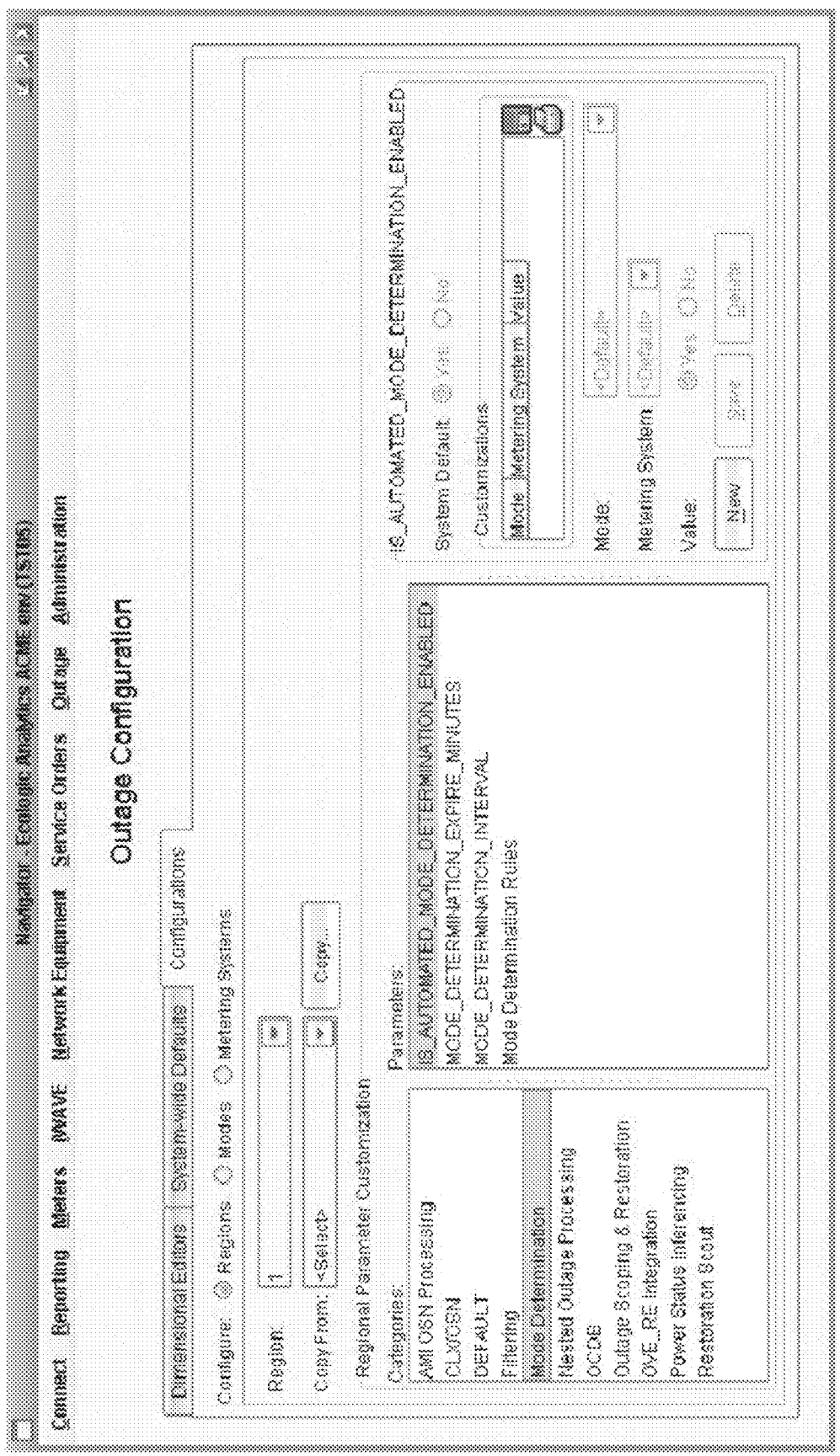
FIG. 33 illustrates an example of a region level-only parameter screen.

The IS_AUTOMATED_MODE_DETERMINATION_ENABLED parameter can be set only on the region level, so editing is enabled when Configure:Regions is selected, but the Mode and Metering System drop-downs are disabled, as shown in FIG. 33.

Figure 34:
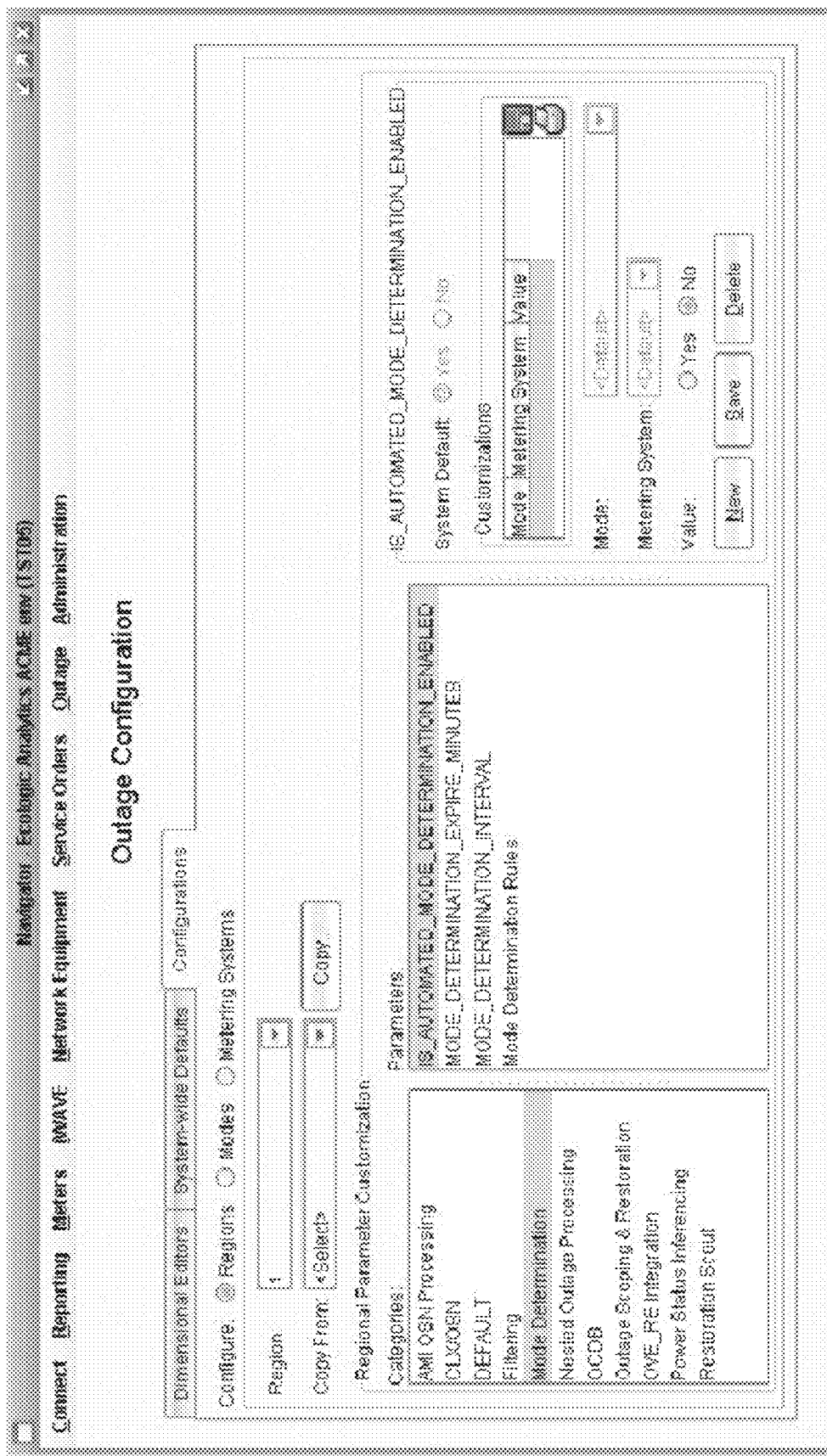
FIG. 34 illustrates an example of a region level-only parameter screen.

When New is selected, Mode and Metering System are still grayed out. See FIG. 34.

Multiple-Level Parameter Example

Figure 35:
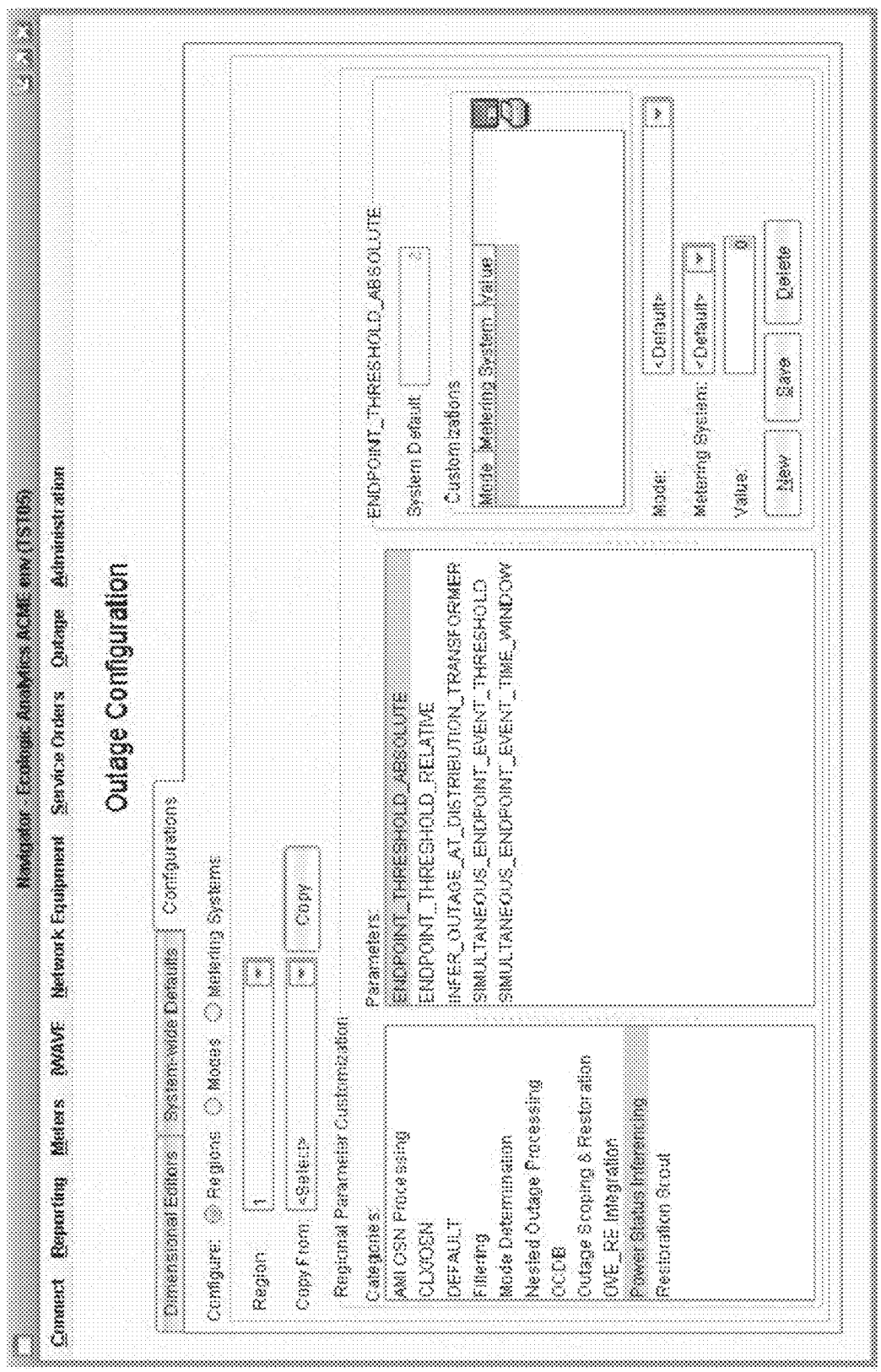
FIG. 35 illustrates an example of a multiple-level parameter screen.

The ENDPOINT_THRESHOLD_ABSOLUTE parameter is an example of a parameter that can be set at the Outage Region, Outage Mode, or Metering System level, or combinations of those levels. When New is selected for this parameter, Mode and Metering System are both enabled, as shown in FIG. 35.

The word "<Default>" is displayed initially for Mode and Metering System. If you wish to set this parameter at the region level only, do not change these "<Default>" settings, type in the desired value, and click on Save.

Figure 36:
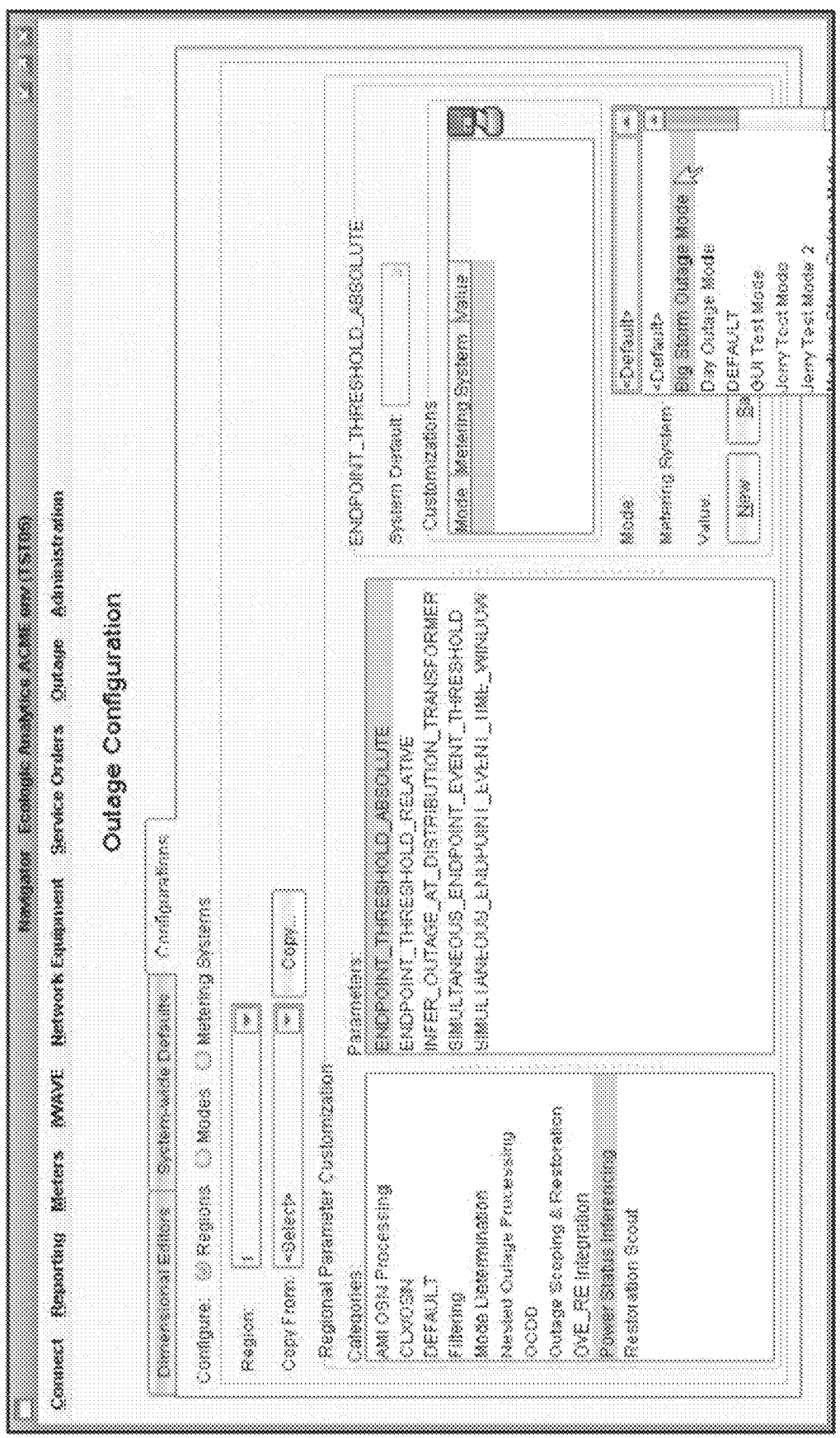
FIG. 36 illustrates an example of a region level-only parameter screen.

If you wish to set this parameter for a region-mode combination, click on the Mode drop-down and select the desired mode, as shown in FIG. 36.

Figure 37:
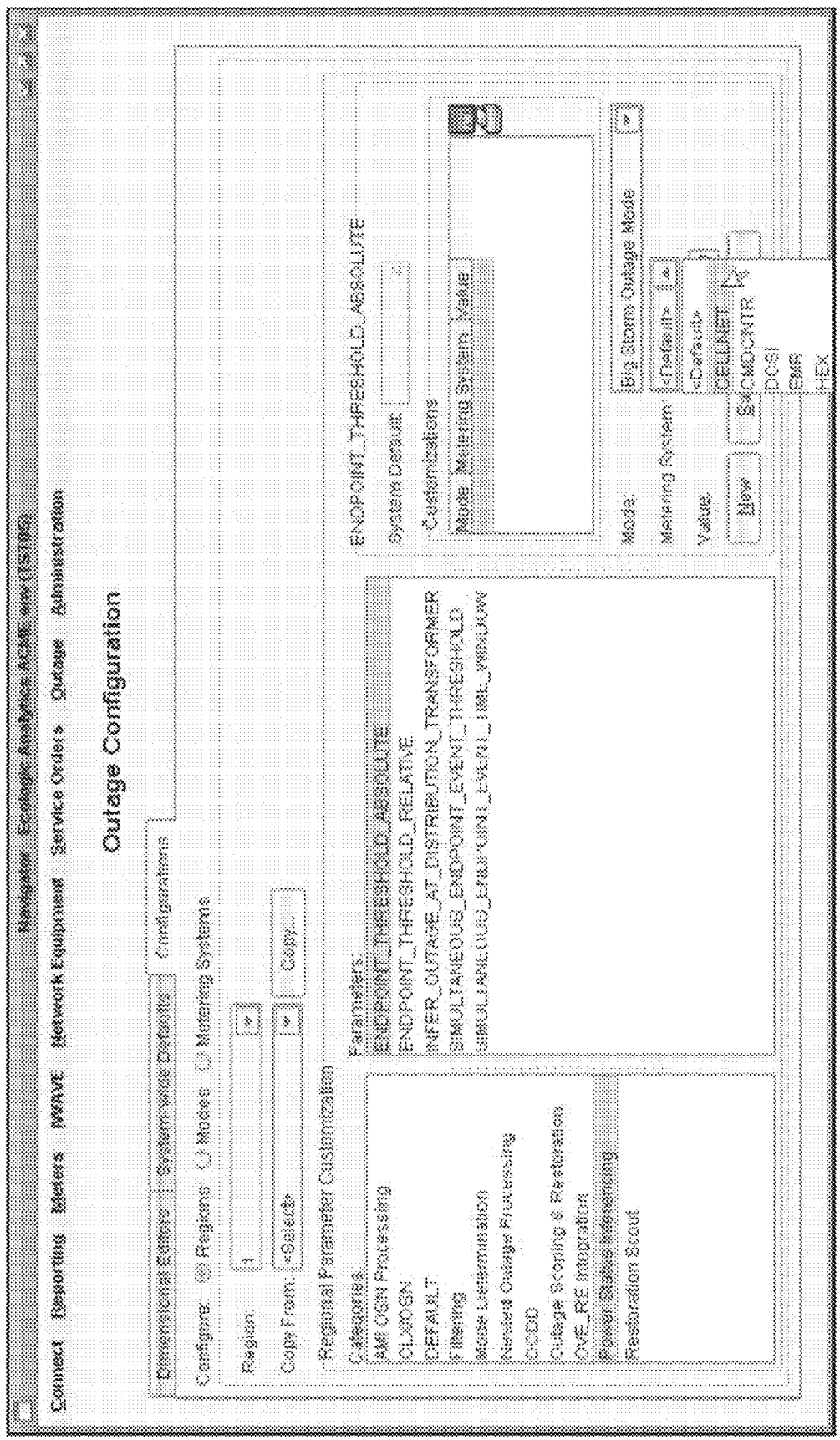
FIG. 37 illustrates an example of a region level-only parameter screen.

If you wish to set this parameter for a region-mode-metering system combination, click on the Metering System drop-down and select the desired metering system, as shown in FIG. 37.

Figure 38:
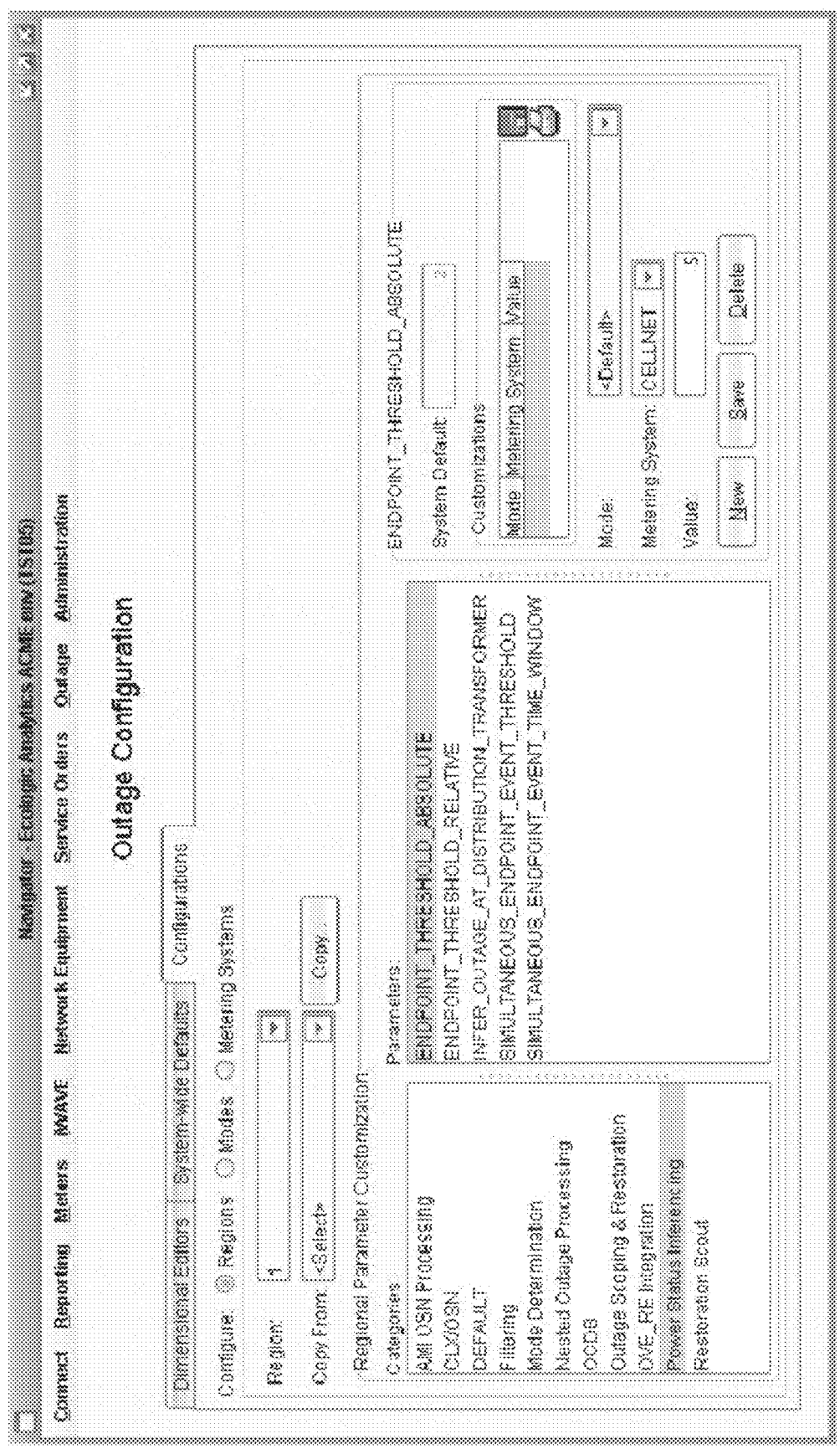
FIG. 38 illustrates an example of a region level-only parameter screen.

You can also set this parameter for a region-metering system combination by leaving Mode unselected, as shown in FIG. 38.

Figure 39:
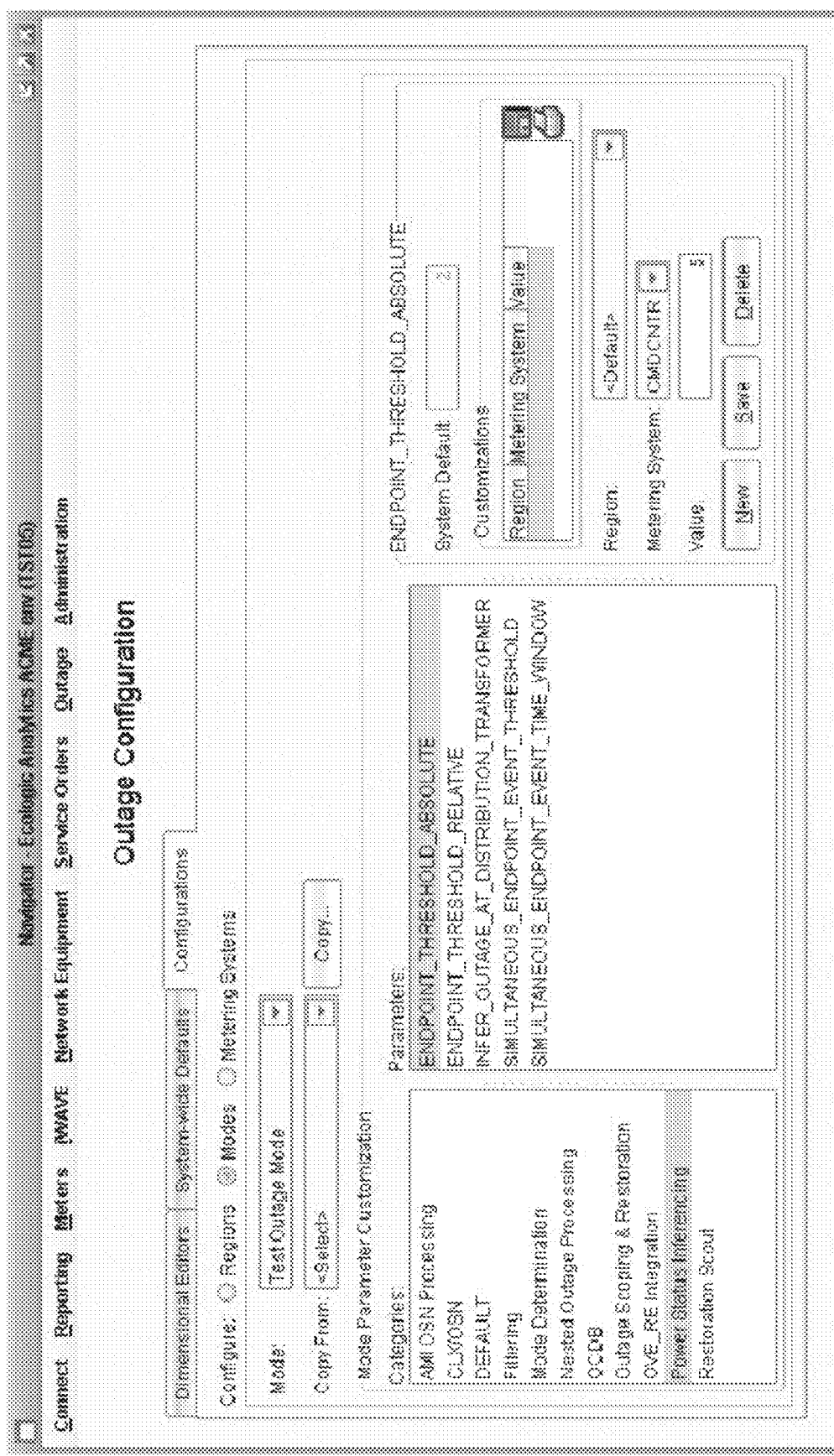
FIG. 39 illustrates an example of a region level-only parameter screen.

You can also set this parameter for a mode-metering system combination by selecting Configure:Modes, selecting the desired mode, and leaving Region unselected, as shown in FIG. 39.

Copying Parameter Sets

Figure 40:
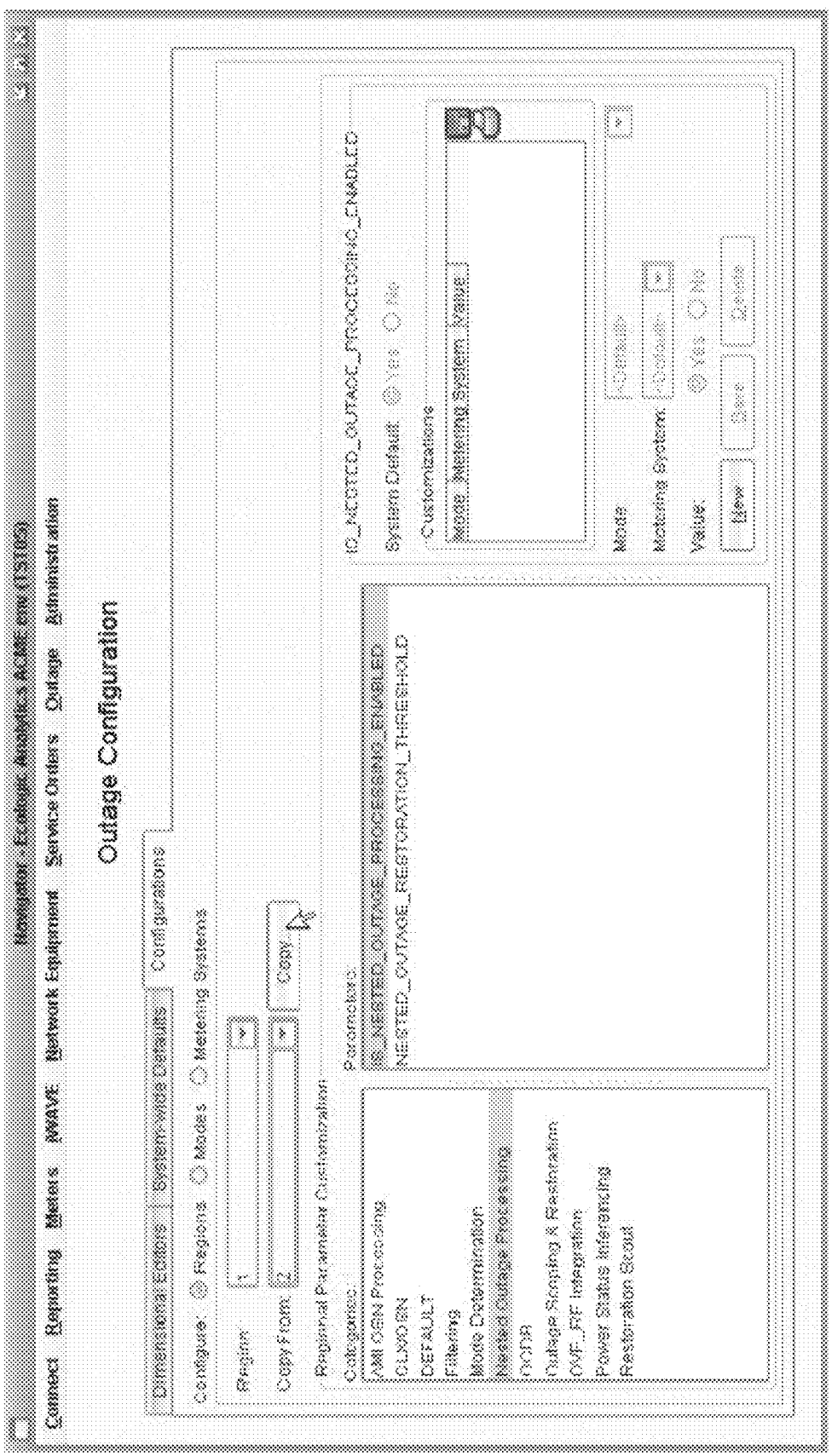
FIG. 40 illustrates an example of a copying parameter sets screen.

Once you have set up parameters for an Outage Region, Outage Mode, or Metering System, you can copy those settings to another region, mode or metering system. To do so, select the region, mode, or metering system for which you want to set parameters, select the region, mode, or metering system from which you want to copy in the Copy From drop-down (it automatically displays regions, modes, or metering systems, as appropriate), and click on Copy, as shown in FIG. 40.

Editing AMI OSN Processing Outage Parameters

Figure 41:
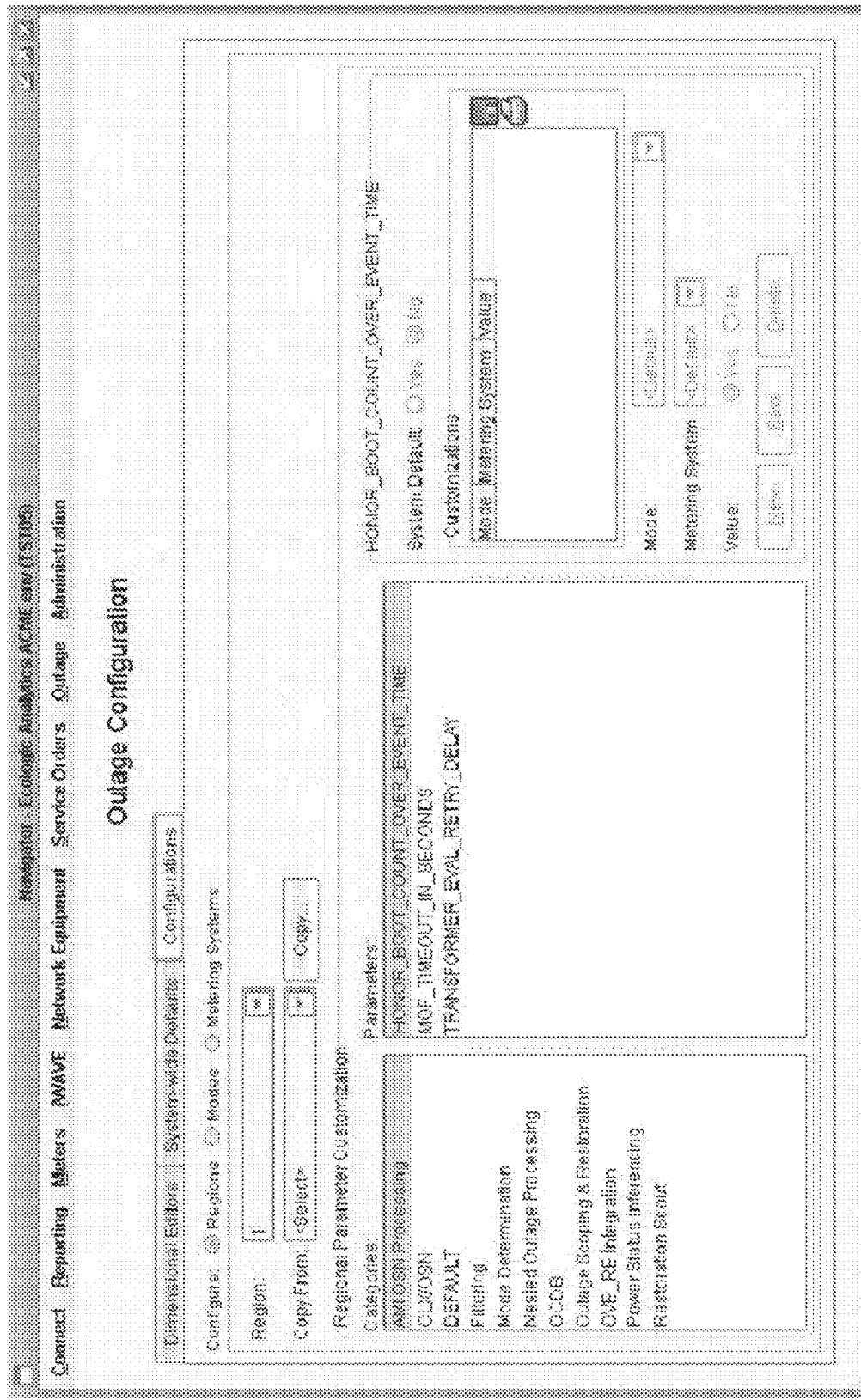
FIG. 41 illustrates an example of a AMI OSN processing screen.

When the AMI OSN Processing category is selected, the settings for several technical OMM parameters are as shown in FIG. 41.

Editing CLX/OSN Outage Parameters

Figure 42:
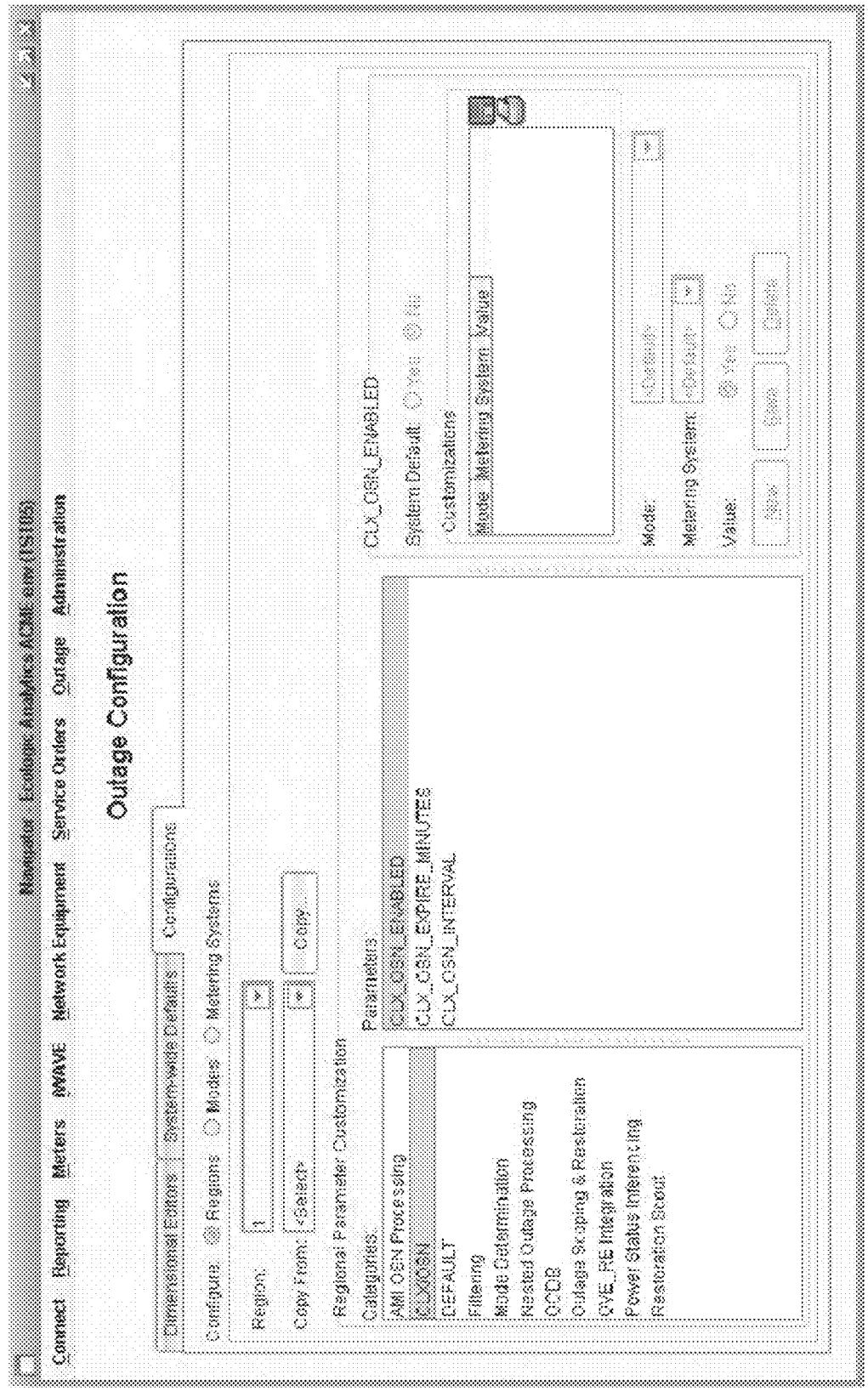
FIG. 42 illustrates an example of a CLX/OSN outage parameter screen.

When the CLX/OSN category is selected, the settings for parameters used by the Outage Status Notification Adapter from CLX DDD are displayed as shown in FIG. 42.

Editing DEFAULT Outage Parameters

Figure 43:
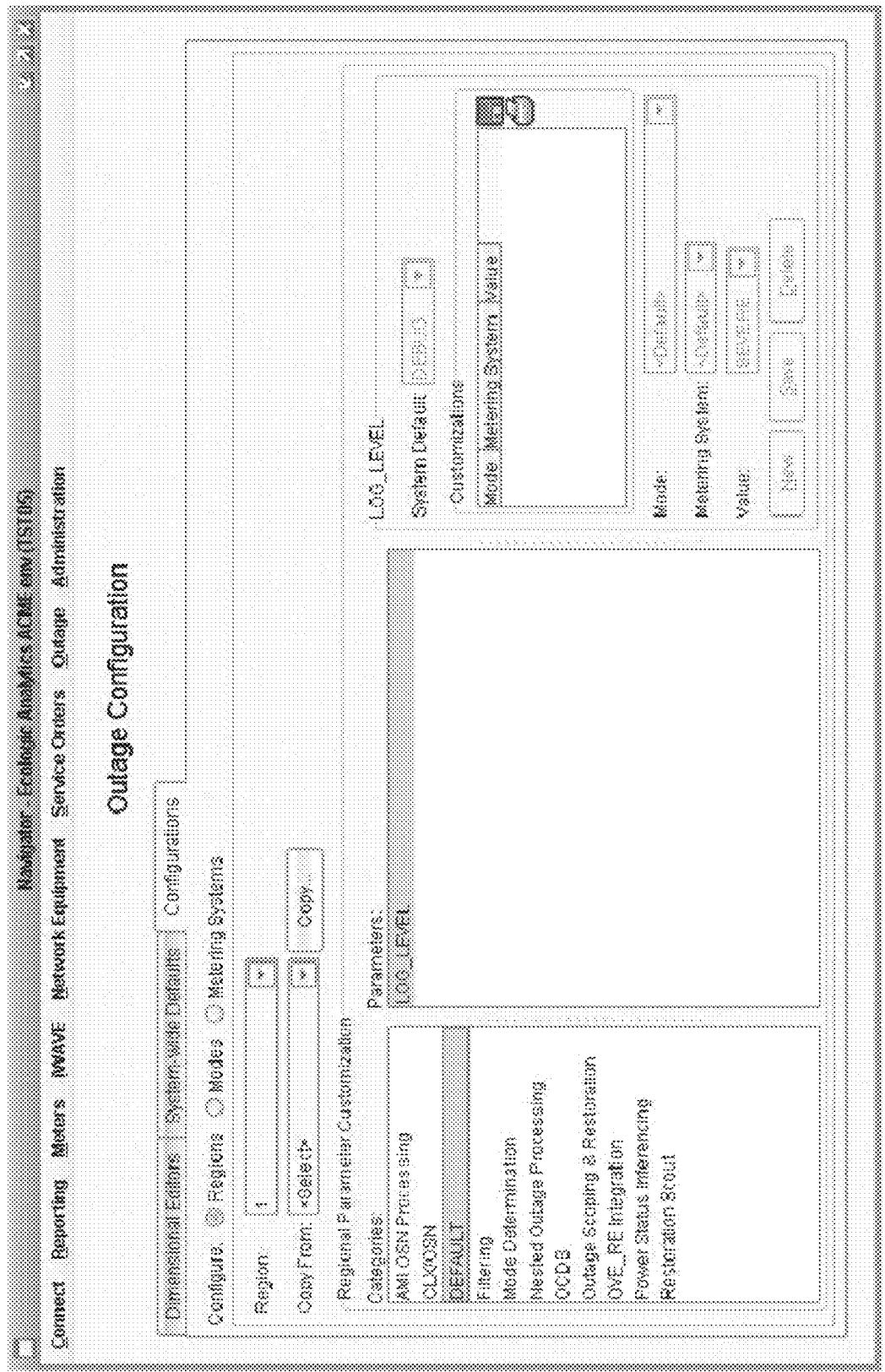
FIG. 43 illustrates an example of a default outage parameter screen.

When the DEFAULT category is selected, the setting for the LOG_LEVEL parameter is displayed as shown in FIG. 43.

Editing Filtering Outage Parameters

Figure 44:
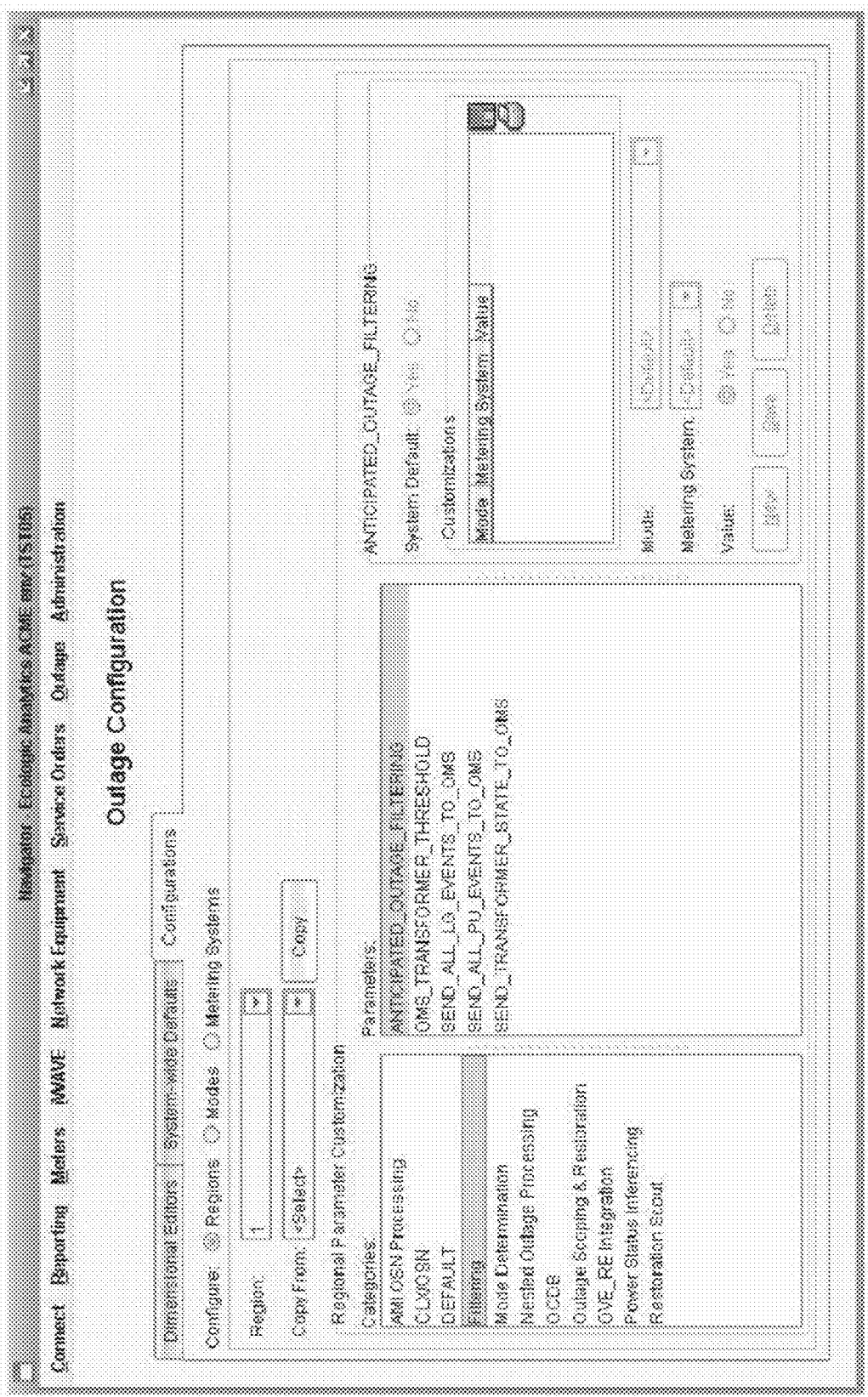

When the Filtering category is selected, the settings for parameters that control how events are filtered are as shown in FIG. 44.

Editing Mode Determination Outage Parameters

Figure 45:
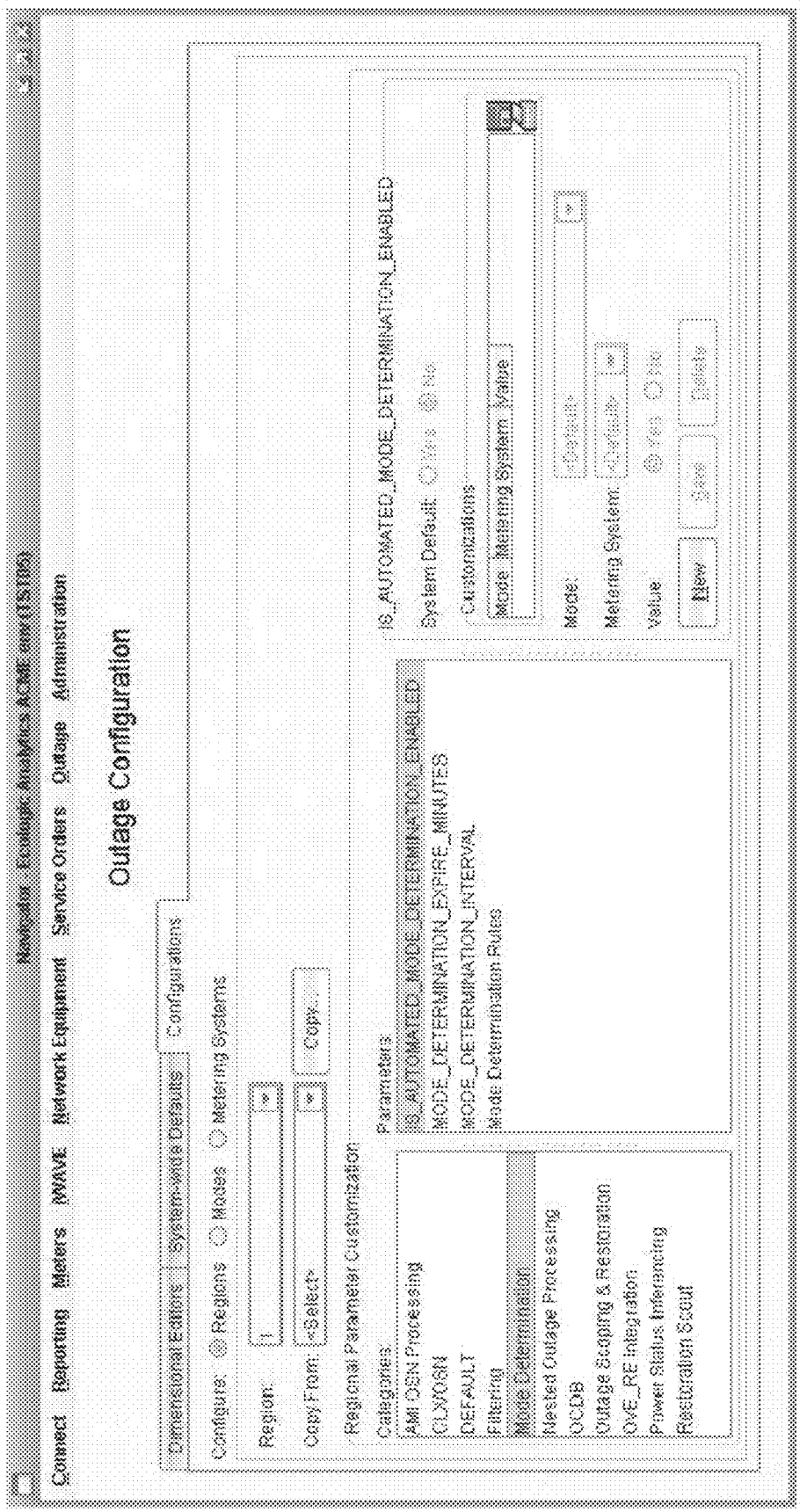
FIG. 45 illustrates an example of a mode determination outage screen.

When the Mode Determination category is selected, the settings for parameters used by the Automated Outage Mode Determination (AOMD) process are displayed, including whether automated mode determination is enabled or not. See FIG. 45. The first three Mode Determination parameters are grayed out on this screen because they can only be set as system-level values on the System-wide Defaults tab.

The Mode Determination Rules option (described below) lets you specify whether an outage mode is storm-based or time-based, and specify either a storm threshold or a start time, as described in the next topic.

Specifying Mode Determination Rules

Figure 46:
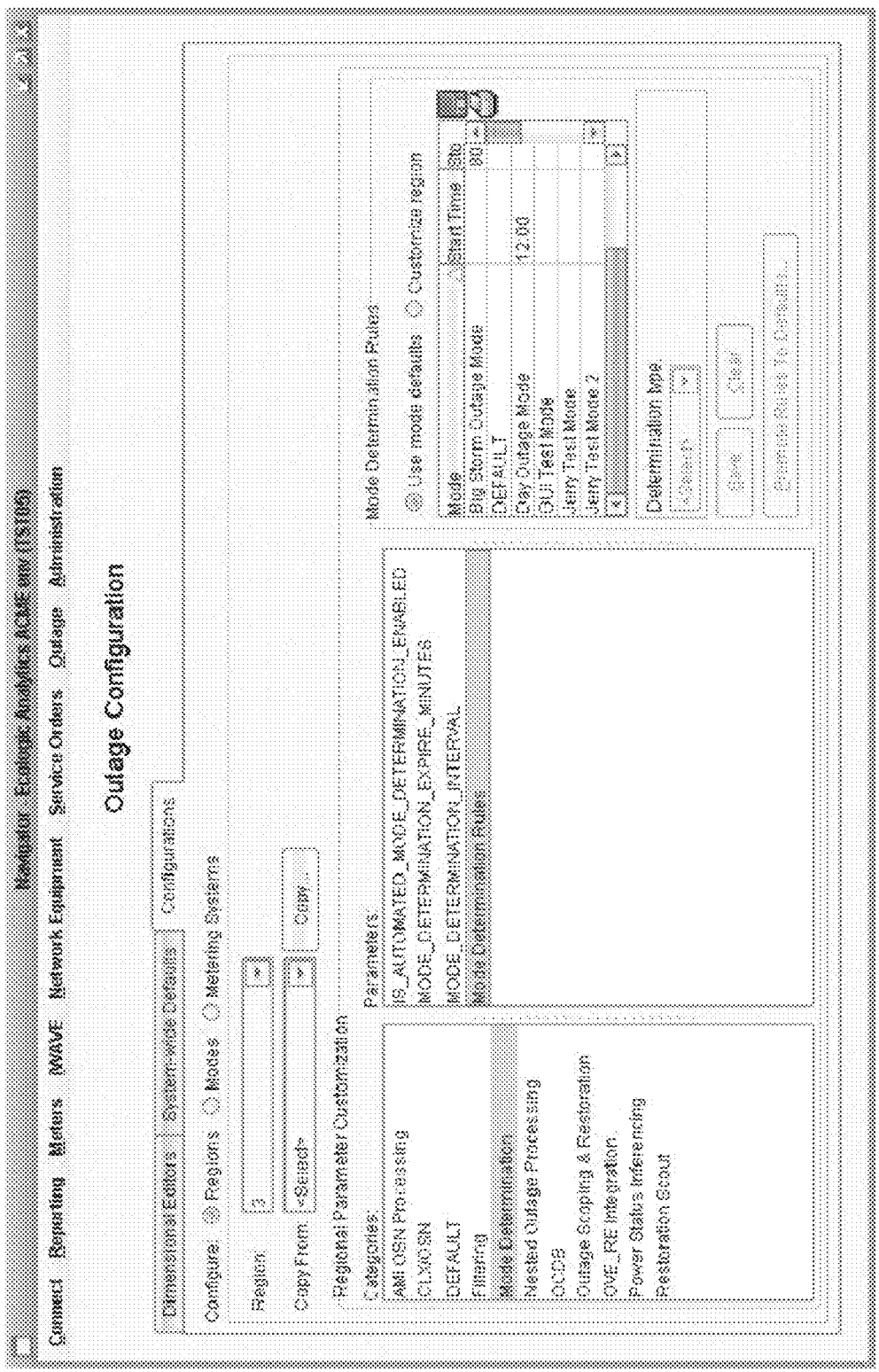
FIG. 46 illustrates an example of a mode determination rules screen.

When you select Mode Determination Rules for the Mode Determination category (this option is displayed only if Configure: Regions is selected at the top of the screen), a special screen is displayed for entering mode determination rules. See FIG. 46.

For each Outage Region, you can specify either:

"Use mode defaults"—This is the default setting. If you use this setting, you must set up the default modes, as described below. If you use this setting but fail to set up default modes (again, as described below), OMM will be unable to determine a current outage mode for the specified region.

"Customize region"—You must specify which Outage Modes are used for the selected region as described below. This includes specifying whether a mode is storm-based or time-based, as well as the setting to use for the storm threshold (STORM_MODE_THRESHOLD) or start time (MODE_WINDOW_START_TIME).

Setting System-Wide Mode Determination Rules

If you want to use system-wide default values for mode determination, the easiest way to do so is to select the SYSTEM_WIDE_DEFAULT region. You can, however, use another region, to perform this process.

Then select "Customize region".

Then perform the following steps for each of the modes for which you want to set system-wide defaults. For example, if you are going to use three storm-based modes (Small Storm Mode, Medium Storm Outage Mode, and Large Storm Outage Mode) and two time-based outage modes (Day Outage Mode and Night Outage), then you need to repeat these steps for each of those outage modes.

Figures 47, 48:
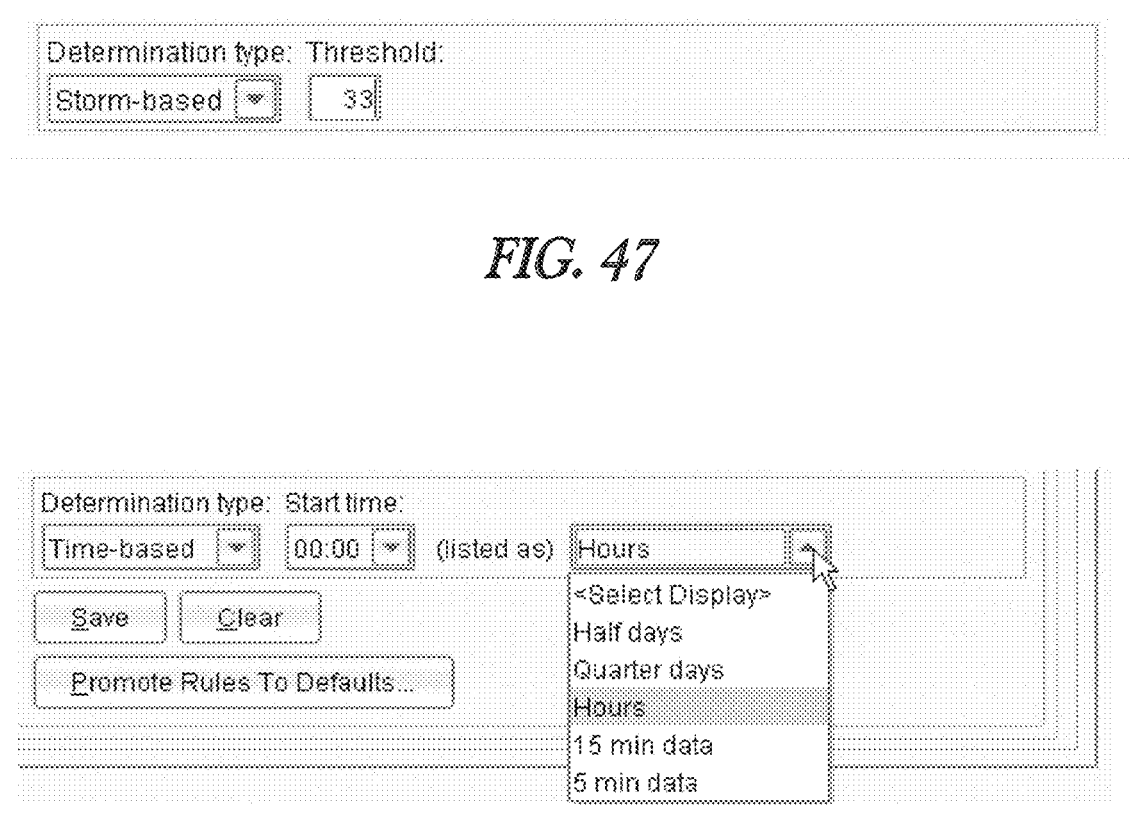
Figure 49:
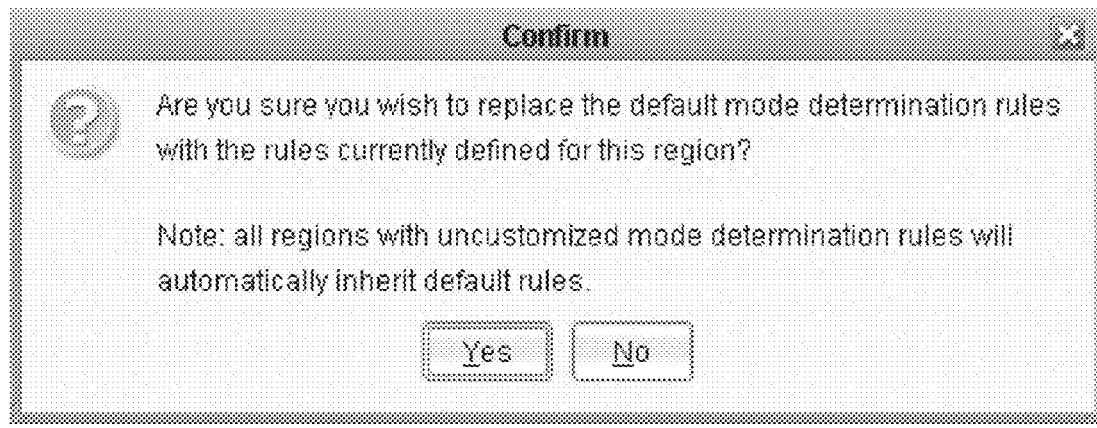
FIG. 49 illustrates an example of a system-wide mode determination rules screen.

- Highlight an Outage Mode you wish to use for the specified region.
- Select Determination Type (Storm-based or Time-based) from the drop-down box.
  - If Storm-based is selected, type in the desired percentage Threshold. (This sets the STORM_MODE_THRESHOLD parameter.) See FIG. 47.
  - If Time-based is selected, type in the desired Start Time. (This sets the MODE_WINDOW_START_TIME parameter.) (You can select start times by half-days, quarter-days, hours, 15 minutes, or 5 minutes.) See FIG. 48.
  - (The end time will automatically end right before the starting time of the next time-based outage mode. For example, if you specify a Day Outage Mode with a start time of 06:00 and a Night Outage Mode with a start time of 18:00, the Day Outage Mode will cover 06:00:00 through 17:59:59 and the Night Outage Mode will cover 18:00:00 through 05:59:59.)
- Click on Promote Rules To Defaults. This will display the Confirm window shown in FIG. 49.
- You should make sure that the settings you just entered for the Outage Mode you selected are ones you want to use for all regions where "Use mode defaults" is selected. Once you promote these settings, they cannot be deleted, though they can be replaced by performing the steps described above to create and promote new settings.
- Click on Yes. The settings you just entered will be displayed on the right side of the screen.

Figure 50:
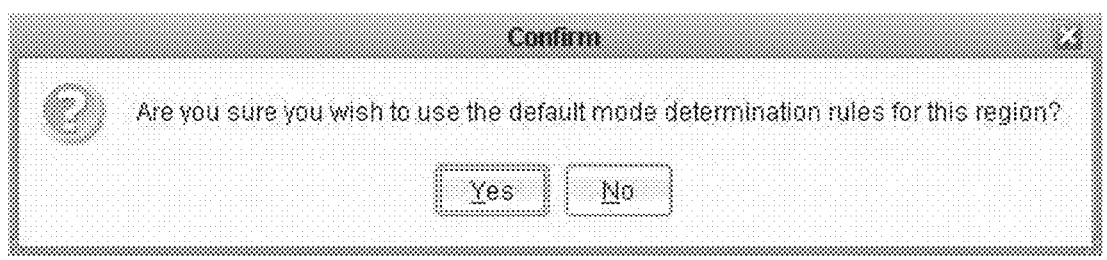
FIG. 50 illustrates an example of a system-wide mode determination rules screen.

If you wish to use mode defaults only, then select "Use mode defaults" after you have promoted all of your mode settings. When you do so, the following Confirm window will display. See FIG. 50.

Click Yes to set the SYSTEM_WIDE_DEFAULT region (or any other region you used for this default promotion effort) to use the default settings you just promoted.

Setting Region-Level Mode Determination Rules

If you want to specify unique Outage Modes for each of your Outage Regions, select a region and then select "Customize region".

Then perform the following steps for each of the outage modes you want to use for the selected region. For example, if you are going to use three storm-based modes (Small Storm Mode, Medium Storm Outage Mode, and Large Storm Outage Mode) and two time-based outage modes (Day Outage Mode and Night Outage), then you need to repeat these steps for each of those outage modes.

- Highlight an Outage Mode you wish to use for the specified region.
- Select Determination Type (Storm-based or Time-based) from the drop-down box.

Figure 51:
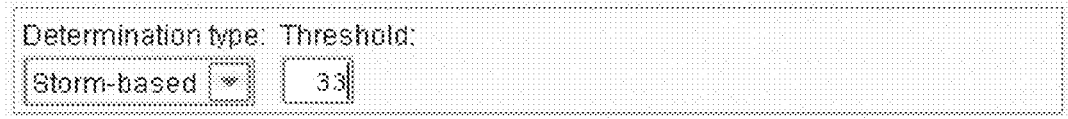
FIG. 51 illustrates an example of a region-level mode determination rules screen.

If Storm-based is selected, type in the desired percentage Threshold. (This sets the STORM_MODE_THRESHOLD parameter.) See FIG. 51.

Figure 52:
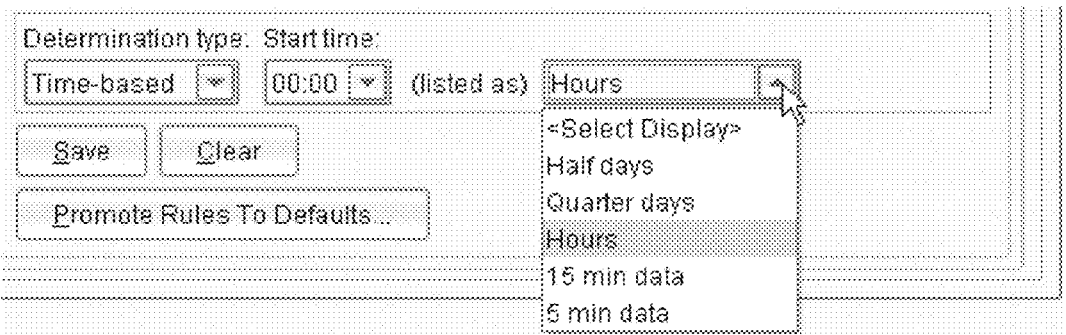
FIG. 52 illustrates an example of a region-level mode determination rules screen.

If Time-based is selected, type in the desired Start Time. (This sets the MODE_WINDOW_START_TIME parameter.) (You can select start times by half-days, quarter-days, hours, 15 minutes, or 5 minutes.) See FIG. 52.

(The end time will automatically end right before the starting time of the next time-based outage mode. For example, if you specify a Day Outage Mode with a start time of 06:00 and a Night Outage Mode with a start time of 18:00, the Day Outage Mode will cover 06:00:00 through 17:59:59 and the Night Outage Mode will cover 18:00:00 through 05:59:59.)

Click on Save. The settings you just entered will be displayed on the right side of the screen.

Editing Nested Outage Processing Outage Parameters

Figure 53:
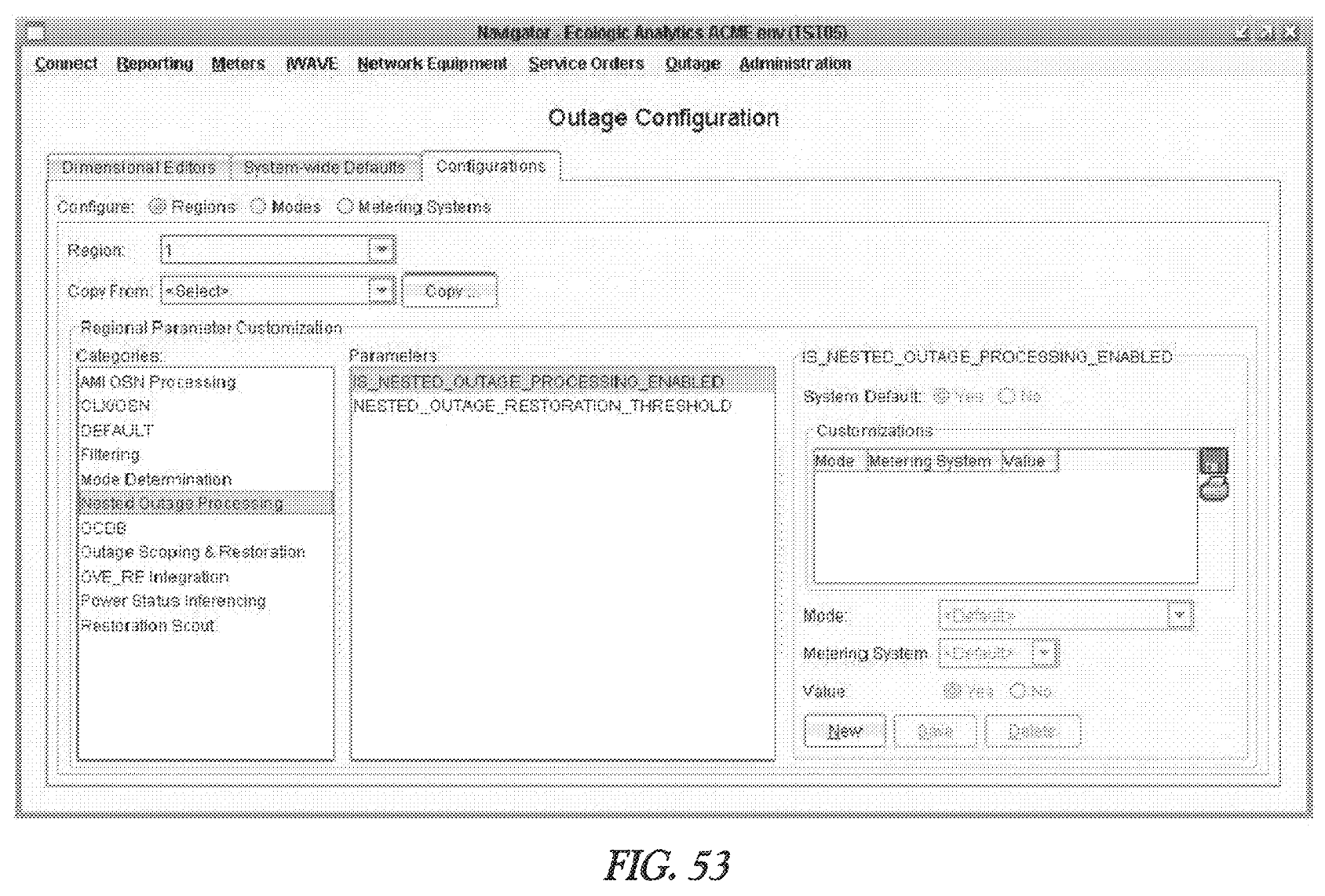

When the Nested Outage Processing category is selected, the settings for parameters used by the Nested Outage Detection (NOD) Process are displayed as shown in FIG. 53.

Editing OCDB Outage Parameters

Figure 54:
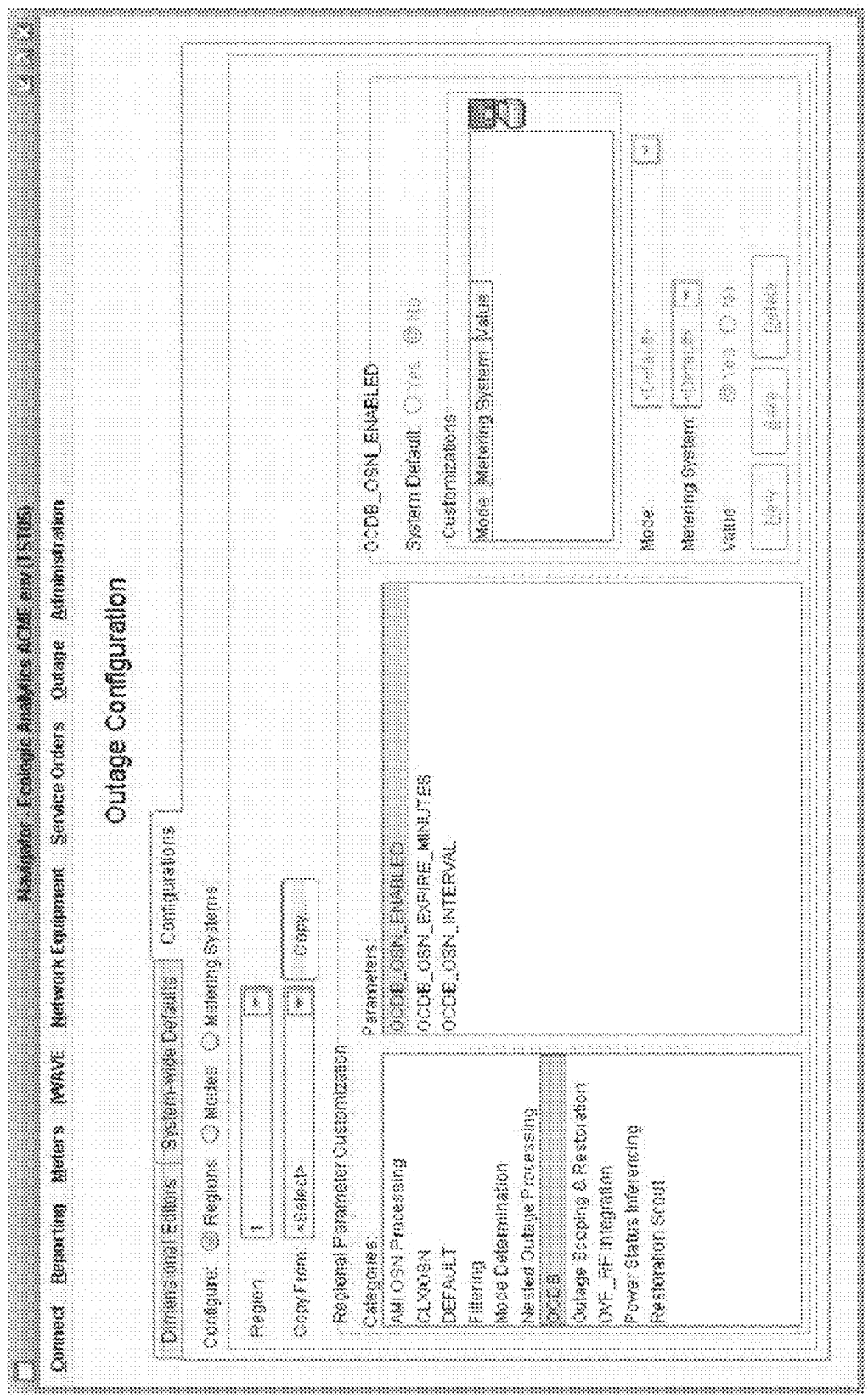
FIG. 54 illustrates an example of an OCBD outage parameter screen.

When the OCDB category is selected, the settings for parameters used by the Outage Status Notification Adapter from the Cellnet OCDB are displayed as shown in FIG. 54.

Editing Outage Scoping & Restoration Outage Parameters

Figure 55:
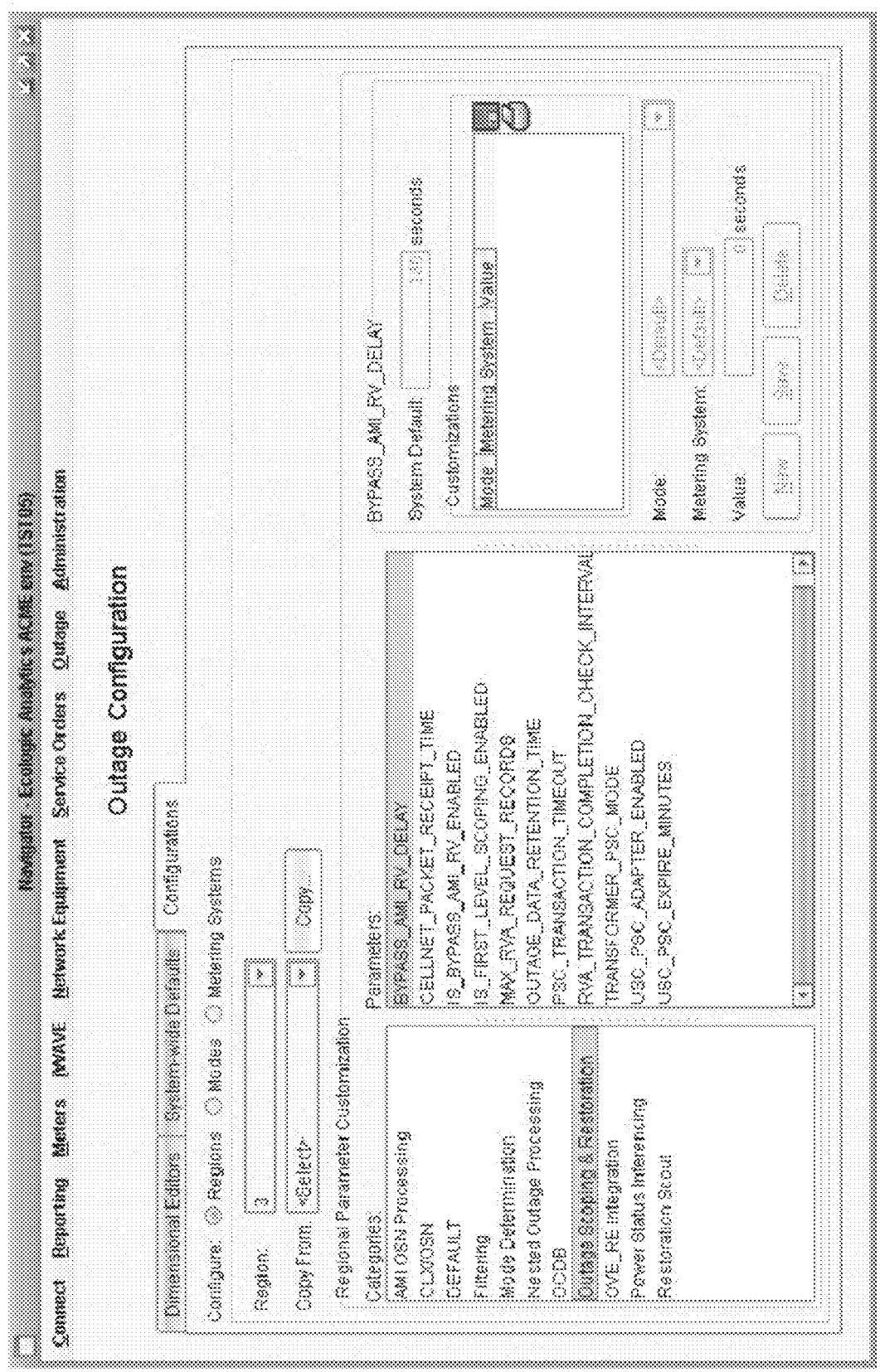
FIG. 55 illustrates an example of an outage scoping and restoration outage parameter screen.

When the Outage Scoping and Restoration category is selected, the settings for various scoping and restoration parameters used by the External Scoping Requests Processor, First Level Scoping (FLS) Processor, the Anticipated Outage Create/Delete Processor (AOCDP), the Cellnet USC Power Status Check (PSC) Adapter/Restoration Verification Application (RVA) Adapter, the Restoration Verification Processor (RVP), and the Sustained Endpoint Outage Processor (SEOP) are displayed as shown in FIG. 55.

Editing OVE_RE Integration Outage Parameters

Figure 56:
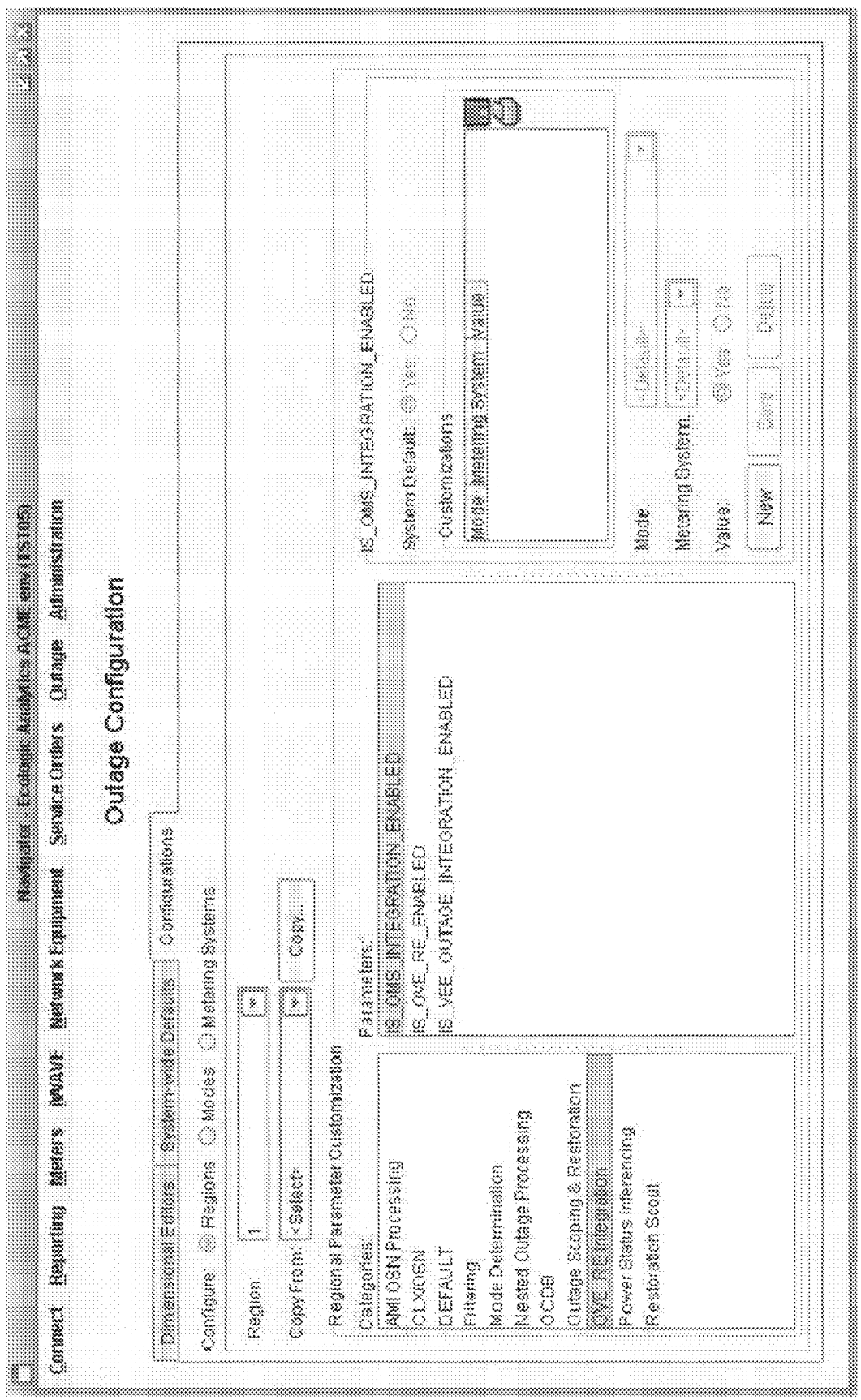
FIG. 56 illustrates an example of an OVE_RE integration outage parameter screen.

When the OVE_RE Integration category is selected, the settings for general enablement parameters are displayed. IS_OVE_RE_ENABLED is used by all OMM processes. IS_OMS_INTEGRATION_ENABLED is used by the Automated Outage Mode Determination (AOMD) Process, the Nested Outage Determination (NOD) Process, the OMS OSN Sender Process, the OMS OSN Receipt Process, the Restoration Notification Processor from Metering Systems, the Restoration Verification Processor (RVP), the Sustained Endpoint Outage Processor (SEOP), and the Populate Outage History Process. IS_VEE_OUTAGE_INTEGRATION_ENABLED is used by the Populate Outage History Process. See FIG. 56.

Editing Power Status Inferencing Outage Parameters

Figure 57:
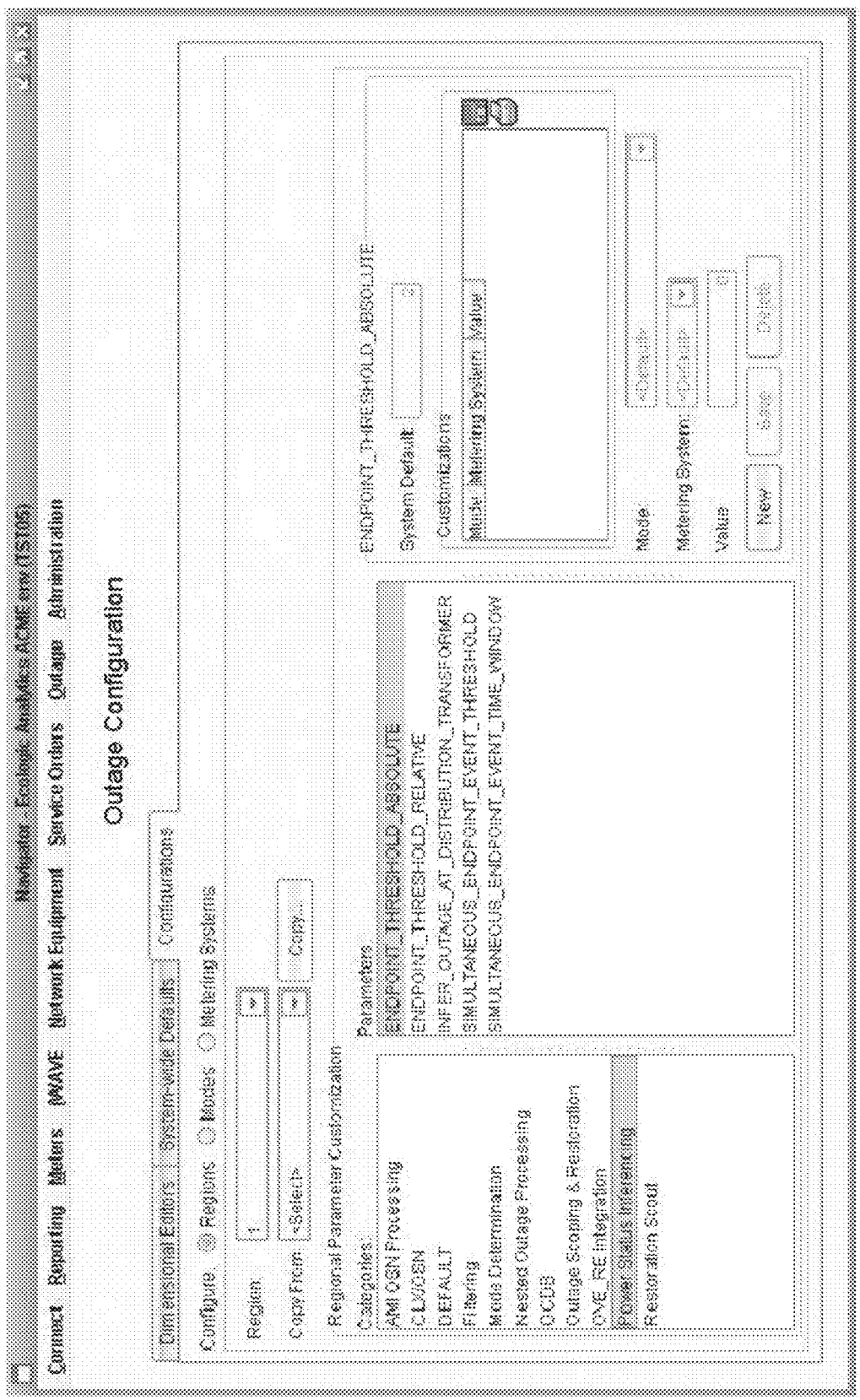
FIG. 57 illustrates an example of a power status inferencing outage parameter screen.

When the Power Status Inferencing category is selected, the settings for parameters used by the Restoration Notification Processor from Metering Systems and the Sustained Endpoint Outage Processor (SEOP) are displayed as shown in FIG. 57.

Editing Restoration Scout Outage Parameters

Figure 58:
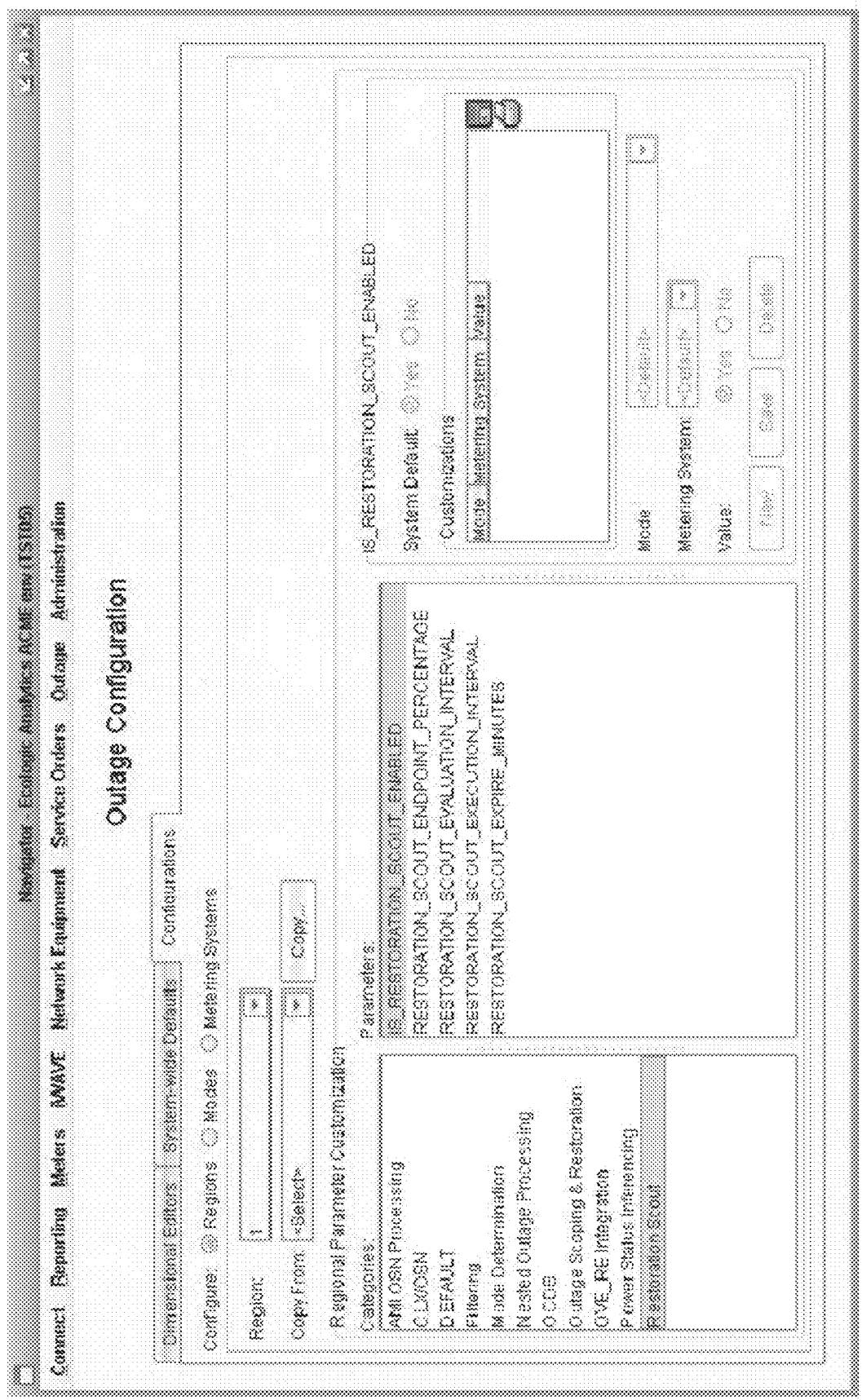
FIG. 58 illustrates an example of a restoration scout outage parameter screen.

When the Restoration Scout category is selected, the settings for parameters used by the Restoration Scout are displayed as shown in FIG. 58.

CONCLUSION

The embodiments described above are intended only to illustrate and teach one or more ways of practicing or implementing the present invention, not to restrict its breadth or scope. The actual scope of the invention, which embraces all ways of practicing or implementing the teachings of the invention, is defined only by the following claims and their equivalents.

What is claimed is:

1. A system for handling data from electrical usage meters, the apparatus comprising a computer processor configured for:
   receiving and storing messages for electrical usage meters, the messages including energization status messages;
   determining whether one or more of the energization status messages are associated with a known outage condition within an outage management system;
   transmitting outage condition data based on one or more of the energization status messages to the outage management system, wherein the transmitted outage condition data excludes data based on the energization status messages determined to be associated with the known outage condition; and
   estimating usage data based on one or more of the stored messages from the electrical usage meters, wherein the computer processor configured for estimating is responsive to one or more of the energization status messages indicative of an outage condition to avoid overestimating electrical usage for at least one of the meters.

2. The system of claim 1, wherein the computer processor is configured for determining whether one or more of the energization status messages for the electrical usage meters is indicative of a distribution transformer outage; and wherein the computer processor configured for transmitting outage condition data based on one or more of the energization status messages transmits outage condition data identifying a distribution transformer associated with the energization status.

3. The system of claim 1, wherein the computer processor is configured for determining whether one or more of the energization status messages for the electrical usage meters is indicative of a distribution transformer outage; and wherein the computer processor configured for transmitting outage condition data based on one or more of the energization status messages transmits energization status messages for a number of the usage meters that is less than the total number of the usage meters associated with the distribution transformer.

4. The system of claim 3, wherein the number of the usage meters that is less than the total number of the usage meters is equal to a minimum number of usage meters required by the outage management system to infer deenergized status of the distribution transformer.

5. The system of claim 1, wherein the computer processor configured for receiving and storing messages for electrical usage meters receives and stores powered-up messages indicative of powered up electrical usage meters, wherein the computer processor is configured for receiving restoration verification requests from the outage management system, and the computer processor is configured for responding to the received restoration verification based on one or more of the stored powered-up messages, wherein the stored powered-up messages are stored prior to receipt of the restoration verification request.

6. The system of claim 1, wherein the transmitted outage condition data excludes data based on the energization status messages determined to be associated with one or more anticipated outage conditions.

7. The system of claim 6, wherein the one or more anticipated outage conditions includes a condition based on prior utility scheduled electrical outage.

8. The system of claim 1, wherein the computer processor is configured for inferring deenergized status of one or more of the meters based on data indicative of a power up or power down status of a network communications device associated with the one of the meters.

9. The system of claim 1, further comprising a graphical user interface for interacting with energization status information regarding the usage meters, wherein the interface displays a first energization status derived from stored energization status messages for a first one of the meters and second energization status reported by the outage management system.

10. The system of claim 9, wherein the first energization status is associated with a control feature which can be selected to invoke display of an energization event history associated with the first one of the meters.

11. A method of handling data from electrical usage meters, the method comprising:
receiving and storing messages for electrical usage meters, the messages including energization status messages;
determining whether one or more of the energization status messages are associated with a known outage condition within an outage management system; and
transmitting outage condition data based on one or more of the energization status messages to the outage management system, wherein the transmitted outage condition data excludes data based on the energization status messages determined to be associated with the known outage condition; and
estimating usage data based on one or more of the stored messages from the electrical usage meters, wherein the estimating is responsive to one or more of the energization status messages indicative of an outage condition to avoid overestimating electrical usage for at least one of the meters.

12. The method of claim 11, comprising:
determining whether one or more of the energization status messages for the electrical usage meters is indicative of a distribution transformer outage; wherein the transmitting outage condition data based on one or more of the energization status messages comprises transmitting outage condition data identifying a distribution transformer associated with the energization status.

13. The method of claim 11, comprising:
determining whether one or more of the energization status messages for the electrical usage meters is indicative of a distribution transformer outage; wherein the transmitting outage condition data based on one or more of the energization status messages comprises transmitting energization status messages for a number of the usage meters that is less than the total number of the usage meters associated with the distribution transformer.

14. The method of claim 13, wherein the number of the usage meters that is less than the total number of the usage meters is equal to a minimum number of usage meters required by the outage management system to infer deenergized status of the distribution transformer.

15. The method of claim 11, comprising:
receiving and storing messages for electrical usage meters;
receiving and storing powered-up messages indicative of powered up electrical usage meters;
receiving restoration verification requests from the outage management system; and
responding to the received restoration verification based on one or more of the stored powered-up messages, wherein the stored powered-up messages are stored prior to receipt of the restoration verification request.

16. The method of claim 11, wherein the transmitted outage condition data exclude data based on the energization status messages determined to be associated with one or more anticipated outage conditions.

17. The method of claim 16, wherein the one or more anticipated outage conditions includes a condition based on prior utility scheduled electrical outage.

18. The method of claim 11, comprising:
inferring deenergized status of one or more of the meters based on data indicative of a power up or power down status of a network communications device associated with the one of the meters.

19. The method of claim 11, comprising:
interacting with energization status information regarding the usage meters; and
displaying a first energization status derived from stored energization status messages for a first one of the meters and second energization status reported by the outage management system.

20. The method of claim 19, wherein the first energization status is associated with a control feature which can be selected to invoke display of an energization event history associated with the first one of the meters.

21. A non-transitory computer readable storage device comprising instructions that when executed by a processor execute a process comprising:
receiving and storing messages for electrical usage meters, the messages including energization status messages;
determining whether one or more of the energization status messages are associated with a known outage condition within an outage management system;
transmitting outage condition data based on one or more of the energization status messages to the outage management system, wherein the transmitted outage condition data exclude data based on the energization status messages determined to be associated with the known outage condition; and
estimating usage data based on one or more of the stored messages from the electrical usage meters, wherein the estimating is responsive to one or more of the energization status messages indicative of an outage condition to avoid overestimating electrical usage for at least one of the meters.

22. The non-transitory computer readable storage device of claim 21, comprising instructions for:
determining whether one or more of the energization status messages for the electrical usage meters is indicative of a distribution transformer outage; wherein the instructions for transmitting outage condition data based on one or more of the energization status messages comprises instructions for transmitting outage condition data identifying a distribution transformer associated with the energization status.

23. The non-transitory computer readable storage device of claim 21, comprising instructions for:
determining whether one or more of the energization status messages for the electrical usage meters is indicative of a distribution transformer outage; wherein the instructions for transmitting outage condition data based on one or more of the energization status messages comprises instructions for transmitting energization status messages for a number of the usage meters that is less than the total number of the usage meters associated with the distribution transformer.

24. The non-transitory computer readable storage device of claim 23, wherein the number of the usage meters that is less than the total number of the usage meters is equal to a minimum number of usage meters required by the outage management system to infer deenergized status of the distribution transformer.

25. The non-transitory computer readable storage device of claim 21, comprising instructions for:
receiving and storing messages for electrical usage meters;
receiving and storing powered-up messages indicative of powered up electrical usage meters;
receiving restoration verification requests from the outage management system; and
responding to the received restoration verification based on one or more of the stored powered-up messages, wherein the stored powered-up messages are stored prior to receipt of the restoration verification request.

26. The non-transitory computer readable storage device of claim 21, wherein the transmitted outage condition data exclude data based on the energization status messages determined to be associated with one or more anticipated outage conditions.

27. The non-transitory computer readable storage device of claim 26, wherein the one or more anticipated outage conditions includes a condition based on prior utility scheduled electrical outage.

28. The non-transitory computer readable storage device of claim 21, comprising instructions for:
inferring deenergized status of one or more of the meters based on data indicative of a power up or power down status of a network communications device associated with the one of the meters.

29. The non-transitory computer readable storage device of claim 21, comprising instructions for:
interacting with energization status information regarding the usage meters; and
displaying a first energization status derived from stored energization status messages for a first one of the meters and second energization status reported by the outage management system.

30. The non-transitory computer readable storage device of claim 29, wherein the first energization status is associated with a control feature which can be selected to invoke display of an energization event history associated with the first one of the meters.

* * * * *